US010573768B2

(12) United States Patent
Ghidiu et al.

(10) Patent No.: US 10,573,768 B2
(45) Date of Patent: Feb. 25, 2020

(54) PHYSICAL FORMS OF MXENE MATERIALS EXHIBITING NOVEL ELECTRICAL AND OPTICAL CHARACTERISTICS

(71) Applicant: Drexel University, Philadelphia, PA (US)

(72) Inventors: Michael J. Ghidiu, Bridgeton, NJ (US); Michel W. Barsoum, Moorestown, NJ (US); Yury Gogotsi, Warminster, PA (US); Aaron Thomas Fafarman, Philadelphia, PA (US); Andrew DeVries Dillon, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 316 days.

(21) Appl. No.: 15/513,740

(22) PCT Filed: Sep. 23, 2015

(86) PCT No.: PCT/US2015/051588
§ 371 (c)(1),
(2) Date: Mar. 23, 2017

(87) PCT Pub. No.: WO2016/049109
PCT Pub. Date: Mar. 31, 2016

(65) Prior Publication Data
US 2017/0294546 A1 Oct. 12, 2017

Related U.S. Application Data

(60) Provisional application No. 62/055,155, filed on Sep. 25, 2014, provisional application No. 62/214,380, filed on Sep. 4, 2015.

(51) Int. Cl.
*C04B 35/58* (2006.01)
*H01L 31/0224* (2006.01)
(Continued)

(52) U.S. Cl.
CPC ...... *H01L 31/022466* (2013.01); *C04B 35/58* (2013.01); *H01L 33/42* (2013.01); *H01L 51/5203* (2013.01)

(58) Field of Classification Search
CPC ......... H01L 31/022466; H01L 51/5203; H01L 33/42; C04B 35/58007; C04B 35/5618;
(Continued)

(56) References Cited

U.S. PATENT DOCUMENTS 4,801,368 A 1/1989 Yamashita et al.
6,180,049 B1 1/2001 Jang et al.
(Continued)

FOREIGN PATENT DOCUMENTS

EP 0 948 067 A1 10/1999
EP 1 381 099 A1 1/2004
(Continued)

OTHER PUBLICATIONS

Barsoum et al, "Room-Temperature Deintercalation and Self-Extrusion of Ga from Cr2GaN", Science, May 7, 1999, 284(5416), 937-939.
(Continued)

*Primary Examiner* — Noah S Wiese
(74) *Attorney, Agent, or Firm* — BakerHostetler

(57) ABSTRACT

The present invention(s) is directed to novel conductive $M_{n+1}X_n(T_s)$ compositions exhibiting high volumetric capacitances, and methods of making the same. The present invention(s) is also directed to novel conductive $M_{n+1}X_n(T_s)$ compositions, methods of preparing transparent conductors using these materials, and products derived from these methods.

19 Claims, 25 Drawing Sheets

(51) Int. Cl.
  *H01L 33/42* (2010.01)
  *H01L 51/52* (2006.01)
(58) Field of Classification Search
  CPC ..... C04B 35/5607; C04B 35/56; C04B 35/58;
    C04B 2235/445; C04B 2235/3205; C04B
    2235/3203; C04B 2235/3201; C01B
    32/949; C01B 32/914; C01B 32/921
  See application file for complete search history.

(56) References Cited

U.S. PATENT DOCUMENTS

| | | | |
|---|---|---|---|
| 6,555,268 | B1 | 4/2003 | Inoue et al. |
| 6,645,612 | B2* | 11/2003 | Pujari ............... C01B 21/064 428/325 |
| 7,446,190 | B2 | 11/2008 | Sadelain et al. |
| 7,527,859 | B2* | 5/2009 | Zhong ............... C04B 35/583 427/212 |
| 7,976,941 | B2* | 7/2011 | Lodyga ............. C04B 35/58007 264/13 |
| 2002/0068488 | A1 | 6/2002 | Tuller et al. |
| 2003/0073769 | A1* | 4/2003 | Pujari ............... C01B 21/064 524/404 |
| 2003/0148184 | A1 | 8/2003 | Omaru et al. |
| 2003/0224168 | A1 | 12/2003 | Mack et al. |
| 2004/0048157 | A1 | 3/2004 | Neudecket et al. |
| 2004/0229028 | A1 | 11/2004 | Sasaki et al. |
| 2006/0140839 | A1* | 6/2006 | Maniccia ............. C01B 21/064 423/290 |
| 2007/0065725 | A1 | 3/2007 | Inoue |
| 2007/0066503 | A1 | 3/2007 | Basaly |
| 2009/0017332 | A1 | 1/2009 | Kisi et al. |
| 2010/0236937 | A1 | 9/2010 | Rosvall et al. |
| 2010/0322909 | A1 | 12/2010 | Okada et al. |
| 2011/0017585 | A1 | 1/2011 | Zhamu et al. |
| 2011/0045223 | A1* | 2/2011 | Lin ...................... C01B 21/0687 428/36.9 |
| 2011/0104464 | A1 | 5/2011 | Pyzik et al. |
| 2012/0247800 | A1 | 10/2012 | Shah et al. |
| 2013/0092428 | A1 | 4/2013 | Kawaguchi et al. |
| 2014/0162130 | A1* | 6/2014 | Barsoum .............. C01B 21/06 429/231.8 |
| 2015/0210044 | A1 | 7/2015 | Barsoum et al. |
| 2015/0306570 | A1 | 10/2015 | Mayes et al. |
| 2015/0321147 | A1* | 11/2015 | Fleming .............. B01D 65/003 210/489 |

FOREIGN PATENT DOCUMENTS

| | | |
|---|---|---|
| JP | H08 78018 | 3/1996 |
| JP | H10 112316 | 4/1998 |
| JP | 2005 158725 | 6/2005 |
| JP | 2007 214137 A | 8/2007 |
| WO | 02/39468 A2 | 5/2002 |
| WO | WO 2002/081372 | 10/2002 |
| WO | WO 2002/096799 A2 | 12/2002 |
| WO | WO 2005/007566 | 1/2005 |
| WO | WO 2006/112869 A2 | 10/2006 |
| WO | WO 2007/093011 | 8/2007 |
| WO | WO 2007/093011 A1 | 8/2007 |
| WO | WO 2007/121931 A2 | 11/2007 |
| WO | WO 2009/063031 A2 | 5/2009 |
| WO | WO 2009/091826 A2 | 7/2009 |
| WO | WO 2010/128492 A1 | 11/2010 |
| WO | WO 2014/088995 A1 | 6/2014 |

OTHER PUBLICATIONS

Barsoum et al, "The Topotactic Transformation of Ti3SiC2 into a Partially Ordered Cubic Ti(C0.67Si0.06) Phase by the Diffusion of Si into Molten Cryolite", Journal of The Electrochemical Society, 1999, 146(10), 3919-3923.

Barsoum, "Physical Properties of the MAX phases", Encyclopedia of Materials: Science and Technology, 2006, 11 pages.
Barsoum, et al., "Synthesis and Characterization of a Remarkable Ceramic: Ti3SiC2", J Amer. Chem. Soc., 1996 79(7), 1953-1956.
Barsoum, M. and El-Raghy, T., "The MAX Phases: Unique New Carbide and Nitride Materials", American Scientist, Jul.-Aug. 2001, 89:334-343.
Barsoum, M., "The MN+1AXN phases: New Class of Solids", Progress In Solid State Chemistry, Jan. 1, 2000, 28(1-4), 201-281.
Chang et al., "Synthesis of a new graphene-like transition metal carbide by de-intercalating $Ti_3AlC_2$", Mater. Lett., Oct. 2013, 109, 295-298.
Chen et al, "Microstructure and Phase Transformation of Ti 3 AC 2 (A= Al, Si) In Hydrofluoric Acid Solution", Crystal Research and Technology, Oct. 27, 2014, 49(10), 813-819.
Chen et al., "In-situ synthesis of Ti3AlC2/TiC—Al2O3 composite from TiO2-Al-C system", Journal of Materials Science & Technology, 2006, 22, 455-458.
Coleman et al, "Two-Dimensional Nanosheets Produced by Liquid Exfoliation of Layered Materials", Science, Feb. 4, 2011, 331, 568-571.
Eis, PS et al, Accumulation of miR-155 and BIC RNA in Human B Cell Lymphomas. Proceedings of the National Academy of Sciences of the United States of America, Mar. 8, 2005, 102(10), 3627-3632, Abstract.
Eklund et al, "The Mn+1AXn Phases: Materials Science and Thin-Film Processing", Thin Solid Films, 2010, 518, 1851-1878.
Ettmayer et al., "Crystal structure of Cr3(C,N)2 and CrVC2", Monatshefte fur Chemie und Verwandte Teile Anderer Wissenschaften, Jul. 1966, vol. 97, Issue 4, 1258-1262.
European Patent Application No. 12803351.1: Supplementary European Search Report dated Jan. 30, 2015, 14 pages.
Finkel et al., "Magnetotransport properties of the ternary carbide Ti3SiC2: Hall effect, magnetoresistance, and magnetic susceptibility", Physical Review B, Jan. 15, 2002, vol. 65, Issue 3, 4 pages.
Ghidiu et al., "Conductive two-dimensional titanium carbide 'clay' with high volumetric capacitance", Nature, Dec. 2014, 516, 78-81.
Halim et al., "Transparent Conductive Two-Dimensional Titanium Carbide Epitaxial Thin Films", Chem. Mater., 2014, vol. 26, No. 7, 2374-2381, Abstract; p. 2376, Scheme 1, p. 2379, col. 1, para. 2; p. 2379, col. 2, para. 2.
Henadaoui et al., "Ti—Al—C MAX Phases by Aluminothermic Reduction process", International Journal of Self-Propagating High-Temperature Synthesis, 2008, 17, 125-128.
Hu et al. "Two-dimensional $Sc_2C$: A reversible and high-capacity hydrogen storage material predicted by first principles calculations", International Journal of Hydrogen Energy, Jul. 2014, 39, 20, 10606-10612.
Hu et al., "MXene: A New Family of Promising Hydrogen Storage Medium", J. Phys. Chem A, 2013, 117, 14523-14260.
Hu, C., "Low Temperature Thermal Expansion, High Temperature Electrical Conductivity, and Mechanical Properties of Nb4AlC3 Ceramic Synthesized by Spark Plasma Sintering", Journal of Alloys and Compounds, Nov. 13, 2009, 487(1-2), 675-681.
International Patent Application No. PCT/US13/072733: The International Search Report and The Written Opinion dated Mar. 28, 2014, pp. 1-12.
International Patent Application No. PCT/US13/64503: The International Search Report and The Written Opinion dated Jan. 24, 2014, pp. 1-13.
Jin et al., "Synthesis of VC—Cr3C2 Nanocomposite Powders by Carbothermal Reduction", Nanoscience and Nanotechnology Letters, Oct. 2012, vol. 4, No. 10, 1028-1030, Abstract, 1 page.
Korzhavyi et al, "Ab Initio Study of Phase Equilibria in $TiC_x$", Physical Review Letters, Dec. 18, 2001, 88(1), 1-4.
Kulkarni et al, Thermal Expansion and Stability of Ti2SC in Air and Inert Atmospheres, Journal of Alloys and Compounds, 2009, 469, 395-400.
Mogilevsky et al, "The Structure of Multilayered Titania Nanotubes Based on Delaminated Anatase", Chemical Physics Letters, 2008, 460, 517-520.

(56) References Cited

OTHER PUBLICATIONS

Myhra, et al., "Crystal-Chemistry of the $Ti_3AlC_2$ and $Tl_4AlN$ Layered Carbide/Nitride Phases—Characterization by XPS", Journal of Physics and Chemistry of Solids, Apr. 2001, vol. 62(4), 811-817.

Nadeau, "Clay Particle Engineering: a Potential New Technology with Diverse Applications", Applied Clay Science, 1987, 2, 83-93.

Naguib et al, "Mxene: A Promising Transition Metal Carbide Anode for Lithium-ion Batteries", Electrochemistry Communications, 2012, 16, 61-64.

Naguib et al, "New Two-dimensional Niobium and Vanadium Carbides as Promising Materials for Li-Ion Batteries", American Chemical Society, Oct. 2013, 135(43), 15966-15969.

Naguib et al, Synthesis of a New Nanocrystalline Titanium Aluminum Fluoride Phase by Reaction of Ti2aic With Hydrofluoric Acid, RSC Adv. 1: 1493-1499, 2011. [retrieved on Mar. 7, 2014]. Retrieved from the internet: <URL: http://pubs.rsc.org .ezproxy.neu.ed u/en/Content/Articlelanding/2011/RA/c1ra00390a#/div, Abstract.

Naguib et al, "Two-Dimensional Nanocrystals Produced by Exfoliation of $Ti_3AlC_2$", Advanced Materials, 2011, 23, 4248-4253.

Naguib et al, "Two-Dimensional Transition Metal Carbides", American Chemical Society, Feb. 2012, 6(2), 1322-1331.

Naguib et al., "Mxenes: A new family of two-dimensional materials", Advanced Materials, 2014, 26, 992-1005.

Nan et al., "Percolation phenomena in niobium-doped TiC1—x", Materials Science and Engineering B-Solid State Materials for Advanced Technology, Feb. 1991, vol. 7, Issue 4, 283-286.

Peng et al., "Unique lead adsorption behavior of activated hydroxyl group in two-dimensional titanium carbide", Journal of The American Chemical Society, 2014, 136, 4113-4116.

Rao et al, "A Study of the Synthetic Methods and Properties of Graphenes", Science and Technology of Advanced Materials, 11, Oct. 27, 2010, 1-15.

Rudy, "Crystal structure of Ta2VC2", Journal of the Less-Common Motale, Jan. 1970, vol. 20, Issue 1, 49-55.

Savoskin et al, "Carbon Nanoscrolls Produced From Acceptor-Type Graphite Intercalation Compounds", 2007, Carbon, 45, 2797-2800.

Schmidt, et al., "XPS Studies of Amino Acids Absorbed on Titanium Dioxide Surfaces", Fresenius Journal of Analytical Chemistry, May 1991, 341, 412-415.

Spanier et al, "Vibrational Behavior of the Mn+1AXn phases from First-Order Raman Scattering „M=Ti ,V,Cr, A=Si, X=C,N)", Physical Review B, Jan. 2005, 71, 1-4.

Srinivasan, "Batteries for Advanced Transportation Technologies (BATT) Program. The fourth quarter 2014 FY report", Berkeley National Laboratory Document, Nov. 19, 2014, http://bmr.lbl.gov/wp-content/uploads/sites/3battfiles/reports/BATT_2014_4th_Quarterly_Report.pdf, 74 pages.

Stankovich et al, "Graphene-based Composite Materials", Nature, Jul. 2006, 442, 282-286.

Su et al., "High-Quality Thin Graphene Films from Fast Electrochemical Exfoliation", ACS Nano, 2011, 5(3), 2332-2339.

Tang et al., "Are MXenes Promising Anode Materials for Li Ion Batteries? Computational Studies on Electronic Properties and Li Storage Capability of $Ti_3C_2$ and $Ti_3C_2X_2$ (X=F, OH) Monolayer", Journal of The American Chemical Society, 2012, 134, 16909-16916.

Tran et al, "Lithium Intercalation in Porous Carbon Electrodes", Material Research Society 1995 Spring Meeting, San Francisco, CA, Apr. 17-21, 1995, 12 Pages.

Travaglini et al, "The Corrosion Behavior of Ti3SiC2 In Common Acids and Dilute NaOH", Corrosion Science, Jun. 1, 2003, 45(6), 1313-1327.

Tzenov et al, "Synthesis and Characterization of TI3ALC2", Journal of the American Ceramic Society, Jan. 1, 2000, 83(4), 825-832.

Viculis et al, "A Chemical Route to Carbon Nanoscrolls", Science, Feb. 28, 2003, 299, p. 1361.

Viculis, et al., "Intercalation and Exfoliation Routes to Graphite Nanoplatelets", Journal of Materials Chemistry, 2005, vol. 15, 974-978.

Lukatskaya et al: "Cation Intercalation and High Volumetric Capacitance of Two-Dimensional Titanium Carbide", Science, vol. 341, No. 6153, Sep. 27, 2013, pp. 1502-1505, & "Supplementary Materials—Cation Intercalation and High Volumetric Capacitance of Two-Dimensional Titanium Carbide", Science, vol. 341, No. 6153, Sep. 26, 2013, pp. 1-15.

\* cited by examiner

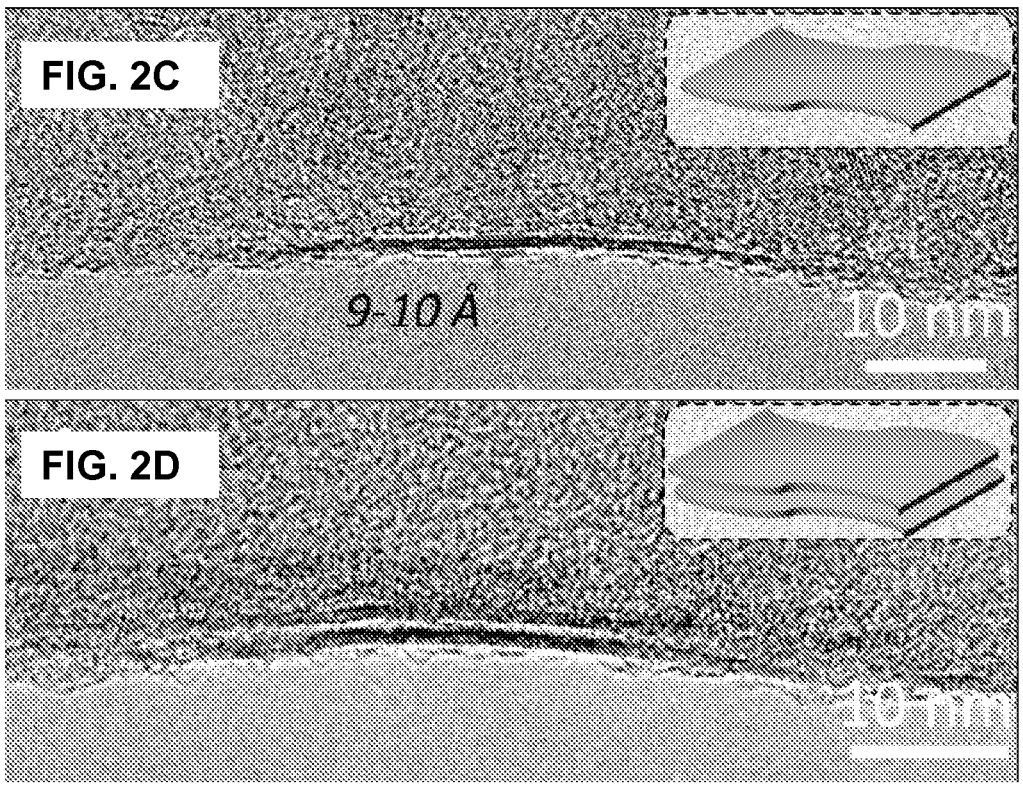
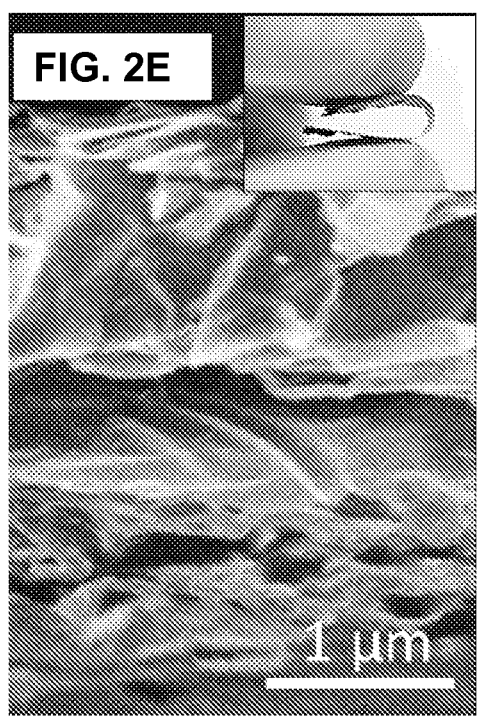
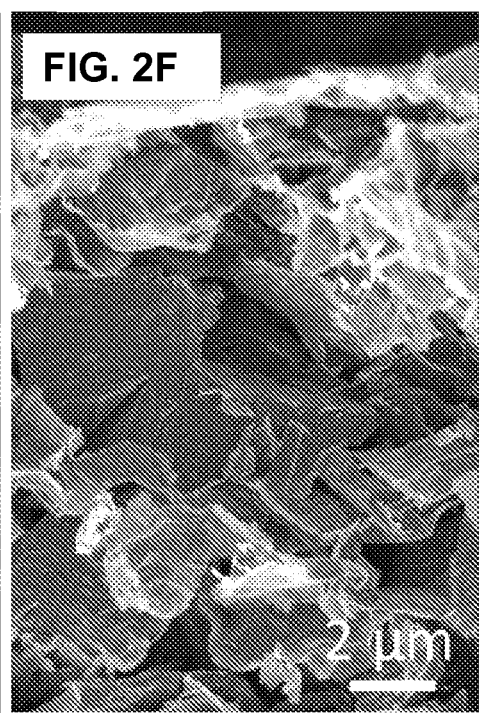

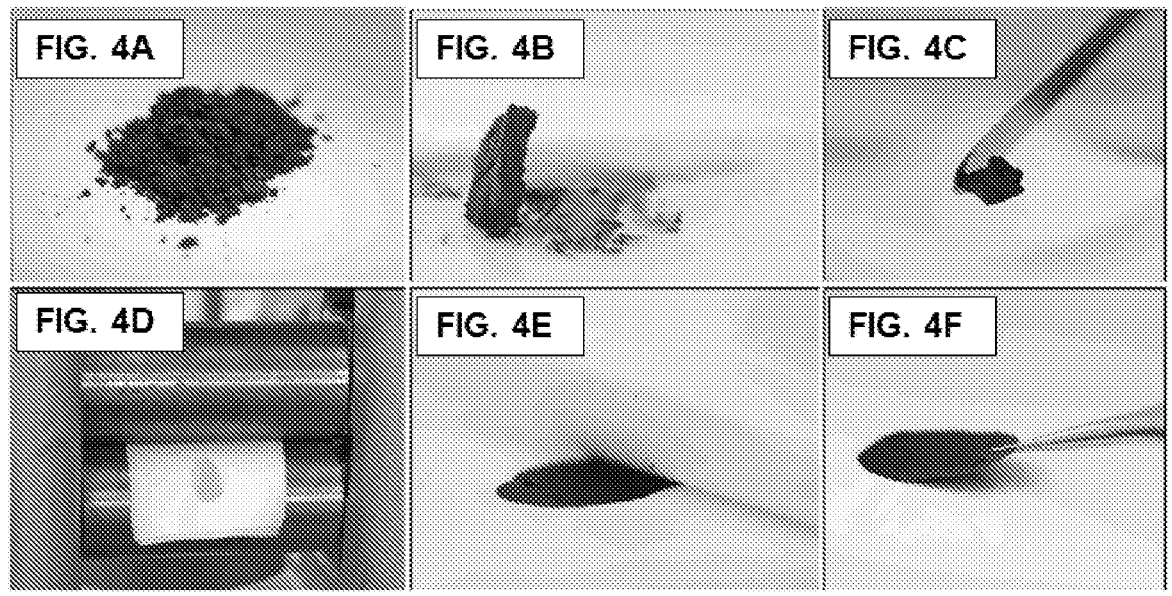
FIG. 5A
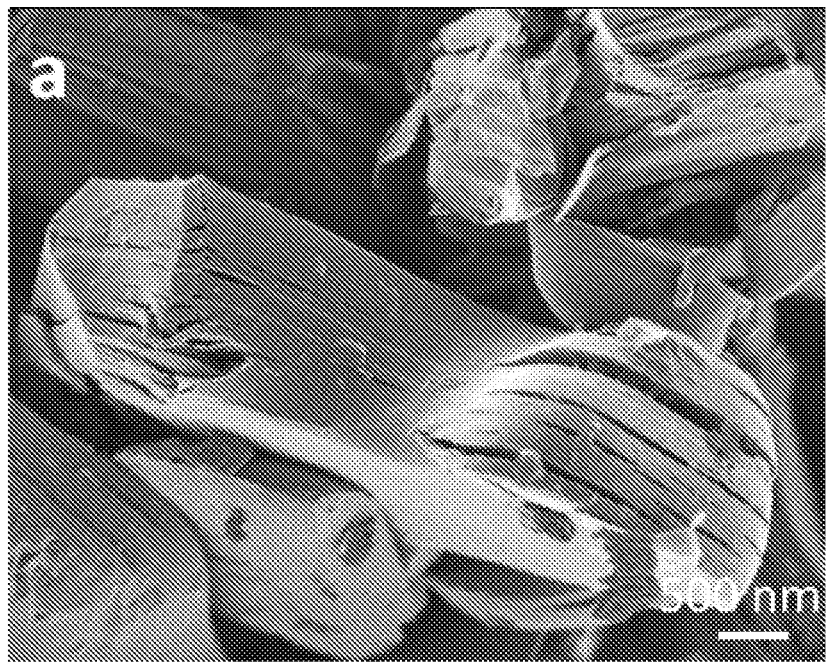

FIG. 6A, C, D, E
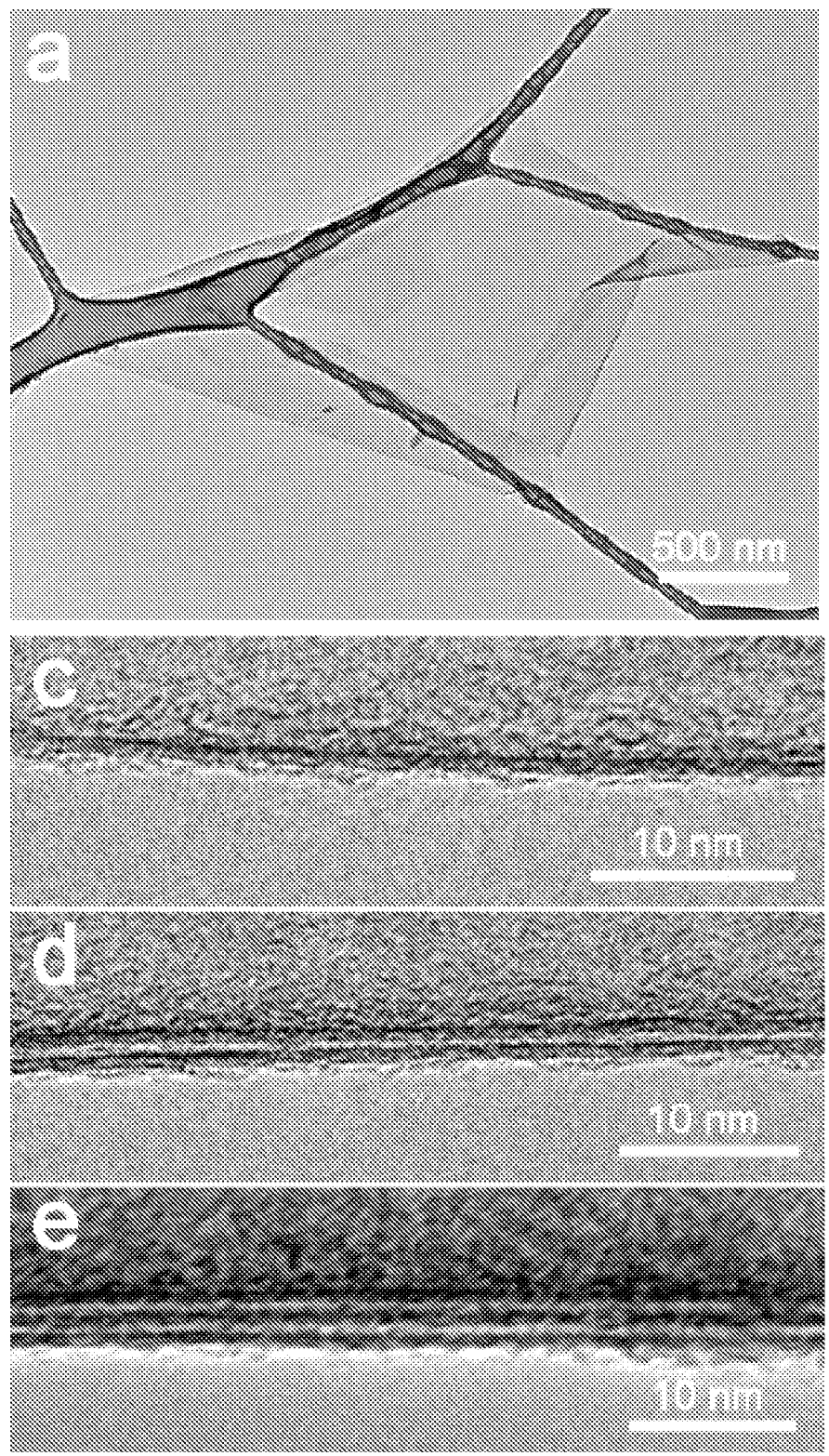

| Measurement | Conductivity (S/cm) |
|---|---|
| 4-point Probe | $6.8 \times 10^3$ |
| Ellipsometry | $7.35 \times 10^3$ |
| Flexible Substrate | |
| Flat | $2.33 \times 10^3$ |
| $R_c = 14.4$ mm | $2.33 \times 10^3$ |
| $R_c = 5.1$ mm | $2.21 \times 10^3$ |

| Spincast $Ti_3C_2T_x$ | Conductivity (S/cm) |
|---|---|
| On glass | 6800 |
| On polyetherimide | |
| Flat | 6100 |
| Flexed: $R_c=5.1$mm | 5800 |

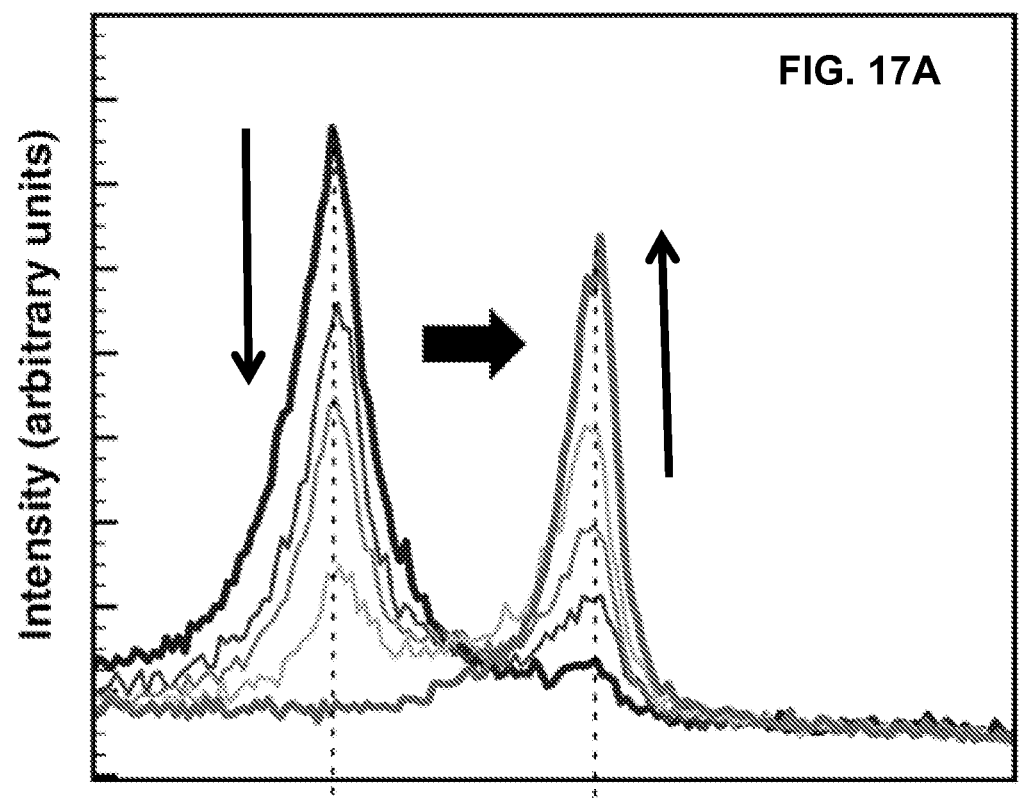
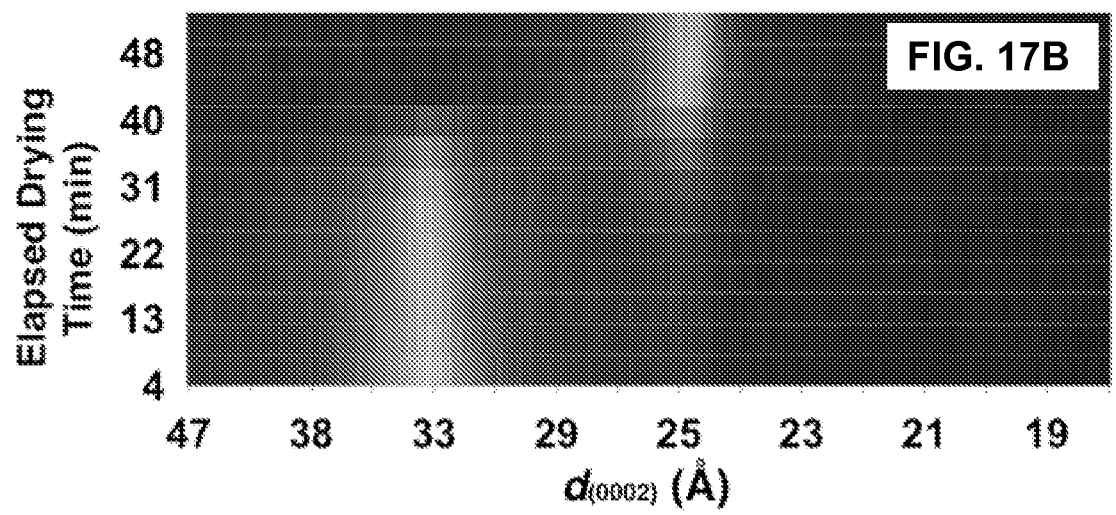

FIGs. 18A, B, D, E
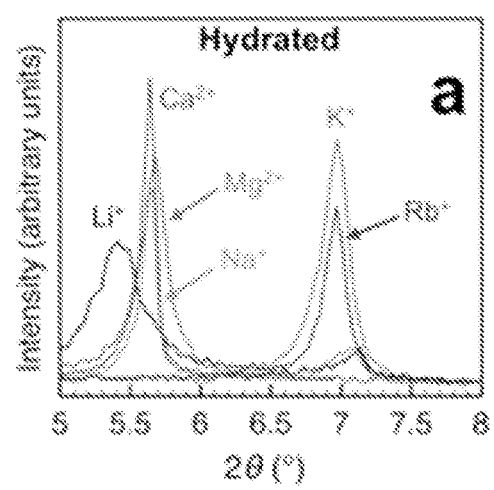
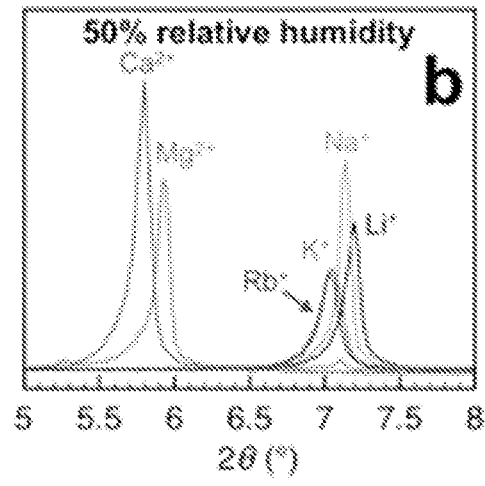
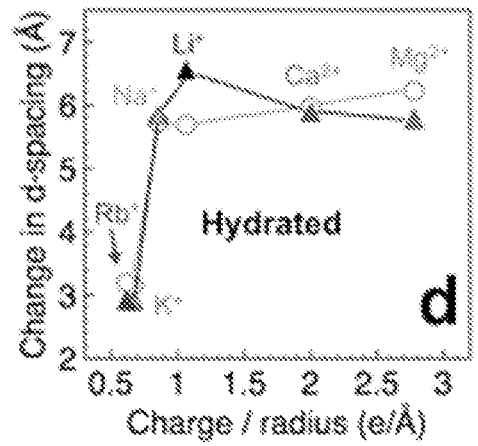
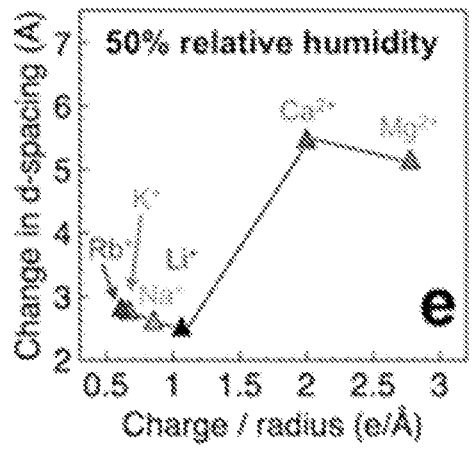

FIGs. 18C, F, G
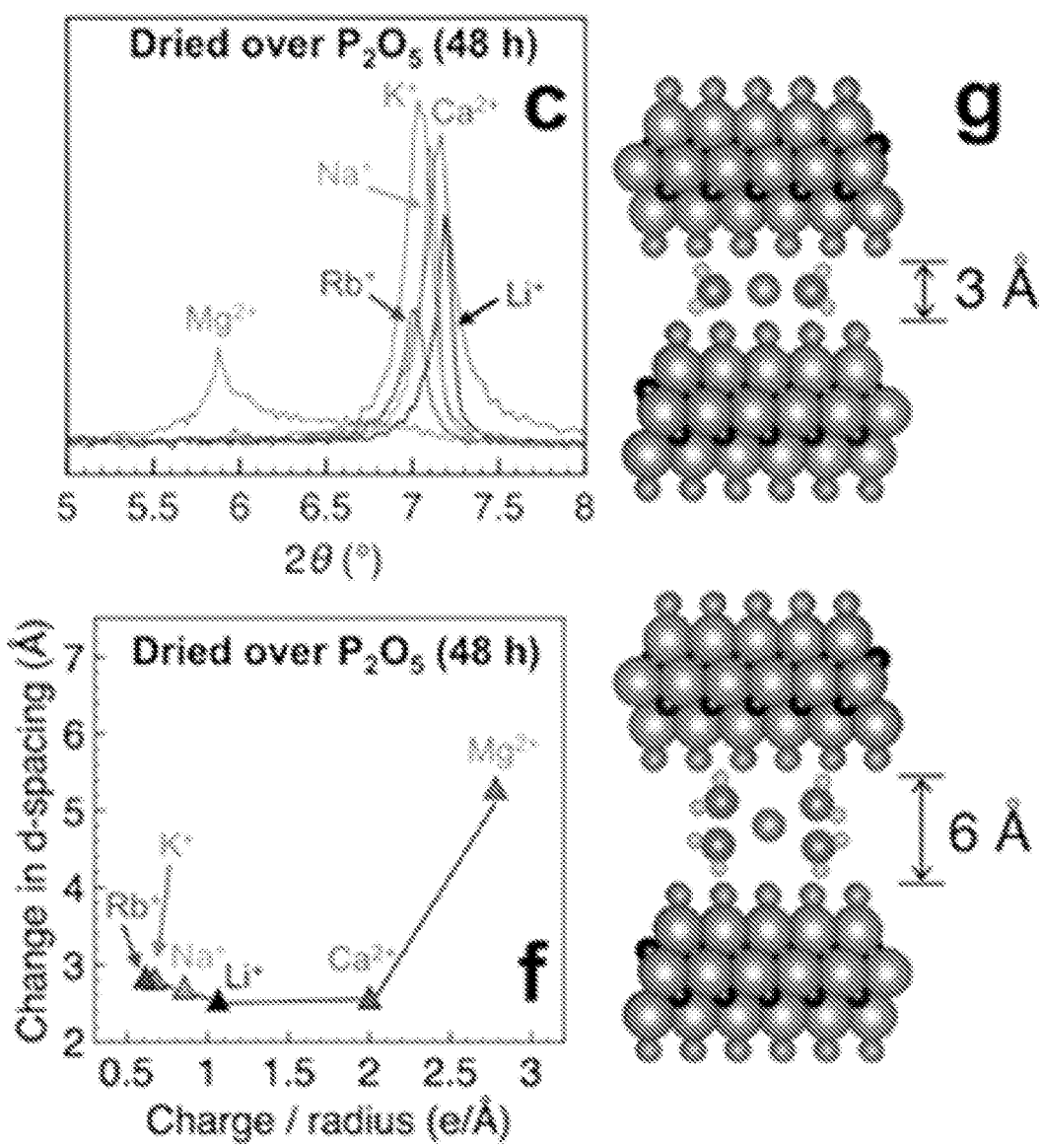

PHYSICAL FORMS OF MXENE MATERIALS EXHIBITING NOVEL ELECTRICAL AND OPTICAL CHARACTERISTICS

CROSS-REFERENCE TO RELATED APPLICATIONS

This application is the National Stage Application of International Patent Application No. PCT/US2015/051588, filed Sep. 23, 2015, which claims priority to U.S. Patent Application Nos. 62/055,155, filed Sep. 25, 2014; and 62/214,380, filed Sep. 4, 2015, the contents of which are incorporated by reference herein in their entireties.

GOVERNMENT RIGHTS

This invention was made with government support under Contract No. 1310245 awarded by the National Science Foundation. The Government has certain rights in the invention.

TECHNICAL FIELD

The present invention(s) relates to novel physical forms of conductive two-dimensional $M_{n+1}X_n(T_s)$ MXene compositions, and methods of making the same.

BACKGROUND

The search for new electrically active materials is driven from a wide range of potential applications.

Safe and powerful energy storage devices are becoming ever increasingly important. Charging times of seconds to minutes, with power densities exceeding those of batteries can be provided by electrochemical capacitors, in particular, pseudocapacitors. Recent research has focused primarily on improving gravimetric performance of electrodes, but for portable electronics and automobiles, volume is at a premium.

In the search for new electrode materials, two-dimensional, 2D, solids are of particular interest due to their large areas of electrochemically-active surfaces. For example, the use of activated graphene electrodes versus conventional porous carbons can result in capacitances of 200-350 F/cm³ (compared to 60-100 F/cm³ for activated carbons). Yet graphene is limited to the chemistry of carbon, does not tap into metal redox reactions as in $RuO_2$, and its conductivity is substantially decreased by redox-active functional groups.

The best volumetric capacitances of carbon-based electrodes are in the 300 F/cm³ range. Hydrated ruthenium oxide, $RuO_2$, utilizes highly reversible redox reactions to reach capacitances in the 1000-1500 F/cm³ range combined with great cyclability, but only for thin films.

It is an object of the present invention to address at least some of these challenges, or to provide a useful alternative.

In other applications, conductors that are extremely thin can be transparent and the fabrication of transparent conductors (TCs), a critical element of touchscreen electronics and solar cells, is a billion dollar per year industry. Transparent conducting films (TCFs) are optically transparent and electrically conductive in thin layers. They are an important component of a number of electronic devices including liquid-crystal displays, light-emitting diodes, touchscreens and photovoltaics.

Transparent conducting films can be used as windows through which light passes to access a photoactive material beneath (e.g., a photovoltaic, where carrier generation occurs), as an ohmic contact for carrier transport out of the photoactive material, and can also act as transparent carrier for surface mount devices used between laminated glass or light transmissive composites.

Indium-tin-oxide (ITO) is the most widely used transparent conductors but is limited by the high cost of both the raw materials, such as indium, and the fabrication technique. Fluorine doped tin oxide (FTO), and doped zinc oxide have also been used for such applications. More recently, films using materials such as silver nanowires or carbon nanotube networks or graphene have been used as an alternative to ITO. Such materials are particularly useful owing to their transparency to infrared light. These all represent 'bottom-up' nanomaterials, requiring expensive synthetic procedures to make the starting material. The highest conductivity reported for solution processed graphene is 200 S/cm and this material has not been shown to demonstrate transparency in any applications.

It is an object of the present invention to address at least some of these challenges, or to provide a useful alternative.

SUMMARY

Herein are described a new method to produce two-dimensional $M_{n+1}X_n(T_s)$ compositions, in some cases exemplified by $Ti_3C_2(T_s)$ (where $T_s$ refers to surface terminations). These methods comprise etching the aluminum from $Ti_3AlC_2$ using fluoridic acids, for example aqueous HF derived from mixtures of alkali fluoride salts and mineral acids. The resulting hydrophilic, water-swelling material can be shaped like clay and dried into a highly conductive solid or rolled into films tens of microns thick. Additive-free and binder-free films, produced by rolling, demonstrated volumetric capacitance on the order of 1000 F/cm³ (at 2 mV/s and 5 micron thickness) with excellent cyclability and rate performances. This enhancement represents an almost three-fold increase in capacitance over previous reports.

The present invention will be generally described with reference to $Ti_3C_2$ as an example, although it will be appreciated that the scope of the invention is not limited to this particular example but encompasses all compounds of the general $M_{n+1}X_n(T_s)$ formula, their solid solutions and composites based upon them.

In some embodiments, the reaction of titanium aluminum carbide with fluoridic acids, such as derived from hydrochloric acid and lithium fluoride, after equilibration with water to adjust pH, a material can be produced which dries into a solid mass with high conductivity. Analogous to clay, upon addition of water, the solid mass is rehydrated; it can be molded into a desired shape and dried again to the starting consistency and properties; this process is repeatable. Further, the material can be rolled under pressure to yield free-standing flexible films that are very conductive; rolled thinly enough, these films can become transparent (visible light can pass through without scattering). Dispersed in water, the material can also be drop casted to yield thin, conductive, highly transparent films on various substrates (plastic, glass, etc). Like certain clays, the material shows variable swelling upon water uptake. Further, processing by rolling yielded electrodes for supercapacitors showing volumetric capacitance on the order of 1000 F/cm³. Higher capacitances are believed possible with optimization.

Generally, clays are non-conductive and typically require conductive additives to show conductivity. This new 'clay' is both hydrophilic and shows high conductivity without additives upon drying. Due to these properties, the hydrated material can be processed by rolling into films with highly controllable thicknesses (from a few microns to more than 100 microns), with virtually no lateral size limitations. These films have recently been tested in electrochemical capacitors (supercapacitors), demonstrating exceptional volumetric capacitance on the order of 1000 F/cm$^3$ (at 2 mV/s in sulfuric acid); further, the cost of materials is low since the active material's composition is of carbon and titanium. Such ease of processing, high performance, and relatively low material cost is a breakthrough for supercapacitor electrodes.

This disclosure also provides improved methods for intercalating alkali metal and alkaline earth metal ions within the MXene frameworks, providing new methods for tuning the electrical and optical characteristics of these materials.

Also disclose herein are new methods of producing Angstroms- or nanometer-thick films comprising $M_{n+1}X_n(T_s)$ compositions, again exemplified by from MXene-phase titanium carbide nano platelets such as those derived from $Ti_3C_2(T_s)$ (where $T_s$ refers to surface terminations). Certain of these films are optically transparent owing to their composition and thicknesses. In some embodiments, the MXene nanoplatelets, dispersed in a solvent, are cast on to an arbirtary substrate, for example by spin coating or dip coating, and the solvent evaporated leaving a thin film composed of MXene flakes that are Angstroms or nanometer thick. The films are highly conductive, exhibiting an intrinsic conductivity of at least 1000 S/cm (in some cases over areas as large as one square inch), while attractively low absorption coefficient on the order of $10^5$ cm$^{-1}$.

In many cases, the present invention will be generally described with reference to $Ti_3C_2$ as an example, although it will be appreciated that the scope of the invention is not limited to this particular example but encompasses all compounds of the general $M_{n+1}X_n(T_s)$ formula, their solid solutions and composites based upon them.

In some embodiments, a method comprises (a) applying a MXene dispersion onto a substrate surface, said MXene dispersion comprising or (consisting essentially of) at least one type of MXene platelets dispersed in a solvent; and (b) removing at least a portion of solvent so as to provide a coated film of at least one layer of MXene platelets oriented to be essentially coplanar with the substrate surface; said coated film being electrically conductive and exhibiting one or more characteristics including: (i) a resistivity in a range of from about 0.01 to about 1000 micro-ohm-meters; (ii) an ability to transmit at least about 50% of incident light of at least one wavelength in a range of from about 300 nm to about 2500 nm; (iii) a ratio of DC conductivity, measured in Siemens/meter, to light absorbance (including visible light absorbance), measured as a decadic absorbance per meter, of at least 0.1 Siemens measured at at least one wavelength in the range of 300 to 2500 nm; (iv) a value of the real dielectric permittivity of less than negative one for wavelengths greater than a threshold wavelength in the visible to near-infrared range; and (v) a combination of any two or more of (i), (ii), (iii), and (iv).

These coatings may be applied to the rigid or flexible substrate surfaces by spin coating, brushing, dipcoating, or doctor blading typically, but not necessarily, using dispersions in water or an organic solvent, preferably a polar solvent such ethanol, isopropanol, dimethylformaide, pyridine, or dimethylsulfoxide. The coatings may also cover complete areas or may be patterned using lithographic techniques.

Again, these methods are amenable to a variety of MXene compositions, such as described herein and elsewhere.

Coatings prepared by these inventive methods are also considered within the scope of the present invention as are electrical devices and materials comprising these coatings. Exemplary devices and materials include, but are not limited to, RFID tag, windows with switchable opacity, photodetectors, liquid crystal displays, light emitting diodes (including organic light emitting diodes), touchscreens, photovoltaic devices, plasmonic devices such as plasmonic sensor arrays, optical-to-electrical signal transducers, surface-plasmon polariton transmitters, or an infrared-reflecting window, and metamaterials, such as cloaking materials, transformational optic components, or superlenses comprising the inventive coatings.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In addition, the drawings are not necessarily drawn to scale. In the drawings:

In FIG. 1A, MAX phase is etched in a solution of acid and fluoride salt (1), then washed with water to remove reaction products and raise the pH toward neutral (2). The resulting sediment behaves like a clay; it can be rolled to produce flexible, freestanding films (3), molded and dried to yield conducting objects of desired shape (4), or diluted and painted onto a substrate to yield a conductive coating (5). FIG. 1B shows that when dried samples (left, showing cross section and top view) are hydrated (right) they swell; upon drying, they shrink. FIG. 1C shows an actual image of a rolled film. FIG. 1D shows a 'clay' form shaped to the letter M (~1 cm) and dried, yielding a conductive solid (inset: experimental conductivity of 'clay' rolled to 5 nm thickness). The etched material is referred to as $Ti_3C_2(T_s)$, where the $T_s$ stands for surface terminations, such as OH, O and F, which may be independently present on one or both surfaces.

FIGS. 2A-F provide structural characterizations of a $M_{n+1}X_n(T_s)$ MXene. FIG. 2A shows XRD patterns of samples produced by etching in LiF/HCl solution. Lower trace: multilayer $Ti_3C_2(T_s)$ showing a sharp, intense (0002) and higher order (000l) peaks, corresponding to a c lattice parameter of 28 Å and high order in the c direction. Upper trace: same sample after rolling into a ca. 40 nm thick film; c direction peaks are preserved, but the prominent (110) peak is no longer observed, showing significant reduction of order in non-basal directions. In both cases, traces of $Ti_3AlC_2$ are still present (diamonds). FIG. 2B shows TEM image of several flakes, showing lateral sizes up to a few hundred nm. Few defective areas are present. Inset shows overall SAED pattern. FIGS. 2C and D shows TEM images of single- and double-layer flakes, respectively; Insets show sketches of these layers. FIG. 2E shows SEM image of a fracture surface of a ca. 4 μm thick film produced by rolling, showing shearing of layers; flexibility of the film is demonstrated in inset; FIG. 2F shows a fracture surface of a thicker rolled film (ca. 30 μm), showing poorer overall alignment of flakes in the interior of the film.

FIG. 3 shows electrochemical performance of rolled, free-standing electrodes.

FIG. 4 shows processing of $M_{n+1}X_n(T_s)$ clay: (a) shows the dried and crushed powder; (b) and (c) show the hydrated clay to be plastic and readily formed and molded; (d) shows films being produced in the roller mill; (e) and (f) show rolled freestanding films being lifted off Celgard membranes.

FIGS. 5A-B show SEM images of FIG. 5A multilayer $M_{n+1}X_n(T_s)$ particle. FIG. 5B cross-section of rolled $Ti_3C_2$ film, suggesting that the shear stresses applied during rolling is most probably responsible for the loss of the 60° angle peak in the XRD pattern.

FIGS. 6A-F show TEM characterization of dispersed $Ti_3C_2(T_s)$ flakes. FIG. 6A shows a representative TEM image showing the morphology and size of a large single-layer $Ti_3C_2(T_s)$ flake. Note folding on all sides of this large flake. FIG. 6B shows the lateral size distribution of the dispersed $Ti_3C_2(T_s)$ flakes. Representative TEM images showing 6C single-, 6D, double and 6E, triple-layer flakes. FIG. 6F shows a statistical analysis of layer number distribution of dispersed $Ti_3C_2(T_s)$ flakes. Note that the fractions of double- and few-layer flakes are overestimated due to inevitable restacking and edge folding of single-layer flakes during preparation of samples for TEM analysis. The latter is clearly seen in FIG. 6A. An example of the former is shown in FIG. 7.

FIG. 8D shows gravimetric rate performances of rolled electrodes: 5 µm (squares), 30 µm (circles) and 75 µm (triangles) thick.

FIG. 9A shows the UV-vis-NIR transmittance spectra of a set of spincoated MXene films of varying thickness. FIG. 9B shows the sheet resistance vs. transmittance of MXene films spincast on soda-lime glass. Transmittance values represent the average transmittance of light between 550 nm and 1100 nm. The trend line is an exponential fit for points with transmittance between 2% and 85%. Error bars represent the standard deviation of the sheet resistance over the film and are present on all data points, but are too small to be seen in some cases. Upper, MXene films with transmittance ranging from 74.8% (left) to 91.7% (right). Lower, spincast MXene film with a transmittance of 30%.

FIG. 10A is an SEM micrograph of the profile of a cleaved MXene film spincoated on a silicon wafer. FIG. 10B is a surface SEM micrograph of a spincoated MXene film. FIG. 10C shows the relationships of transmittance vs AFM-measured thickness of MXene films. A linear fit gave the absorption coefficient, $\alpha=1.42\times10^5$ $cm^{-1}$, $R^2=0.996$. Inset: Example AFM measurement to determine film thickness. A scratch was made in the MXene film on silicon, shown here for a film with 7% transmittance. The left side shows the surface of the MXene film, and the right shows the scratch. The film was 78 nm thick with a surface roughness of 8.7 nm.

FIG. 12A shows the complex reflectivity values, IP (top three curves) and A (bottom three curves), as a function of wavelength, collected at 50°, 60°, and 70°, of spincoated MXene films. An optical model consisting of a Drude oscillator, and two harmonic oscillators, provides a mean-square-error of 9.91 over the entire range of wavelengths and angles. The Drude oscillator indicates a resistivity of $1.36\times10^{-4}$ Ω·cm and scattering time of 1.73 fs. FIG. 12A shows the real and imaginary dielectric constants as a function of wavelength. The models used to develop FIGS. 12A and 12B were the same.

FIG. 13A shows the relative changes in sheet resistance vs. time for spincoated MXene films stored in open air (solid lines) and analogous films stored under nitrogen (dashed lines). Red lower, green middle, and blue upper lines within each category represent films with transmittance (thickness) of 27% (92 nm), 53% (45 nm), and 82% (14 nm) respectively. FIG. 13B shows sheet resistance of three spincoated MXene films in a sequence of wetting and drying. Films were measured as spincoated (leftmost in each grouping), then after being stored under dry nitrogen for overnight (second from left in each grouping), stored in wet nitrogen for two days (second from right in each grouping), and lastly stored under dry nitrogen for one day (rightmost in each grouping)

FIG. 14A shows a spincoated MXene film on a flexed polyetherimide substrate. FIG. 14B shows an XRD pattern of an exemplary spincoated MXene film on glass, showing 002 peak at 7.1° corresponding to c lattice parameter of 25 Å. FIG. 14C shows a several measures of conductivity of spincoated MXene films measured. The conductivity of MXene films on the polymer substrate was measured by two-point resistivity, translated into bulk conductivity using the thickness extrapolated from the measured transmittance and the cross-sectional area of the electrodes.

FIG. 18A-C shows XRD patterns of ion-exchanged $Ti_3C_2T_x$ under various conditions. FIG. 18A shows the rapid rehydration with liquid water; FIG. 18A shows the traces for samples) equilibrated for 48 h at ~50% relative humidity; FIG. 18C shows the XRD traces for samples dried over anhydrous $P_2O_5$ for 48 h. FIGS. 18D-FC shows the change in d-spacing per interlayer space extracted from XRD data in (a-c) as a function of e/r, where e is the charge on the cation and r its radius. d) rapid rehydration: $Ti_3C_2$ (triangles), with ion-intercalated $A_{0.5}(H_2O)_y[TiS_2]^{0.5}$, where A is a cation (open circles) taken from reference 12. FIG. 18E shows the XRD traces for $Ti_3C_2T_x$ equilibrated for 48 h at ~50% relative humidity. FIG. 18F shows the XRD traces for $Ti_3C_2T_x$ dried over anhydrous $P_2O_5$ for 48 h. The patterns in a, b, and c are colour-coordinated with the labelled cations. FIG. 18G shows cartoons depicting the interlayer space with cation intercalation leading to a single layer of $H_2O$ (top) or a two-layer arrangement (bottom). Green: Ti; black: C; purple: generic surface termination (O/OH/F); red: O; white: H; teal: intercalated cation. See Example 8.

FIGS. 19A-C show XPS spectra with curve-fitting for: FIG. 19A: Li 1s region for (i) $Ti_3C_2T_x$-1 (ii) $Li-Ti_3C_2T_x$ (iii) $Na-Ti_3C_2T_x$ (iv) $Rb-Ti_3C_2T_x$ before sputtering, dashed vertical lines represent, from left to right, species LiF/LiCl and LiOH/$Li_2O$, and the large shoulder on the left is due to the Ti 3s peak, FIG. 19B: Na is region for (i) $Na-Ti_3C_2T_x$ before sputtering, and, (ii) $Na-Ti_3C_2T_x$ after sputtering. Dashed vertical lines, from left to right, represent the species NaOH (Na 1s), NaF/NaCl (Na 1s), Ti—C(Auger LMM line), and $TiO_2$ (Auger LMM line), and FIG. 19C: Rb 3d region for (i) $Rb-Ti_3C_2T_x$ before sputtering, and (ii) $Rb-Ti_3C_2T_x$ after sputtering. Dashed vertical lines, from right to left, represent the species $Rb^+$ ($3d_{5/2}$), RbCl ($3d_{5/2}$), $Rb^+$ ($3d_{3/2}$), and RbCl ($3d_{3/2}$). See Example 8.

DETAILED DESCRIPTION OF ILLUSTRATIVE EMBODIMENTS

Figure 1A:
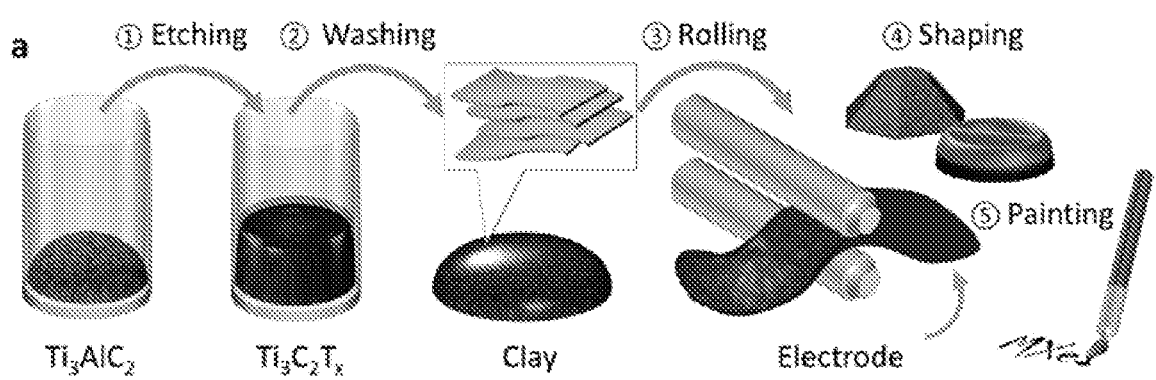
FIGS. 1A-D illustrate a schematic of $M_{n+1}X_n(T_s)$ clay synthesis and electrode preparation.

The present invention may be understood more readily by reference to the following description taken in connection with the accompanying Figures and Examples, all of which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the methods of preparing the desired products, as well as the use of the products so prepared, and vice versa.

Terms

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about," it will be understood that the particular value forms another embodiment. In general, use of the term "about" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

When a list is presented, unless stated otherwise, it is to be understood that each individual element of that list and every combination of that list is to be interpreted as a separate embodiment. For example, a list of embodiments presented as "A, B, or C" is to be interpreted as including the embodiments, "A," "B," "C," "A or B," "A or C," "B or C," or "A, B, or C."

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Finally, while an embodiment may be described as part of a series of steps or part of a more general structure, each said step or part may also be considered an independent embodiment in itself.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are described herein.

In this specification and in the claims that follow, reference will be made to a number of terms, which shall be defined to have the following meanings.

Supplementing the descriptions herein, $M_{n+1}X_n(T_s)$ (including $M'_2M''_mX_{m+1}(T_s)$ compositions) may be viewed as comprising free standing and stacked assemblies of two dimensional crystalline solids. Collectively, such compositions are referred to herein as "$M_{n+1}X_n(T_s)$," "MXene," "MXene compositions," or "MXene materials." Additionally, these terms "$M_{n+1}X_n(T_s)$," "MXene," "MXene compositions," or "MXene materials" can also independently refer to those compositions derived by the chemical exfoliation of MAX phase materials, whether these compositions are present as free-standing 2-dimensional or stacked assemblies (as described further below). MXene compositions comprise at least one layer having first and second surfaces, each layer comprising: a substantially two-dimensional array of crystal cells; each crystal cell having an empirical formula of $M_{n+1}X_n$, where M, X, and n are defined herein. These compositions may be comprised of individual or a plurality of such layers. In some embodiments, the MXenes comprising stacked assemblies may be capable of, or have atoms, ions, or molecules, that are intercalated between at least some of the layers. In other embodiments, these atoms or ions are lithium. In still other embodiments, these structures are part of an energy-storing device, such as a battery or supercapacitor.

The term "crystalline compositions comprising at least one layer having first and second surfaces, each layer comprising a substantially two-dimensional array of crystal cells" refers to the unique character of these materials. For purposes of visualization, the two-dimensional array of crystal cells may be viewed as an array of cells extending in an x-y plane, with the z-axis defining the thickness of the composition, without any restrictions as to the absolute orientation of that plane or axes. It is preferred that the at least one layer having first and second surfaces contain but a single two-dimensional array of crystal cells (that is, the z-dimension is defined by the dimension of approximately one crystal cell), such that the planar surfaces of said cell array defines the surface of the layer; it should be appreciated that real compositions may contain portions having more than single crystal cell thicknesses.

That is, as used herein, "a substantially two-dimensional array of crystal cells" refers to an array which preferably includes a lateral (in x-y dimension) array of crystals having a thickness of a single unit cell, such that the top and bottom surfaces of the array are available for chemical modification.

High Capacitance "Clays"

Various embodiments of the present disclosure include those comprising: (a) adjusting the water content of a $M_{n+1}X_n(T_s)$ composition to form a compressible paste wherein the ratio of water to $M_{n+1}X_n(T_s)$ MXene by mass is in a range of from about 0.3 to about 0.65; and (b) compressing an amount of the MXene composition with a pressure of at least 5 psig to form a solid body that is electrically conductive exhibiting (i) a resistivity in a range of from about 1 to about 10,000 micro-ohm-meters; (ii) volumetric capacity of at least 500 F/cm$^3$ when tested as a scan rate of 20 mV/s or at least 550, 600, 650, 700, 750, or 800 F/cm$^3$ when tested as a slower scan rate; or (iii) both (i) and (ii). $M_{n+1}X_n(T_s)$ compositions are more fully described herein, but may be defined here as comprising at least one layer (preferably a plurality of layers) each having a first and second surface, each layer comprising a substantially two-dimensional array of crystal cells; each crystal cell having an empirical formula of $M_{n+1}X_n$, such that each X is positioned within an octahedral array of M, wherein M is at least one Group 3, 4, 5, 6, or 7 metal (corresponding to Group IIIB, IVB, VB, VIB, or VIIB metal), wherein each X is C, N, or a combination thereof and n=1, 2, or 3; wherein at least one of said surfaces of the layers has surface terminations, $T_s$, independently comprising alkoxide, alkyl, carboxylate, halide, hydroxide, hydride, oxide, sub-oxide, nitride, sub-nitride, sulfide, sulfonate, thiol, or a combination thereof.

Various other embodiments provide that the ratio of water to $M_{n+1}X_n(T_s)$ MXene is in a range bounded at the lower end by a value of about 0.1, 0.2, 0.25, 0.35, 0.4, 0.45, and 0.5 and is bounded by a value at the higher end by a value of about 0.65, 0.5, 0.45, or 0.4. A range of 0.3 to about 0.65 provides a good range for easy handling of the materials, but compositions at the lower end of the water range are necessarily formed during the processing of the conductive materials. While the compositions having these water to MXene ratios are described in terms of the method described herein, it should be appreciated that the compositions themselves are also considered separate embodiments of this disclosure.

Compositions in the ranges described are characterized by their ability to reversibly swell in volume with addition or removal of water (both observable by the naked eye as volume change and observable via x-ray diffraction on the unit-cell level). The extent of the water present in the structure can be controlled by controlling the addition of water to the solids or even by controlling the humidity of the environment. $M_{n+1}X_n(T_s)$ clays within these ranges may be characterized as malleable on handling; i.e., having a consistency of modeling clay.

Where the ratio of water to MXene is above 0.65, the mixtures are better described as a colloidal dispersion 'ink.' Such inks can be deposited (e.g., by gravitational settling or vacuum assisted filtration) and dried (e.g., by evaporation) to yield MXene films. Such films can be made thin enough to be optically transparent while retaining high conductivity. The film thickness and optical properties (transparency, interference colors) can be controlled by varying the concentration of MXene in the applied suspension.

While the application of pressure is described in terms of pressures exceeding 5 psig, this value is flexible, and the compressing can be done at a pressure in a range of from about 5 psig to about 500 psig. In some embodiments, the compressing is accompanied by the removal of water, as water is squeezed from the composition, and so it is sometimes helpful to provide adsorbant materials between the MXene compositions and the compression, or other means of removing water.

The compression can be accomplished by any conventional methods known in the art (using conventional flattening or shaping equipment), but is most conveniently done by compression molding or rolling, for example by rolling the $M_{n+1}X_n(T_s)$ composition between at least two roller bars. See, e.g., FIG. 1A. The compression may be applied in the presence or absence of heat (for example, up to about 50° C.), e.g., using heated or unheated platens or platen-like devices.

Again, it should be apparent that the thickness of the final solid body depends on a number of parameters, including initial pre-compression loading, water content, and pressure; it is convenient to describe these solid bodies as being compressed to a thickness in a range of from about 0.1 microns to about 1000 microns. Independent embodiments provide that the solid body thicknesses can range from about 0.1 to about 0.5 microns, from about 0.5 to about 1 microns, from about 1 to about 2 microns, from about 2 to about 3 microns, from about 3 to about 4 microns, from about 4 to about 5 microns, from about 5 to about 10 microns, from about 10 to about 20 microns, from about 20 to about 30 microns, from about 30 to about 40 microns, from about 40 to about 50 microns, from about 50 to about 75 microns, from about 75 to about 100 microns, from about 100 to about 500 microns, from about 500 to about 1000 microns, or any combination thereof. While these solid bodies are binder-free as prepared, additives and binders may be added as otherwise desired.

The physical form of the MXenes used in these methods may be at least partly defined by the way in which they are prepared. The preferred method of preparing $M_{n+1}X_n(T_s)$ compositions is the reactive delamination of MAX-phase materials, the method resulting in flakes of $M_{n+1}X_n(T_s)$ materials. In particular, the reaction of precursor MAX phase materials with the milder sources of HF described herewithin tends to yield larger $M_{n+1}X_n(T_s)$ flakes on the reactive delamination than are available when HF alone is used for this purpose. Accordingly, in some embodiments, the $M_{n+1}X_n(T_s)$ composition comprises a plurality of $M_{n+1}X_n(T_s)$ flakes having at least one mean lateral dimension in a range of from about 0.5 micron to about 10 microns.

The compositions prepared by these methods provide solid bodies which are electrically conductive, wherein the solid body has surface electrical resistance in a range of from about 1 micro-ohm-meters to about 10,000 micro-ohm-meters. In other embodiments, the surface resistivity is in a range of from about 1 micro-ohm-meters to about 10 micro-ohm-meters, from about 10 micro-ohm-meters to about 100 micro-ohm-meters, from about 100 micro-ohm-meters to about 1000 micro-ohm-meters, from about 1000 micro-ohm-meters to about 10,000 micro-ohm-meters, or a combination thereof.

Ångstrom-Thin Conducting Films

Other various embodiments of the present disclosure include those methods for preparing thin conducting films of MXene materials, these methods comprising: (a) applying a MXene dispersion onto a substrate surface, said MXene dispersion comprising or (consisting essentially of) at least one type of MXene platelets dispersed in a solvent; and (b) removing at least a portion of solvent so as to provide a coated film of at least one layer of MXene platelets oriented to be essentially coplanar with the substrate surface, said coated film being electrically conductive and exhibiting:

(i) a resistivity in a range of from about 0.01 to about 1000 micro-ohm-meters;

(ii) an ability to transmit at least about 50%, at least about 55%, at least about 60%, at least about 65%, at least about 70%, at least about 75%, at least about 80%, at least about 85%, at least about 90%, or at least about 95% of incident light of at least one wavelength in a range of from about 300 nm to about 2000 nm;

(iii) a ratio of DC conductivity, measured in Siemens/meter, to light absorbance, (including visible light absorbance), measured as a decadic absorbance per meter, of at least 0.1 Siemens measured at at least one wavelength in the range of 300 to 2500 nm;

(iv) a value of the real dielectric permittivity of less than negative one for wavelengths greater than a threshold wavelength, for example, 500 nm; or (v) a combination of any two or more of (i), (ii), (iii), and (iv).

Any individual material may exhibit one, two, or more of these features. Again, the $M_{n+1}X_n(T_s)$ compositions are more fully described elsewhere, but may be defined here as comprising at least one layer (preferably a plurality of layers) each having a first and second surface, each layer comprising a substantially two-dimensional array of crystal cells; each crystal cell having an empirical formula of $M_{n+1}X_n$, such that each X is positioned within an octahedral array of M, wherein M is at least one Group 3, 4, 5, 6, or 7 metal (corresponding to Group IIIB, IVB, VB, VIB, or VIIB metal), wherein each X is C, N, or a combination thereof and n=1, 2, or 3; wherein at least one of said surfaces of the layers has surface terminations, $T_s$, independently comprising alkoxide, alkyl, carboxylate, halide, In certain sub-embodiments, the coated film, whether prepared by spincoating or otherwise, may independently exhibit a surface resistivity in a range bounded at the lower end by a value of about 0.01, 0.1, 1, 5, 10, 50, 100, 250, or 500 micro-ohm-meters and at the upper end by a value of about 1000, 500, 100, 50, 25, 10, or 5 micro-ohm-meters, for example in a range of from about 1 to about 10 micro-ohm-meters. Alternatively, the surface resistivity of the coatings may be described in terms of being in a range of from about 0.01 micro-ohm-meters to about 0.1 micro-ohm-meters, from about 0.1 micro-ohm-meters to about 1 micro-ohm-meters, from about 1 micro-ohm-meters to about 10 micro-ohm-meters, from about 10 micro-ohm-meters to about 100 micro-ohm-meters, from about 100 micro-ohm-meters to about 1000 micro-ohm-meters, from about 1000 micro-ohm-meters to about 10,000 micro-ohm-meters, or any combination of two or more of these ranges.

In certain sub-embodiments, the coated film, whether prepared by spincoating or otherwise, may independently exhibit the described light transmittance of at least one wavelength in a range of from about 300 nm to about 400 nm, from about 400 nm to about 500 nm, from about 500 nm to about 600 nm, from about 600 nm to about 700 nm, from about 700 nm to about 800 nm, from about 800 nm to about 900 nm, from about 900 nm to about 1000 nm, from about 1000 nm to about 1200 nm, from about 1200 nm to about 1400 nm, from about 1400 nm to about 1600 nm, from about 1600 nm to about 1800 nm, from about 1800 nm to about 2000 nm, from about 2000 nm to about 2500 nm, or any combination of two or more of these ranges, for example from about 300 nm to about 800 nm.

Figure 9A:
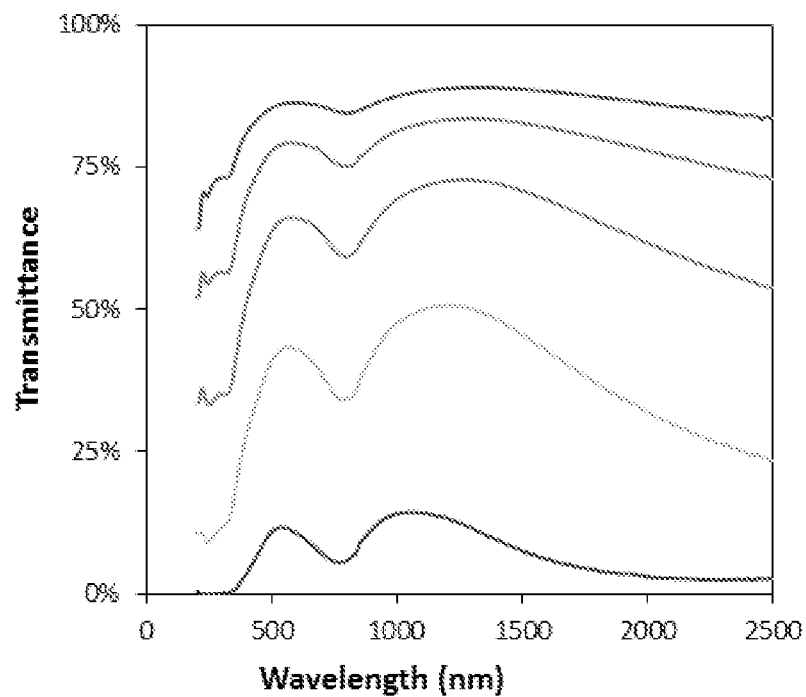
FIGS. 9A and 9B show some of the optical and electrical characteristics of exemplary spincoated MXene films.
Figure 9B:
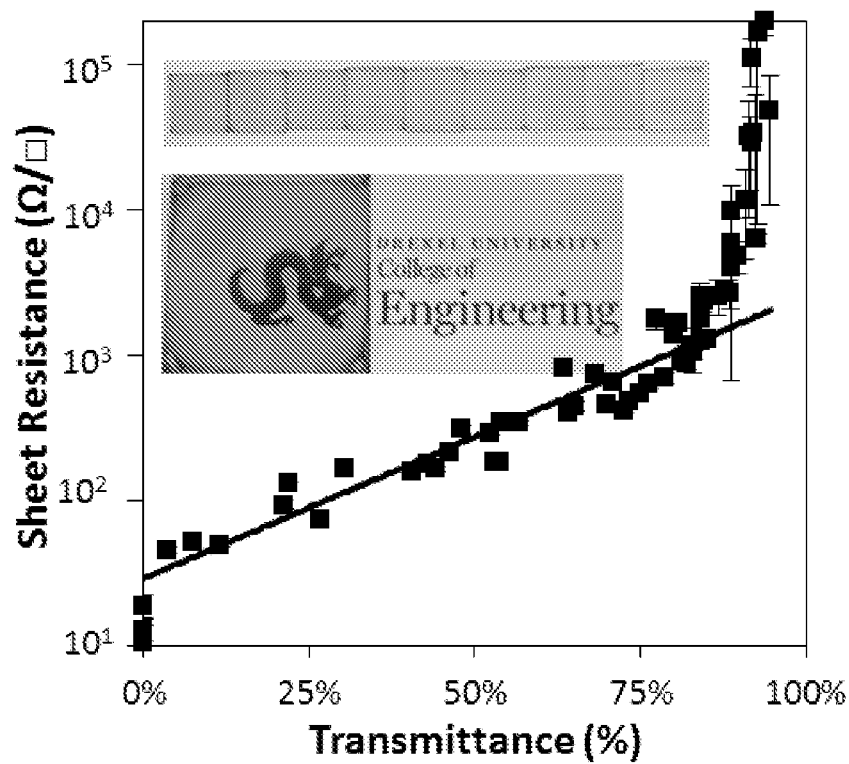

While not always the case, it has been observed that sheet resistivities tend to increase with increasing transparency, as shown in FIG. 9B. In some embodiments, this relationship may be described in terms of a ratio of DC conductivity, measured in Siemens/meter, to light absorbance (including visible light absorbance), measured as a decadic absorbance per meter, of at least 0.1 and up to about 300 Siemens measured at at least one wavelength in any one of the ranges of light listed above.

In some embodiments, the coated MXene films, whether prepared by spincoating or otherwise, can exhibit surface conductivities in a range of from about 100 to 500 S/cm, from 500 to 1000 S/cm, from 1000 to 2000 S/cm, from 2000 to 3000 S/cm, from 3000 to 4000 S/cm, from 4000 to 5000 S/cm, from 5000 to 6000 S/cm, from 6000 to 7000 S/cm, from 7000 to 8000 S/cm, or any combination of two or more of these ranges. Such conductivities may be seen on flat or flexed substrates.

Figure 12A:
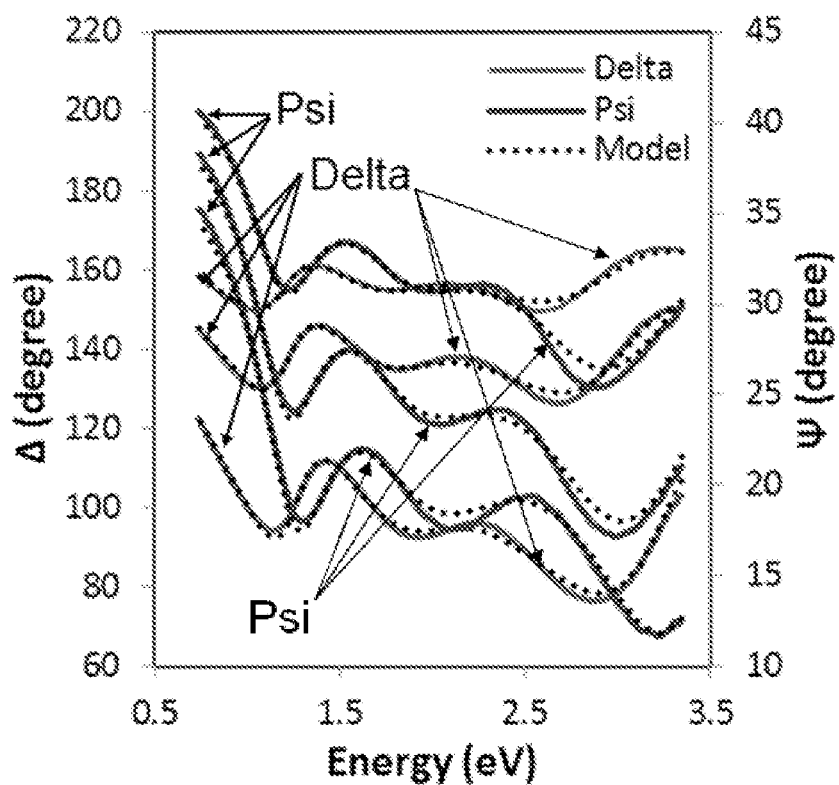
FIGS. 12A and 12B show data for spectroscopic ellipsometry of exemplary spincoated MXene films.
Figure 12B:
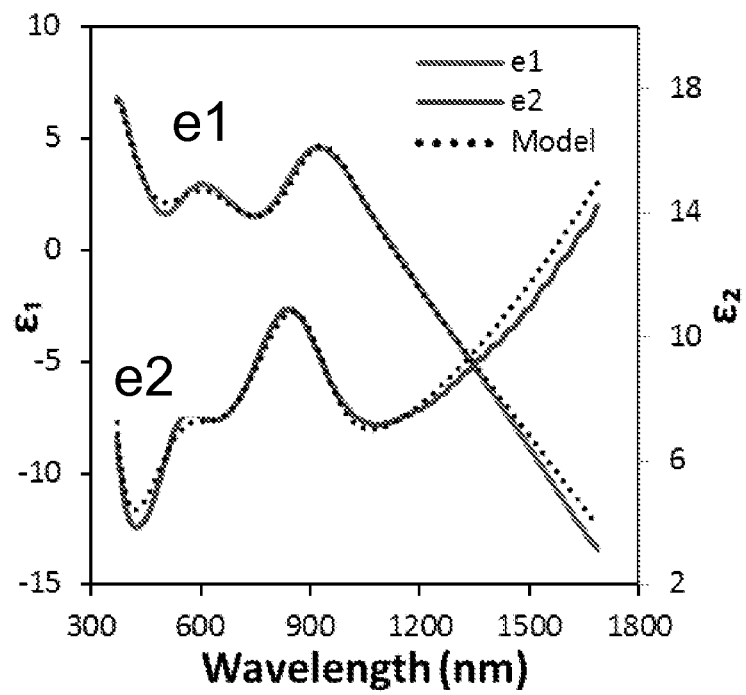

The coatings exhibit complex dielectric permittivities having real and imaginary parts (see FIG. 12B). As normally found for such complex permittivities, those of the present coatings are a complicated function of frequency, ω, since it is a superimposed description of dispersion phenomena occurring at multiple frequencies. Generally, at a given frequency, a negative real permittivity leads to reflection of incident light. In certain embodiments of the present invention, the real part of the complex permittivities exhibited by the coatings have values of less than negative one for wavelengths greater than a threshold wavelength, for example, 1130 nm. This is a requirement for plasmonic applications as it indicates a coupling of the free electrons (the electron plasma) of the material with an incident light field.

Typically, the dispersions are prepared in aqueous or organic solvents. In addition to the presence of the MXene materials, aqueous dispersions may also contain processing aids, such as surfactants, or ionic materials, for example lithium salt or other intercalating or intercalatable materials.

If organic solvents are used, polar solvents are especially useful, including alcohols, amides, amines, or sulfoxides, for example conmprising ethanol, isopropanol, dimethylacetamide, dimethylformamide, pyridine, and/or dimethylsulfoxide.

It is convenient to apply the MXene dispersions by any number of industry recognized methods for depositing thin coatings on substrates, depending on the viscosity of the dispersion. This viscosity may depend on the concentration of MXene particles or sheets in the dispersion, as well as the presence and concentrations of other constituents. For example, at MXene concentrations of between 0.001 and 100 mg/mL, it is convenient to apply the MXenes to the substrate surface by spin coating. In some embodiments, these dispersions are applied dropwise onto the an optionally rotating substrate surface, during or after which the substrate surface is made to rotate at a rate in a range of from about 300 rpm (rotations per minute) to about 5000 rpm. Rotational speed depends on a number of parameters, including viscosity of dispersion, volatility of the solvent, and substrate temperature as are understood by those skilled in the art.

Other embodiments provide that the MXene dispersions are areally applied to the substrate surface (i.e., over an extended area of the substrate), for example by brushing, dipcoating, spray coating, or doctor blading. These films may be allowed to settle (self-level) as stationary films, but in other embodiments, these brushed, dipcoated, or doctor bladed films may be also subjected to rotating the substrate surface at a rate in a range of from about 300 rpm to about 5000 rpm. Depending on the character of the dispersions, this may be used to level or thin the coatings, or both.

Once applied, at least a portion of the solvent is removed or lost by evaporation. The conditions for this step obviously depend on the nature of the solvent, the spinning rate and temperature of the dispersion and substrate, but typically convenient temperatures include those in a range of from about 10° C. to about 300° C., though processing these coatings is not limited to these temperatures.

Additional embodiments provide that multiple coatings may be applied, that that the resulting coated film comprises an overlapping array of two or more overlapping layers of MXene platelets oriented to be essentially coplanar with the substrate surface.

Similarly, the methods are versatile with respect to substrates. Rigid or flexible substrates may be used. Substrate surfaces may be organic, inorganic, or metallic, and comprise metals (Ag, Au, Cu, Pd, Pt) or metalloids; conductive or non-conductive metal oxides (e.g., $SiO_2$, ITO), nitrides, or carbides; semi-conductors (e.g., Si, GaAs, InP); glasses, including silica or boron-based glasses; liquid crystalline materials; or organic polymers. Exemplary substrates include metallized substrates; oxidizes silicon wafers; transparent conducting oxides such as indium tin oxide, fluorine doped tin oxide, aluminum-doped zinc-oxide (AZO), indium-doped cadmium-oxide, or aluminum, gallium or indiumdoped zinc oxide (AZO, GZO or IZO); photoresists or other organic polymers. These MXene coatings may be applied to flexible substrates as well, including organic polymer materials. Exemplary organic polymers include those comprising polyetherimide, polyetherketone, polyetheretherketone, polyamide; exemplary liquid crystal materials include, for example, poly(3,4-ethylenedioxythiophene) [PEDOT] and its derivatives; organic materials can also be photosensitive photoresists Flat surface or surface-patterned substrates can be used. For example, the substrate surface may comprise recesses, such as channels or vias/holes, or protrusions, such as pillars, posts, or walls, for example forming lines in any channels or between walls. The MXene coatings may also be applied to surfaces having patterned metallic conductors or nanoparticles, for example nanotubes or nanowires, including carbon nanotubes or nanowires. Additionally, by combining these techniques, it is possible to develop patterned MXene layers by applying a MXene coating to a photoresist layer, either a positive or negative photoresist, photopolymerize the photoresist layer, and develop the photopolymerized photoresist layer. During the developing stage, the portion of the MXene coating adhered to the removable portion of the developed photoresist is removed. Alternatively, or additionally, the MXene coating may be applied first, followed by application, processing, and development of a photoresist layer. By selectively converting the exposed portion of the MXene layer to an oxide using nitric acid, a MXene pattern may be developed. The exposed MXene is transformed into titanium dioxide by nitric acid, while the masked portion retains its conductivity (See FIG. 15). Still further, it is possible to apply patterned conductors or functional elements to these patterned MXene coatings, using conventional methods, such as sputtering, e-beam lithography, etc. In short, these MXene materials may be used in conjunction with any appropriate series of processing steps associated with thick or thin film processing to produce any of the structures or devices described herein (including, e.g., plasmonic nanostructures).

MXene Materials

As described elsewhere within this disclosure, the $M_{n+1}X_n(T_s)$ materials used in these methods and compositions have at least one layer, and sometimes a plurality of layers, each layer having a first and second surface, each layer comprising a substantially two-dimensional array of crystal cells; each crystal cell having an empirical formula of $M_{n+1}X_n$, such that each X is positioned within an octahedral array of M, wherein M is at least one Group 3, 4, 5, 6, or 7 metal (corresponding to Group IIIB, IVB, VB, VIB or VIIB metal), wherein each X is C, N, or a combination thereof and n=1, 2, or 3; wherein at least one of said surfaces of the layers has surface terminations, $T_s$, comprising alkoxide, alkyl, carboxylate, halide, hydroxide, hydride, oxide, suboxide, nitride, sub-nitride, sulfide, sulfonate, thiol, or a combination thereof.

Metals of Group 3, 4, 5, 6, or 7 (corresponding to Group IIIB, IVB, VB, VIB, or VIIB), either alone or in combination, said members including Sc, Y, Lu, Ti, Zr, Hf, V, Nb, Ta, Cr, Mo, and W. For the purposes of this disclosure, the terms "M" or "M atoms," "M elements," or "M metals" may also include Mn.

In some embodiments, the M is at least one Group 4, 5, or 6 metal or Mn. In preferred embodiments, M is one or more of Hf, Cr, Mn, Mo, Nb, Sc, Ta, Ti, V, W, or Zr, or a combination thereof. In other preferred embodiments, the transition metal is one or more of Ti, Zr, V, Cr, Mo, Nb, Ta, or a combination thereof. In even more preferred embodiments, the transition metal is Ti, Ta, Mo, Nb, V, Cr, or a combination thereof.

In certain specific embodiments, $M_{n+1}X_n$ comprises $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$, $Ti_3C_2$, $Ti_3N_2$, $V_3C_2$, $Ta_3C_2$, $Ta_3N_2$, $Mo_3C_2$, $(Cr_{2/3} Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

Preferred precursor MAX phase materials include those wherein M is at least one of Hf, Cr, Mn, Mo, Nb, Ta, Ti, V, W, or Zr. Other preferred embodiments include those where the A in the MAX phase material is at least one of Al, As, Ga, Ge, In, P, Pb, S, or Sn.

In more specific embodiments, the $M_{n+1}X_n(T_s)$ crystal cells have an empirical formula $Ti_3C_2$ or $Ti_2C$ and at least one of said surfaces of each layer is coated with surface terminations, $T_s$, comprising alkoxide, fluoride, hydroxide, oxide, sub-oxide, sulfonate, or a combination thereof.

The range of compositions available can be seen as extending even further when one considers that each M-atom position within the overall $M_{n+1}X_n$ matrix can be represented by more than one element. That is, one or more type of M-atom can occupy each M-position within the respective matrices. In certain exemplary non-limiting examples, these can be $(M^A_xM^B_y)_2C$ or $(M^A_xM^B_y)_2N$, $(M^A_xM^B_y)_3C_2$ or $(M^A_xM^B_y)_3N_2$, or $(M^A_xM^B_y)_4C_3$ or $(M^A_xM^B_y)_4N_3$, where $M^A$ and $M^B$ are independently members of the same group, and x+y=1. For example, in but one non-limiting example, such a composition can be $(V_{1/2}Cr_{1/2})_3C_2$. In the same way, one or more type of X-atom can occupy each X-position within the matrices, for example solid solutions of the formulae $M_{n+1}(C_xN_y)_n$, or $(M^A_xM^B_y)_{n+1}(C_xN_y)_n$.

In more specific embodiments, the MXenes may comprise compositions having at least two Group 4, 5, 6, or 7 metals, and the $M_{n+1}X_n(T_s)$ composition is represented by a formula $M'_2M''_mX_{m+1}(T_s)$, where m=1 or 2 (where m=n−1, in the context of the general MXene formula. Typically, these are carbides (i.e., X is carbon). Such compositions are described in U.S. Patent Application No. 62/149,890, this reference being incorporated herein by reference for all purposes. In these double transition metal carbides, M' may be Ti, V, Cr, or Mo. In these ordered double transition metal carbides, M" may be Ti, V, Nb, or Ta, provided that M' is different than M". These carbides may be ordered or disordered. Individual embodiments of the ordered double transition metal carbides include those compositions where $M'_2M''_mX_{m+1}$, is independently $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof. In some other embodiments, $M'_2M''_mX_{m+1}$, is independently $Mo_2TiC_2$, $Mo_2VC_2$, $Mo_2TaC_2$, $Mo_2NbC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof. In other embodiments, $M'_2M''_mX_{m+1}$, is independently $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, $V_2Ti_2C_3$, or a combination thereof. In still other embodiments, $M'_2M''_mX_{m+1}$, is independently $Nb_2VC_2$, $Ta_2TiC_2$, $Ta_2VC_2$, $Nb_2TiC_2$ or a combination thereof.

These MXene materials, described above as either $M_{n+1}X_n(T_s)$ or $M'_2M''_mX_{m+1}$, may be prepared by selectively removing an A group element from a precursor MAX-phase material. Depending on the specific MAX being considered, these A group elements may be independently defined as including Al, As, Cd, Ga, Ge, P, Pb, In, S, Si, Sn, or Tl. Some of these A-group elements may be removed in aqueous media, for example, by a process comprising a treatment with a fluorine-containing acid. For example, Al, As, Ga, Ge, In, P, Pb, S, or Sn may be removed in this way, although Al is especially amenable to such extractions. Aqueous hydrofluoric acid is particularly suitable for this purpose, whether used as provided, or generated in situ by other conventional methods. Such methods include the use of any one or more of the following:

(a) aqueous ammonium hydrogen fluoride ($NH_4F.HF$);

(b) an alkali metal bifluoride salt (i.e., $QHF_2$, where Q is Li, Na, or K), or a combination thereof; or (c) at least one fluoride salt, such as an alkali metal, alkaline earth metal, or ammonium fluoride salt (e.g., LiF, NaF, KF, CsF, $CaF_2$, tetraalkyl ammonium fluoride (e.g., tetrabutyl ammonium fluoride)) in the presence of at least one mineral acid that is stronger than HF (i.e., has a higher Ka value) and can react with fluorides to form HF in situ (such as HCl, HBr, HI, $H_3PO_4$, $HNO_3$, oxalic acid, or $H_2SO_4$); or (d) a combination of two or more of (a)-(c).

In specific embodiments, the fluorine-containing acid is derived from lithium fluoride and a strong aqueous mineral acid, such as HCl, $HNO_3$, or $H_2SO_4$, preferably HCl.

It also appears that the use of aqueous HF in the presence of one or more alkali halides, such as LiCl, provides advantages over using HF alone, or by reacting LiF with aqueous HCl. The use of LiF with aqueous HCl avoids the handling issues associated with the use of aqueous HF and provides higher yields of single-layer flakes, in some cases it may be difficult to remove LiF impurities and the removal of the A-element (e.g., Al) is slower. The use of LiCl with aqueous HF provides more crystalline MXene phases, with better control of the basal spacing (c parameter) and it is easier to vary the procedures especially for those involving ion intercalation.

Perhaps at least as importantly, the use of mixtures of alkali metal or alkaline earth metal salts (typically chlorides or bromides) in combination with HF during the preparation of the MXene materials (e.g., using LiCl, NaCl, KCl, KBr, RbCl, $MgCl_2$, $CaCl_2$ with aqueous HF) provides new and unexpected opportunities for the intercalation of these metal cations (hydrated or otherwise) into the MXene matrices. These opportunities are more fully described in Example 8. It should be appreciated that, while the studies described in Example 8 focused on $Ti_3C_2$ materials, and all of the descriptions are considered specific embodiments of this invention, the invention is not limited by these examples, and additional embodiments provide for the intercalation of these metal ions in the full array of MXene materials described herein.

The conditions of the disclosed methods provide solid bodies exhibiting volumetric capacitances in a range of about 500 F/cm³ to about 1500 F/cm³, or in a range of from about 100 F/g to about 500 F/g, when tested as a scan rate of 2 mV/s.

These methods may also be used to prepare MXene composition comprising platelets having at least one mean lateral dimension in a range of from about 0.1 micron to about 50 micrometers, which are especially attractive for the coatings described herein.

Compositions and Devices

While described thus far in terms of methods, it should be appreciated that the present disclosure embraces those embodiments comprising the solid bodies or films prepared by any one of the disclosed methods. These embodiments includes those solid bodies so prepared, further comprising intercalated lithium or other ions (such as alkali or alkaline earth or transition metal ions). These solid bodies may exhibit any of the electrical properties described above.

Additional embodiments considered within the scope of this disclosure include electrodes or other electrochemical devices, including those listed below, and especially batteries and supercapacitors, comprising any of these solid bodies.

Additional embodiments also include the MXene coatings as described herein, as well as materials and electrical devices incorporating these coatings. These materials may contain any of the intercalated derivatives previously described for these materials, including for example intercalated lithium ions, lithium atoms, or a combination of lithium ions and lithium atoms. Such compositions are described in co-pending U.S. patent application Ser. No. 14/094,966, which is incorporated by reference herein at least for this teaching.

The coatings may be incorporated or used in a wide variety of electrical devices and each of these are considered within the scope of this invention. Such independent exemplary devices include, but are not limited to RFID tags, windows with switchable opacity, light emitting diodes (including organic light emitting diodes), touchscreens, photovoltaics, photodetectors, liquid crystal displays, touchscreens, or photovoltaic devices. Liquid-crystal displays (LCDs) may be considered in terms of a flat panel displays, electronic visual displays, and/or video displays that use the light modulating properties of liquid crystals. Light emitting diodes (including organic light emitting diodes) may be used to create digital displays in devices such as television screens, computer monitors, portable systems such as mobile phones, handheld game consoles, and PDAs.

Other independent examples include plasmonic devices such as plasmonic sensor arrays, optical-to-electrical signal transducers, a surface-plasmon polariton transmitters, and infrared-reflecting windows. In other embodiments, the inventive coatings are used to prepare metamaterials such as cloaking materials, transformational optic components, and superlenses, and each are considered within the present scope.

ADDITIONAL EMBODIMENTS

The following listing of embodiments in intended to complement, rather than displace or supersede, any of the previous descriptions.

Embodiment 1

A method comprising: (a) adjusting the water content of a $M_{n+1}X_n(T_s)$ composition to form a compressible paste wherein the ratio of water to $M_{n+1}X_n(T_s)$ MXene is in a range of from about 0.3 to about 0.65 by mass; and (b) compressing an amount of the $M_{n+1}X_n(T_s)$ composition with a pressure of at least 5 psig to form a solid body; said $M_{n+1}X_n(T_s)$ composition comprising at least one layer having a first and second surface, each layer comprising a substantially two-dimensional array of crystal cells; each crystal cell having an empirical formula of $M_{n+1}X_n$, such that each X is positioned within an octahedral array of M, wherein M is at least one Group 3 to 7 (corresponding to Group IIIB, IVB, VB, VIB, or VIIB) metal, wherein each X is C, N, or a combination thereof and n=1, 2, or 3; wherein at least one of said surfaces of the layers has surface terminations comprising alkoxide, alkyl, carboxylate, halide, hydroxide, hydride, oxide, sub-oxide, nitride, sub-nitride, sulfide, sulfonate, thiol, or a combination thereof; wherein said body is electrically conductive and exhibits (i) a resistivity in a range of from about 1 to about 10,000 micro-ohm-meters; (ii) volumetric capacity of at least 500 F/cm$^3$ when tested at a scan rate of 20 mV/s or at least 550, 600, 650, 700, 750, or 800 F/cm$^3$ when tested as a slower scan rate; or (iii) both (i) and (ii).

Embodiment 2

The method of Embodiment 1, wherein the compressing is done at a pressure in a range of from about 5 psig to about 500 psig.

Embodiment 3

The method of Embodiment 1 or 2, wherein the compression is accomplished at least in part by rolling or compression molding or otherwise flattening or shaping, e.g., using heated or unheated platen or platen-like device.

Embodiment 4

The method of any one of Embodiments 1 to 3, wherein the compressing is accomplished at least in part by rolling the $M_{n+1}X_n(T_s)$ composition between at least two roller bars.

Embodiment 5

The method of any one of Embodiments 1 to 4, wherein the compressing of the $M_{n+1}X_n(T_s)$ composition is accompanied by the removal of water.

Embodiment 6

The method of any one of Embodiments 1 to 5, wherein the solid body is electrically conductive.

Embodiment 7

The method of any one of Embodiments 1 to 6, wherein the solid body has surface electrical resistivity in a range of from about 1 micro-ohm-meters to about 10,000 micro-ohm-meters

Embodiment 8

The method of any one of Embodiments 1 to 7, wherein the solid body is compressed to a thickness in a range of from about 0.1 micron to about 100 microns.

Embodiment 9

The method of any one of claims 1 to 8, wherein the $M_{n+1}X_n(T_s)$ composition comprises a plurality of $M_{n+1}X_n(T_s)$ flakes having at least one mean lateral dimension in a range of from about 0.5 micron to about 5 microns.

Embodiment 10

The method of any one of Embodiments 1 to 9, wherein M is at least one Group 4, 5, or 6 metal or Mn.

Embodiment 11

The method of any one of Embodiments 1 to 10, wherein M is at least one of Hf, Cr, Mn, Mo, Nb, Sc, Ta, Ti, V, W, or Zr.

Embodiment 12

The method of any one of Embodiments 1 to 11, wherein M is Ti, and n is 1 or 2.

Embodiment 13

The composition of any one of Embodiments 1 to 12, wherein $M_{n+1}X_n$ comprises $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$ $Ti_3C_2$, $Ti_3N_2$, $V_3C_2$, $Ta_3C_2$, $Ta_3N_2$, $Mo_3C_2$, $(Cr_{2/3} Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

Embodiment 14

The method of any one of Embodiments 1 to 13, the crystal cells having an empirical formula $Ti_3C_2$ or $Ti_2C$ and wherein at least one of said surfaces of each layer is coated with surface terminations, $T_s$, comprising alkoxide, fluoride, hydroxide, oxide, sub-oxide, sulfonate, or a combination thereof.

Embodiment 15

The method of any one of Embodiments 1 to 14, wherein the $M_{n+1}X_n(T_s)$ composition is formed by removing at least 90%, 95%, 99%, or 99.9% of the A atoms from a MAX-phase composition having an empirical formula of $M_{n+1}AX_n$.
wherein M is at least one Group 3, 4, 5, 6, or 7 metal,
wherein A is an A-group (Group 13 or 14) element;
each X is C, N, or a combination thereof; and
n=1, 2, or 3.

Embodiment 16

The method of Embodiment 15, wherein the removal of the A atoms is done in aqueous media.

Embodiment 17

The method of Embodiments 15 or 16, wherein M is at least one of Hf, Cr, Mn, Mo, Nb, Sc, Ta, Ti, V, W, or Zr.

Embodiment 18

The method of any one of Embodiments 15 to 17, wherein A is at least one of Al, As, Ga, Ge, In, P, Pb, S, or Sn.

Embodiment 19

The method of any one of Embodiments 15 to 18, wherein the A atoms are removed by a process comprising a treatment with a fluorine-containing acid.

Embodiment 20

The method of Embodiment 19, wherein the fluorine-containing acid is aqueous hydrofluoric acid.

Embodiment 21

The method of Embodiment 19 wherein the fluorine-containing acid comprises:
(a) aqueous ammonium hydrogen fluoride ($NH_4F \cdot HF$);
(b) an alkali metal bifluoride salt (i.e., $QHF_2$, where Q is Li, Na, or K); or
(c) a fluoride salt, for example an alkali metal, alkaline earth metal, or ammonium fluoride salt (such as LiF, NaF, KF, CsF, $CaF_2$, tetraalkyl ammonium fluoride (e.g., tetrabutyl ammonium fluoride)) in the presence of at least one mineral acid stronger than HF (such as HCl, HBr, HI, $H_3PO_4$, $HNO_3$, oxalic acid, or $H_2SO_4$).

Embodiment 22

The method of Embodiment 21, wherein the fluorine-containing acid is derived from lithium fluoride and an aqueous mineral acid, such as HCl, HBr, HI, $H_3PO_4$, $HNO_3$, oxalic acid, or $H_2SO_4$, preferably HCl.

Embodiment 23

The method of any one of Embodiments 1 to 22, said method being capable of providing a solid body exhibiting a volumetric capacitance in a range of about 500 $F/cm^3$ to about 1500 $F/cm^3$, or in a range of from about 100 F/g to about 500 F/g, when tested as a scan rate of 2 mV/s.

Embodiment 24

A solid body prepared by any one of Embodiments 1 to 23.

Embodiment 25

A solid body prepared by anyone of Embodiments 1 to 23, further comprising intercalated lithium or other metal ions (such as alkali or alkaline earth or transition metal ions).

Embodiment 26

The solid body of Embodiment 24 or 25, wherein the solid body exhibiting a volumetric capacitance of from about 500 $F/cm^3$ to about 2500 $F/cm^3$, or in a range of from about 200 F/g to about 500 F/g, when tested as a scan rate of 2 mV/s.

Embodiment 27

A solid body comprising or consisting essentially of a $M_{n+1}X_n(T_s)$ material exhibiting a volumetric capacity greater than about 500 $F/cm^3$, up to about 2500 $F/cm^3$; said $M_{n+1}X_n(T_s)$ material comprising a composition comprising plurality of layers, each layer having a first and second surface, each layer comprising
a substantially two-dimensional array of crystal cells.
each crystal cell having an empirical formula of $M_{n+1}X_n$, such that each X is positioned within an octahedral array of M,
wherein M is at least one 3, 4, 5, 6, or 7 metal,
wherein each X is C, N, or a combination thereof and n=1, 2, or 3;
wherein at least one of said surfaces of the layers has surface terminations comprising alkyl, alkoxide, carboxylate, halide, hydroxide, hydride, oxide, sub-oxide, nitride, sub-nitride, sulfide, sulfonate, thiol, or a combination thereof.

Embodiment 28

The solid body of Embodiment 27, the $M_{n+1}X_n(T_s)$ MXene further comprising intercalated lithium ions, lithium atoms, or a combination of lithium ions and lithium atoms.

Embodiment 29

An electrode comprising a solid body of any one of Embodiments 24 to 28.

Embodiment 30

An electrochemical device comprising a solid body of any one of Embodiments 24 to 28 or an electrode of Embodiment 29.

Embodiment 31

A method comprising,
(a) applying a MXene dispersion onto a substrate surface, said MXene dispersion comprising (or consisting essentially of) at least one type of MXene platelets dispersed in a solvent; and
(b) removing at least a portion of solvent so as to provide a coated film of at least one layer of MXene platelets oriented to be essentially coplanar with the substrate surface,
said MXene platelets comprising (or consisting essentially of) a $M_{n+1}X_n(T_s)$ composition having at least one layer, each layer having a first and second surface, each layer comprising
a substantially two-dimensional array of crystal cells.
each crystal cell having an empirical formula of $M_{n+1}X_n$, such that each X is positioned within an octahedral array of M,
wherein M is at least one Group 3, 4, 5, 6, or 7,
wherein each X is C, N, or a combination thereof and n=1, 2, or 3;
wherein at least one of said surfaces of the layers has surface terminations, $T_s$, independently comprising alkoxide, alkyl, carboxylate, halide, hydroxide, hydride, oxide, sub-oxide, nitride, sub-nitride, sulfide, sulfonate, thiol, or a combination thereof;
said coated film being electrically conductive and exhibiting:
(i) a resistivity in a range of from about 0.01 to about 1000 micro-ohm-meters, preferably 1-10 micro-ohm-meters;
(ii) an ability to transmit at least about 50%, at least about 55%, at least about 60%, at least about 65%, at least about 70%, at least about 75%, at least about 8%, at least about 85%, at least about 90%, or at least about 95% of incident light of at least one wavelength in a range of from about 300 nm to about 2000 nm, about 300 nm to about 800 nm, or about 500 nm to about 2500 nm;
(iii) a ratio of DC conductivity, measured in Siemens/meter, to light absorbance, (including visible light absorbance), measured as a decadic absorbance per meter, of at least 0.1 Siemens measured at at least one wavelength in the range of 300 to 2500 nm;
(iv) a value of the real dielectric permittivity less than zero or less than negative one for wavelengths greater than a threshold wavelength, for example, 500 nm; or
(v) a combination of any two or more of (i), (ii), (iii), and (iv).

Embodiment 32

The method of Embodiment 31, wherein the MXene dispersion is applied to the substrate surface by spin coating.

Embodiment 33

The method of Embodiment 31 or 32 wherein the MXene dispersion is applied dropwise onto the an optionally rotating substrate surface, during or after which the substrate surface is made to rotate at a rate in a range of from about 300 rpm (rotations per minute) to about 5000 rpm.

Embodiment 34

The method of Embodiment 31, wherein the MXene dispersion is applied to the substrate surface by brushing, dipcoating, or doctor blading.

Embodiment 35

The method of Embodiment 31 or 34, wherein the MXene dispersion is applied to the substrate surface by brushing or dipcoating, followed by rotating the substrate surface at a rate in a range of from about 300 rpm to about 5000 rpm.

Embodiment 36

The method of any one of Embodiments 31 to 35, wherein the MXene dispersion is an aqueous dispersion optionally comprising one or more surfactants.

Embodiment 37

The method of any one of Embodiments 31 to 36, wherein the MXene dispersion comprising an organic solvent, preferably a polar solvent such as an alcohol solvent. Some sub-embodiments include those where the polar solvent comprises ethanol, isopropanol, dimethylformaide, pyridine, dimethylsulfoxide, or a mixture thereof.

Embodiment 38

The method of any one of Embodiments 31 to 37, wherein the substrate is rigid.

Embodiment 39

The method of any one of Embodiments 31 to 37, wherein the substrate is flexible.

Embodiment 40

The method of any one of Embodiments 31 to 39, wherein the coating is areal.

Embodiment 41

The method of any one of Embodiments 31 to 39, wherein the coating is patterned on the substrate.

Embodiment 42

The method of any one of Embodiments 31 to 41, wherein at least a portion of solvent is removed by evaporation.

Embodiment 43

The method of any one of Embodiments 31 to 43, the coated film comprising an overlapping array of two or more overlapping layers of MXene platelets oriented to be essentially coplanar with the substrate surface.

Embodiment 44

The method of any one of Embodiments 31 to 43, wherein the solid body has surface electrical resistivity in a range of from about 1 micro-ohm-meters to about 10 micro-ohm-meters, from about 10 micro-ohm-meters to about 100 micro-ohm-meters, from about 100 micro-ohm-meters to about 1000 micro-ohm-meters, from about 1000 micro-ohm-meters to about 10,000 micro-ohm-meters, or any combination of two or more of these ranges.

Embodiment 45

The method of any one of Embodiments 31 to 44, wherein the $M_{n+1}X_n(T_s)$ composition comprises a plurality of $M_{n+1}X_n(T_s)$ platelets having at least one mean lateral dimension in a range of from about 0.1 micron to about 50 microns.

Embodiment 46

The method of any one of Embodiments 31 to 45, wherein M is at least one Group 4, 5, 6, or 7 metal.

Embodiment 47

The method of any one of Embodiments 31 to 46, wherein M is at least one of Hf, Cr, Mn, Mo, Nb, Sc, Ta, Ti, V, W, or Zr.

Embodiment 48

The method of any one of Embodiments 31 to 47, wherein M is Ti, and n is 1 or 2.

Embodiment 49

The method of any one of Embodiments 31 to 48, wherein $M_{n+1}X_n$ comprises $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$, $Ti_3C_2$, $Ti_3N_2$, $V_3C_2$, $Ta_3C_2$, $Ta_3N_2$, $Mo_3C_2$, $(Cr_{2/3}Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

Embodiment 50

The method of any one of Embodiments 31 to 47, wherein M comprises at least two Group 4, 5, 6, or 7 metals, and the $M_{n+1}X_n(T_s)$ composition is represented by a formula $M'_2M''_mX_{m+1}(T_s)$, where m=n-1.

Embodiment 51

The method of Embodiment 50, wherein M' comprises Ti, V, Cr, or Mo.

Embodiment 52

The method of Embodiment 49 or 50, wherein M" comprises Ti, V, Nb, or Ta, and M' is different than M".

Embodiment 53

The method of any one of Embodiments 49 to 52, wherein $M'_2M''X_{+i}$, comprises $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof.

Embodiment 54

The method of any one of Embodiments 49 to 52, wherein $M'_2M''X_{+i}$, comprises $Mo_2TiC_2$, $Mo_2VC_2$, $Mo_2TaC_2$, $Mo_2NbC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof.

Embodiment 55

The method of any one of Embodiments 49 to 52, wherein $M'_2M''_mX_{m+i}$, comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, $V_2Ti_2C_3$, or a combination thereof.

Embodiment 56

The method of any one of Embodiments 49 to 52, wherein $M'_2M''_mX_{m+1}$, comprises $Nb_2VC_2$, $Ta_2TiC_2$, $Ta_2VC_2$, $Nb_2TiC_2$ or a combination thereof.

Embodiment 57

The method of any one of Embodiments 49 to 56, wherein the $M'_2M''_mX_{m+1}$ is in a disordered state.

Embodiment 58

The method of any one of Embodiments 31 to 57, the crystal cells having an empirical formula $Ti_3C_2$ or $Ti_2C$ and wherein at least one of said surfaces of each layer is coated with surface terminations, $T_s$, comprising alkoxide, fluoride, hydroxide, oxide, sub-oxide, sulfonate, or a combination thereof.

Embodiment 59

The method of any one of Embodiments 31 to 58, wherein the $M_{n+1}X_n(T_s)$ or $M'_2M''_mX_{m+1}$ composition is formed by removing at least 90% the A atoms from a MAX-phase composition having an empirical formula of $M_{n+1}AX_n$ or $M'_2M''_mAX_{m+i}$, respectively;
wherein M is at least one Group 3, 4, 5, 6, or 7 metal,
wherein A is an A-group element;
each X is C, N, or a combination thereof; and
n=1, 2, or 3.

Embodiment 60

The method of Embodiment 59, wherein the removing the A atoms is done in aqueous media Embodiment 61

The method of Embodiment 59 or 60, wherein M is at least one of Hf, Cr, Mn, Mo, Nb, Sc, Ta, Ti, V, W, or Zr Embodiment 62

The method of any one of Embodiments 59 to 61, wherein A is at least one of Al, As, Ga, Ge, In, P, Pb, S, or Sn.

Embodiment 63

The method of any one of Embodiments 59 to 62, wherein the A atoms are removed by a process comprising a treatment with a fluorine-containing acid.

Embodiment 64

The method of Embodiment 63, wherein the fluorine-containing acid is aqueous hydrofluoric acid.

Embodiment 65

The method of Embodiments 63 wherein the fluorine-containing acid comprises or is derived from:
(a) aqueous ammonium hydrogen fluoride ($NH_4F.HF$);
(b) an alkali metal bifluoride salt (i.e., $QHF_2$, where Q is Li, Na, or K), or a combination thereof; or
(c) at least one fluoride salt, such as an alkali metal, alkaline earth metal, or ammonium fluoride salt (e.g., LiF, NaF, KF, CsF, CaF$_2$, tetraalkyl ammonium fluoride (e.g., tetrabutyl ammonium fluoride)) in the presence of at least one mineral acid that is stronger than HF (such as HCl, HNO$_3$, or H$_2$SO$_4$); or (d) a combination of two or more of (a)-(c).

Embodiment 66

The method of Embodiment 65, wherein the fluorine-containing acid is derived from lithium fluoride and an aqueous mineral acid that is stronger than HF, such as HCl, HNO$_3$, or H$_2$SO$_4$, preferably HCl.

Embodiment 67

A coating prepared by the method of any one of Embodiments 31 to 66.

Embodiment 68

A coating prepared by the method of any one of Embodiments 31 to 66, further comprising intercalated lithium ions, lithium atoms, sodium ions, sodium, or a combination thereof.

Embodiment 69

An electrical device containing the coating of Embodiment 67 or 68.

Embodiment 70

The electrical device of Embodiment 69 that is a liquid crystal display, a light emitting diode (including organic light emitting diodes), a touchscreen, or a photovoltaic device.

Embodiment 71

The electrical device of Embodiment 69 that is a plasmonic device such as a plasmonic sensor array, an optical-to-electrical signal transducer a surface-plasmon polariton transmitter, an infrared-reflecting window.

Embodiment 72

A metamaterial such as a cloaking material, transformational optic component, superlens comprising a coating prepared by the method of any one of Embodiments 31 to 66.

EXAMPLES

The following Examples are provided to illustrate some of the concepts described within this disclosure. While each Example is considered to provide specific individual embodiments of composition, methods of preparation and use, none of the Examples should be considered to limit the more general embodiments described herein.

Example 5: General Remarks

M$_{n+1}$X$_n$(T$_s$) MXenes are a relatively young class of 2D solids, produced by the selective etching of the A-group layers from the MAX phases, a >70 member family of layered, hexagonal early transition metal carbides and nitrides. To date, all M$_{n+1}$X$_n$(T$_s$) MXenes have been produced by etching MAX phases in concentrated hydrofluoric acid, HF, or ammonium bifluoride. M$_{n+1}$X$_n$(T$_s$) MXenes have already proven to be promising candidates for electrodes in Li-ion batteries and supercapacitors, exhibiting volumetric capacitances exceeding most previously reported materials. However, the path to electrode manufacturing required the handling of concentrated HF and a laborious multi-step procedure. Herein a safer route was sought by exploiting the reaction between common, inexpensive hydrochloric acid, HCl, and fluoride salts. Furthermore, given M$_{n+1}$X$_n$(T$_s$) MXenes' ability to preferentially intercalate cations (post-synthesis), a related question was whether etching and intercalation might be achieved in a single step, as was observed for etching of thin Ti$_3$AlC$_2$ films with ammonium bifluoride. Based on the change in M$_{n+1}$X$_n$(T$_s$) MXene properties upon intercalation and the compositional variability of fluoride salts, this could lead to a one-step procedure for the synthesis of many M$_{n+1}$X$_n$(T$_s$) MXenes, with tunable structures and properties.

The M$_{n+1}$X$_n$(T$_s$) MXenes reported in this study were prepared by dissolving LiF in 6 M HCl, followed by the slow addition of Ti$_3$AlC$_2$ powders and heating of the mixture at 40° C. for 45 h. After etching, the resulting sediments were washed to remove the reaction products and raise the pH (several cycles of water addition, centrifugation, and decanting). This method also provided a good route for the intercalating metal ions into the MXene frameworks (e.g., see Example 8).

Example 1. Materials and Methods—Clays

Example 1.1. Synthesis of Ti$_3$AlC$_2$

The MAX phase used as precursor for Ti$_3$C$_2$(T$_s$) synthesis herein, Ti$_3$AlC$_2$, was prepared by mixing commercial Ti$_2$AlC powders (Kanthal, Sweden) with TiC in a 1:1 molar ratio (after adjusting for the ~12 wt. % Ti$_3$AlC$_2$ already present in the commercial powder), followed by ball milling for 18 h. The mixture was then heated at 5° C./min, under flowing argon, Ar, in a tube furnace for 2 h at 1350° C. The resulting lightly sintered brick was ground with a TiN coated milling bit and sieved through a 400 mesh sieve producing powder with the particle size less than 38 µm.

Example 1.2. Synthesis of Ti$_3$C$_2$(T$_s$) MXene

Concentrated hydrochloric acid, HCl (Fisher, technical grade), was added to distilled water to prepare a 6 M solution (30 mL total). 1.98 g (5 molar equivalents) of LiF (Alfa Aesar, 98+%) was added to this solution. The mixture was stirred for 5 minutes with a magnetic Teflon stir bar to dissolve the salt.

Three grams of Ti$_3$AlC$_2$ powders were carefully added over the course of 10 minutes to avoid initial overheating of the solution as a result of the exothermic nature of the reactions. The reaction mixture was then held at 40° C. for 45 h, after which the mixture was washed through ~5 cycles of distilled water addition, centrifugation (3500 rpm×5 minutes for each cycle), and decanting, until the supernatant reached a pH of approximately 6. The final product, with a small amount of water, was filtered on cellulose nitrate (0.22 µm pore size). At this stage, the filtrate exhibited 'clay-like' properties and could be directly processed into films by rolling.

Example 1.3. Preparation of Ti$_3$C$_2$(T$_s$) 'Paper'

The Ti$_3$C$_2$(T$_s$) flakes were dispersed in distilled water (2 g Ti$_3$C$_2$(T$_s$) per 0.5 L water), deaerated with Ar, followed by sonication for 1 h. The mixture was then centrifuged for 1 h at 3500 rpm, and the supernatant, which was dark green in color, was collected. This dispersion was filtered using a membrane (3501 Coated PP, Celgard LLC, Charlotte, N.C.) to yield flexible, freestanding $Ti_3C_2(T_s)$ paper. The weight percentage of $Ti_3C_2(T_s)$ delaminated into stable suspension in this case was ≈45 wt %.

Example 1.4. $Ti_3C_2(T_s)$ Clay Electrodes

Preparation of the clay electrodes is depicted step-by-step in FIG. 4. The dried and crushed $Ti_3C_2(T_s)$ powder was hydrated to the consistency of a thick paste, roughly 2 parts powder to 1 part water (a)-(c), which turns it into a plastic, 'clay'-like state, that can be formed and molded. The 'clay' is then rolled using a roller mill with water-permeable Celgard sheets (d) on either side, resulting in the formation of a freestanding film (e), which was readily lifted off of the membrane upon drying (f).

Example 2. Electrical Measurements

Example 2.1. Activated Carbon (AC) Electrodes

The AC electrodes were prepared by mechanical processing of a pre-mixed slurry, containing ethanol (190 proof, Decon Laboratories, Inc.), YP-50 activated carbon powder, (Kuraray, Japan), and polytetrafluoroethylene (PTFE) binder (60 wt. % in H2O, Sigma Aldrich). The resulting AC electrodes' composition was 95 wt. % AC and 5 wt. % PTFE. They had thicknesses that varied between 100-150 nm; the mass densities per unit area were in the 10-25 mg/cm² range.

Example 2.2. Electrochemical Setup

All electrochemical measurements were performed in 3-electrode Swagelok cells, where $M_{n+1}X_n(T_s)$ MXene served as the working electrode, over-capacitive AC films were used as counter electrodes; Ag/AgCl in 1 M KCl was the reference electrode. Two layers of the Celgard membranes were used as separators. The electrolyte was 1 M $H_2SO_4$ (Alfa Aesar, ACS grade).

Example 2.3. Electrochemical Measurements

Cyclic voltammetry, CV, electrochemical impedance spectroscopy, EIS, and galvanostatic cycling were performed using a VMP3 potentiostat (Biologic, France).

Cyclic voltammetry was performed using scan rates that ranged from 1 to 100 mV/s. EIS was performed at OCP, with a 10 mV amplitude, and frequencies that ranged from 10 mHz to 200 kHz.

Galvanostatic cycling was performed at 1 and 10 A/g between the potential limits of −0.3 V to 0.25 V vs. Ag/AgCl. Capacitance data reported in the article were calculated from the slope of the discharge curve.

Example 3. Characterization of Structure and Properties

XRD patterns were recorded with a powder diffractometer (Rigaku SmartLab) using Cu Kα radiation (λ=1.54 Å) with 0.2° 2θ steps and 0.5 s dwelling time.

Scanning Electron Microscopy was performed on a SEM (Zeiss Supra 50VP, Carl Zeiss SMT AG, Oberkochen, Germany) equipped with an Energy-Dispersive Spectroscopy (EDS) (Oxford EDS, with INCA software). Most EDS scans were obtained at low magnification (100-200 X) at random points of powdered samples. Elemental standards were as follows: C: $CaCO_3$; Al: $Al_2O_3$; O: $SiO_2$; F: $MgF_2$; Nb: Nb metal. XPP matrix correction (Pouchou and Pichoir, 1988) was used for elemental quantitative analysis.

Transmission electron microscopy of the $Ti_3C_2(T_s)$ flakes was performed on a TEM (JEOL JEM-2100, Japan) using an accelerating voltage of 200 kV. The TEM samples were prepared by dropping two drops of diluted colloidal solution of $Ti_3C_2(T_s)$ flakes onto a copper grid and dried in air. The flake size and number of layers per flake distributions were obtained through statistical analysis of more than 300 $Ti_3C_2(T_s)$ flakes in the TEM images.

Resistivity measurements were performed with a 4-point probe (ResTest v1, Jandel Engineering Ltd., Bedfordshire, UK). Measured resistivity was automatically multiplied by the proper thickness correction factor given by the Jandel software.

Example 4. Additional Experiments

Effect of Synthetic Conditions: Experiments showed that the reaction conditions of 35° C. for 24 h rather than 40° C. for 45 h produced a material with persistent MAX peaks in XRD, and higher Al content by EDS, but that gave reliable high yields of delaminated flakes upon sonication. The $Ti_3AlC_2$ etched at higher temperatures showed lower Al content but did not always readily delaminate and disperse by sonication.

Detailed volumetric analysis: In order to quantify diffusion-limited contributions to capacitance, the relationship between where the current i(V) (at a given voltage, V) in mA and scan rate, υ, in V/s, was assume to be:

$$i(V) = k_1 \upsilon + k_2 \upsilon^{0.5},$$

where $k_1$ and $k_2$ are constants. For the CVs, at scan rates from 1 mV/s to 20 mV/s, current values were extracted, and $i/\upsilon^{0.5}$ vs. $\upsilon^{0.5}$ was plotted at each voltage and linear fitting was performed: $i(V)/\upsilon^{0.5} = k_1 \upsilon^{0.5} + k_2$. The slope k1, for each voltage, describes the contributions of the non-diffusion controlled processes to the overall process.

Figure 1B:
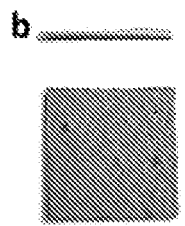
Figure 1C:
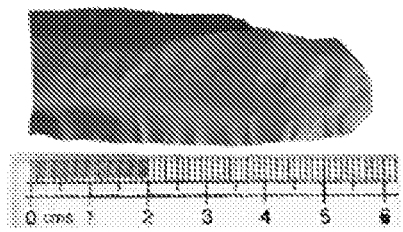
Figure 1D:
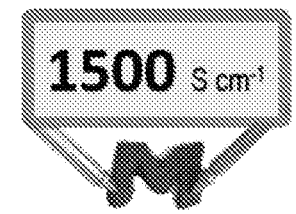

The resulting sediment formed a clay-like paste that could be rolled, when wet (FIG. 1A), between water-permeable membranes in a roller mill to produce flexible, free-standing films (FIG. 1C) in a matter of minutes comparable to those produced by the laborious technique of intercalation, delamination, and filtration in the past. A graphical depiction of the processing is provided in FIG. 4. Further, scaling was not limited to the size of the filtration apparatus; films of any dimensions could be readily produced. Additionally, when wet, the 'clay' could be molded and dried to yield various shapes that were highly conductive (FIG. 1D). Diluted, it could also be used as an ink to deposit (print) $M_{n+1}X_n(T_s)$ MXene on various substrates. Like clay, the material could be rehydrated, swelling in volume, and shrinking when dried (FIG. 1B).

Figure 5B:
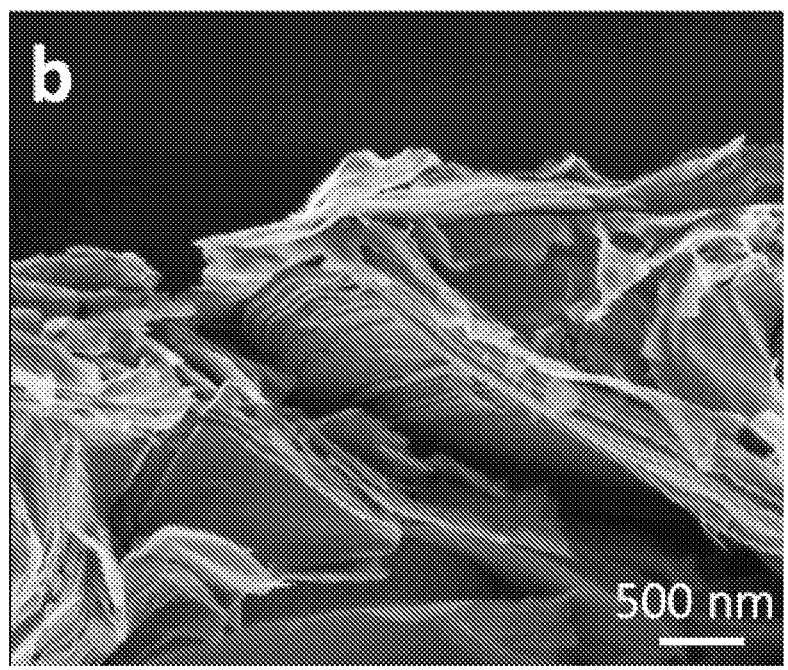

Energy-dispersive spectroscopy (EDX) confirmed that aluminum, Al, was removed, and X-ray diffraction (XRD) showed the disappearance of $Ti_3AlC_2$ peaks (traces can be seen in the case of incomplete transformation). Multilayer particles did not show the accordion-like morphology seen in HF-etched $M_{n+1}X_n(T_s)$ materials reported to date; rather, particles appeared tightly stacked, presumably as a result of water and/or cationic intercalation (see FIG. 5A). Fluorine and oxygen were observed in EDX; this, coupled with XPS showing evidence of Ti—F and Ti—O bonding, suggests O- and F-containing surface terminations, as has been discussed at length for HF-produced $M_{n+1}X_n(T_s)$ materials.

XRD patterns of the etched material, in its air-dried multilayered state, showed a remarkable increase in the intensity and sharpness of the (000l) peaks (FIG. 2A, bottom trace); in some cases the full width at half maximum (FWHM) was as small as 0.188°, as opposed to the broad peaks typical of HF-etched $M_{n+1}X_n(T_s)$ MXene, and more typical of intercalated $M_{n+1}X_n(T_s)$ MXenes. Further, compared to a c lattice parameter of ca 20 Å for HF-produced $Ti_3C_2(T_s)$, the corresponding value herein was 27-28 Å. XRD patterns of still-hydrated sediment showed shifts to even higher spacings c lattice parameters as high as ca. 40 Å have been measured. These large shifts are suggestive of the presence of water, and possibly cations, between the hydrophilic and negatively charged $M_{n+1}X_n(T_s)$ MXene sheets. Based on these substantial increases in c lattice parameters and the clay-like properties (see below), it is reasonable to assume that like in clays the swelling is due to the intercalation of multiple layers of water and possibly cations between the $M_{n+1}X_n(T_s)$ MXene sheets. Interfacial water has a more structured hydrogen bonding network than bulk $H_2O$. The $M_{n+1}X_n(T_s)$ MXene surface, holding a negative electric charge, may act to align the dipoles of water molecules between $M_{n+1}X_n(T_s)$ MXene layers.

Figure 2A:
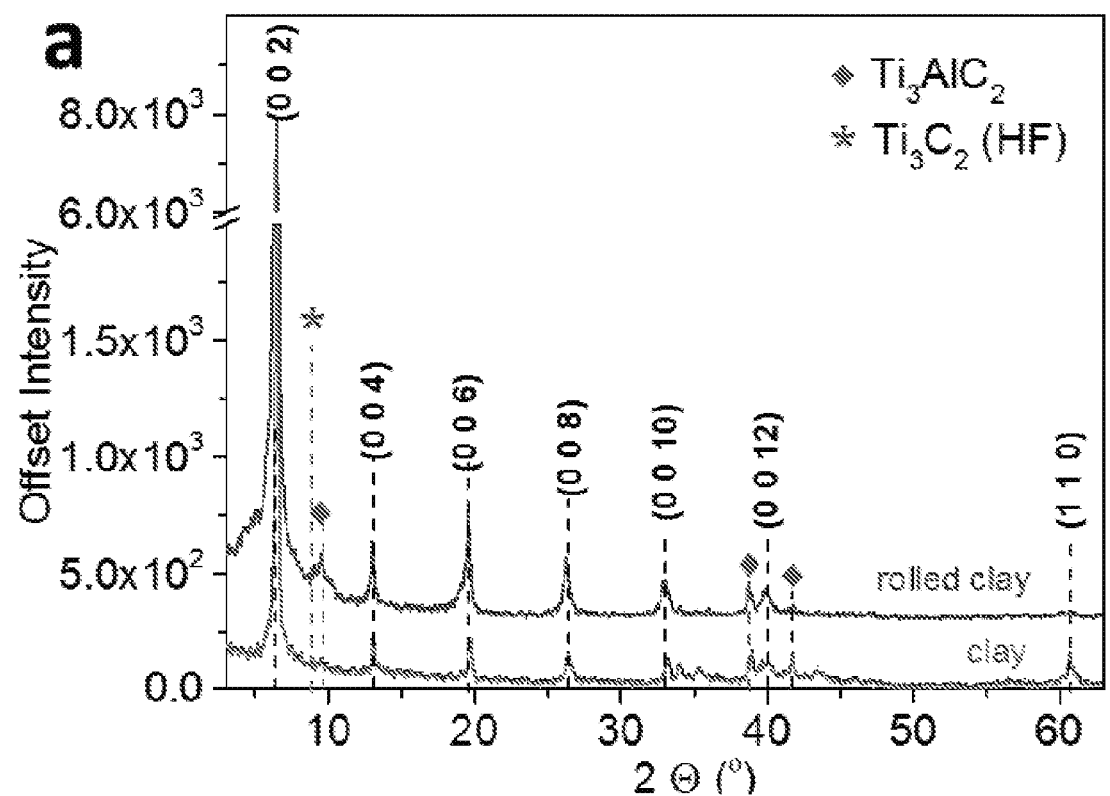

When the 'clay' was rolled into freestanding films, XRD patterns showed again strong ordering in the c direction (FIG. 2A, upper trace). Films, ranging in thicknesses from sub-micron to ca. 100 µm, were readily produced by this method. The most compelling evidence for particle shearing is the significant intensity decrease of the (110) peak around 61°, indicating a reduction of ordering in the non-basal directions while order in the c-direction was maintained (see upper XRD pattern in FIG. 2A and SEM in FIG. 5B). Morphologically, the thinner films showed more overall shearing of the multilayer particles when viewed in cross section (FIGS. 2E and F) and exhibited substantial flexibility, even when allowed to dry thoroughly (inset). Attempts to hydrate and roll HF-produced $M_{n+1}X_n(T_s)$ MXene were unsuccessful; it is thought at this time that the intercalated water believed to be absent with HF alone is used as an ethcant—acts as a lubricant that allows facile shearing.

The c parameter expansion also resulted in the weakening of interactions between the $M_{n+1}X_n(T_s)$ MXene layers as evidenced by easy delamination of multilayered particles by sonication, like it is done for van der Waals solids. In our previous work, typical sonication times for delamination (after post-synthesis intercalation with dimethyl sulfoxide) were of the order of 4 h. Here, sonication times of the order of 30-60 minutes resulted in stable suspensions with concentrations as high as 2 g/L, higher than observed previously. Remarkably, the yield from multilayer to dispersed flakes was about 45% by mass. Freestanding films were also readily fabricated by filtering these suspensions, as reported previously.

Figure 2B:
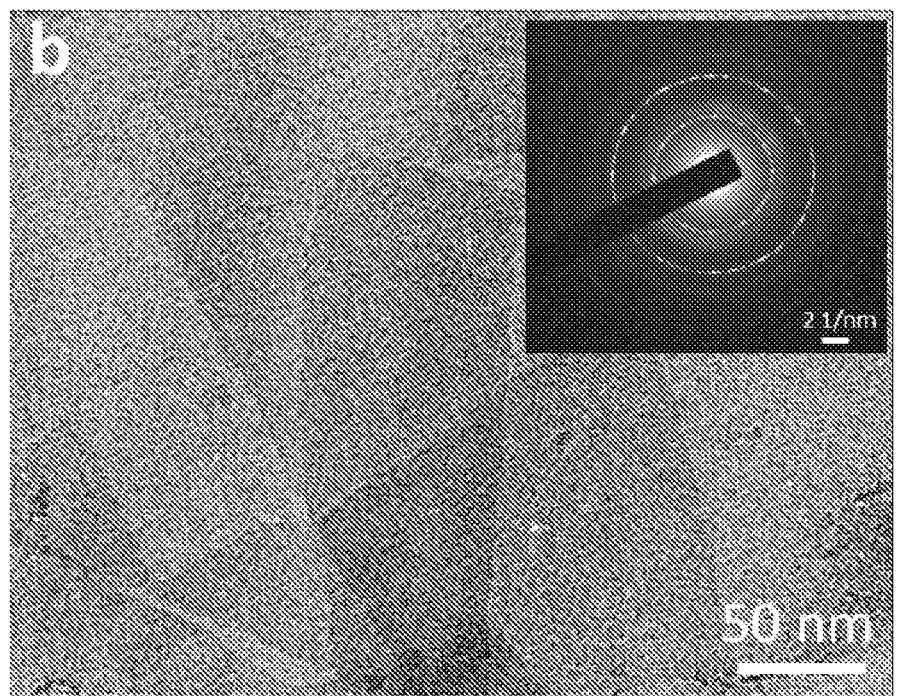
Figure 6B:
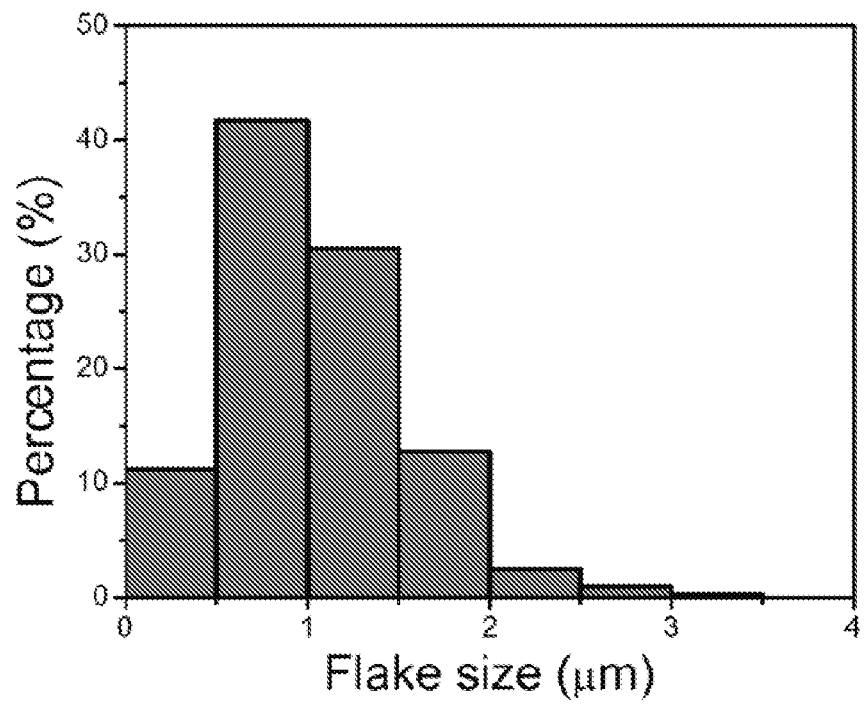
Figure 6F:
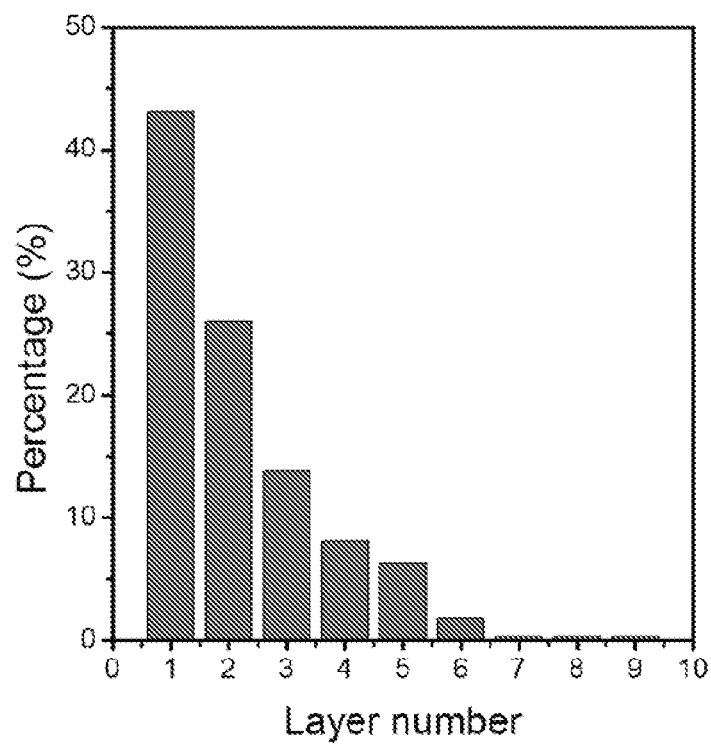
Figure 7:
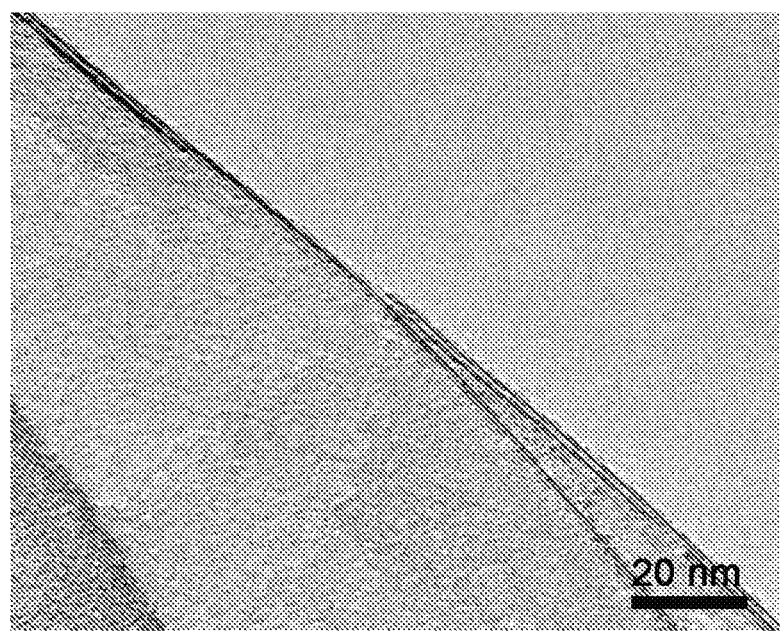
FIG. 7 shows a TEM image showing the restacking of single- or double-layer $M_{n+1}X_n(T_s)$ flakes into few-layer $M_{n+1}X_n(T_s)$ MXene.

The fact that the LiF—HCl etchant was much milder than HF resulted in flakes with larger lateral dimensions (FIG. 2B) that did not contain nanometer-size defects frequently observed in HF-etched samples. TEM analysis showed that, of 321 flakes analyzed, over 70% had dimensions of 0.5-1.5 nm (FIGS. 6A-B). Single, ca. 10 Å thick layers were imaged by TEM (FIG. 2C, D), confirming that the material is indeed two-dimensional. Analysis of 332 flakes suggested that roughly 70% of the flakes were 1-2 layers thick (FIGS. 6C-F). We note that, since the restacking or folding of flakes can lead to higher apparent thicknesses (FIG. 7), the 70% estimate is conservative. Thus, using this method, large fractions of single-layered $M_{n+1}X_n(T_s)$ flakes with high yields, large lateral sizes, and good quality can be readily produced.

Previously $Ti_3C_2(T_s)$ "paper"—made by filtration of solutions containing delaminated $Ti_3C_2(T_s)$ flakes has been shown to exhibit volumetric capacitances of ca. 350 F/cm$^3$ at 20 mV/s (and 450 F/cm$^3$ at 2 mV/s) in KOH electrolyte. For comparison, herein we characterized the electrochemical performances of rolled, freestanding $Ti_3C_2(T_s)$ films in 1 M sulfuric acid, $H_2SO_4$. Advantages of acidic electrolytes include not only their excellent conductivities but also that protons, being the smallest cations, are known to allow for surface redox reactions in transition metal oxide electrodes, such as $RuO_2$, $MnO_2$ and some others, and may provide additional contribution to capacitance from fast surface redox.

Figure 3A:
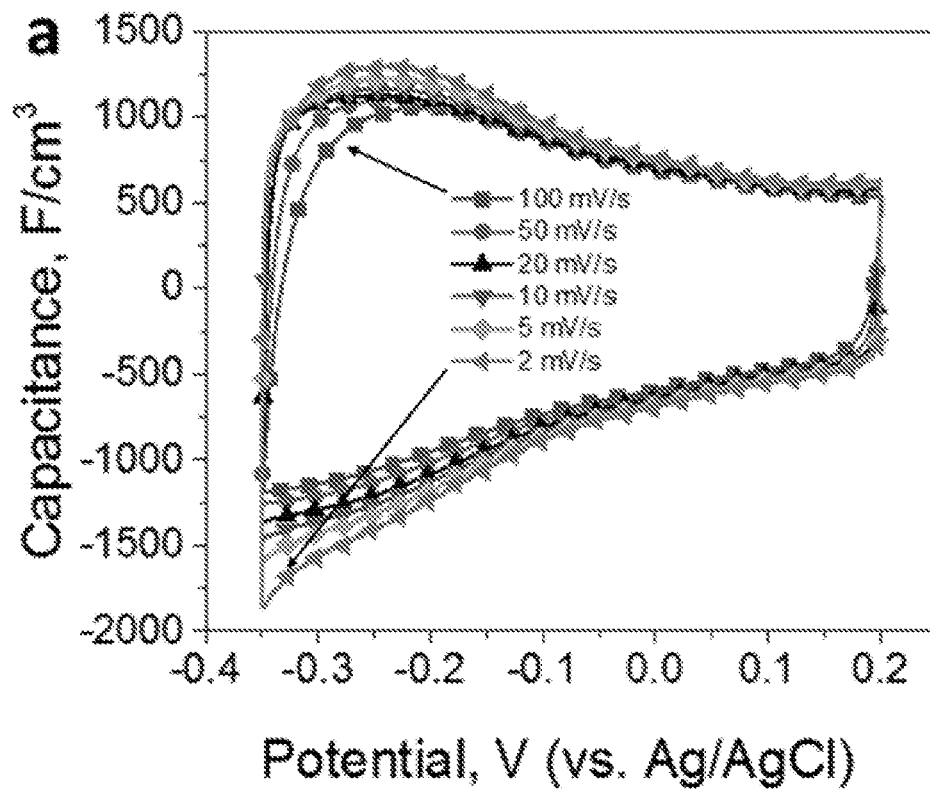
FIG. 3A shows cyclic voltammetry profiles at different scan rates for a 5 μm thick electrode in 1 M $H_2SO_4$.
Figure 3B:
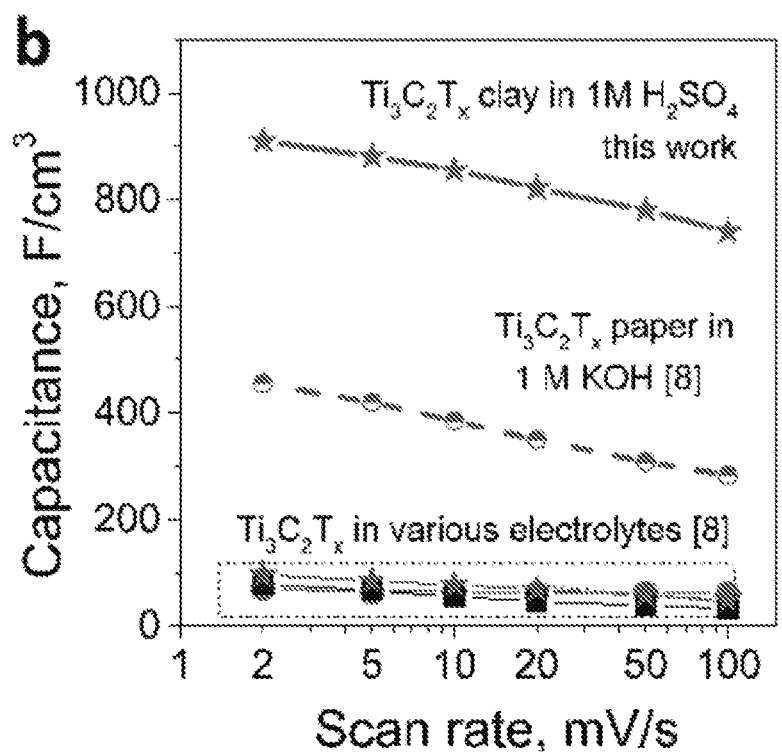
FIG. 3B shows a comparison of rate performances reported in this work and previously for HF-produced $M_{n+1}X_n(T_s)$ MXene.
Figure 3C:
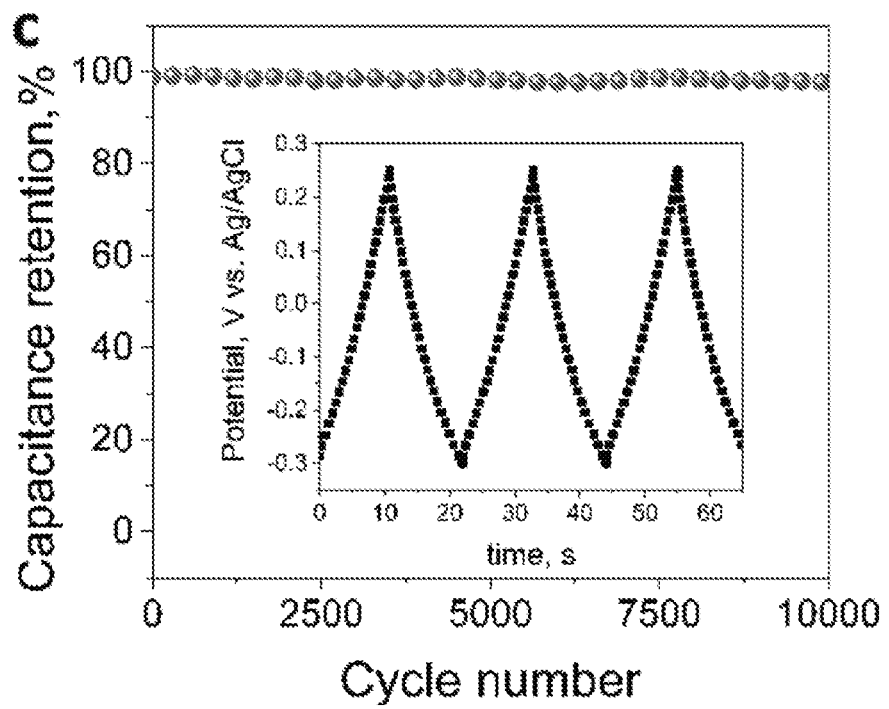
FIG. 3C provides the results of a capacitance retention test of a 5 µm thick rolled electrode in 1 M $H_2SO_4$. Inset shows galvanostatic cycling data collected at 10 A/g.

At a scan rate of 2 mV/s, capacitance values reached 900 F/cm$^3$ (FIG. 3A) and a good rate handling ability was observed (FIG. 3B). Higher capacitances are believed possible with optimization. The results—summarized and compared with previous work (comparison marked as [8]; see Lukatskaya, M. R. et al. Cation intercalation and high volumetric capacitance of two-dimensional titanium carbide. Science 341, 1502-1505 (2013)) in FIG. 3B clearly show that rolled $Ti_3C_2(T_s)$ clay electrodes show outstanding capacitive performance, not only volumetrically but gravimetrically as well, achieving 245 F/g at 2 mV/s. This can be ascribed to the smaller size of $H^+$ compared to other intercalating cations, surface redox processes, and improved accessibility of interlayer spacing in LiF—HCl etched $M_{n+1}X_n(T_s)$ MXene due to pre-intercalated water, compared to the previously studied HF-etched samples. The electrodes showed no measurable capacitance losses even after 10,000 cycles (FIG. 3C). Coulombic efficiency is close to 100% (inset in FIG. 3C), confirming that the outstanding performance is not due to parasitic reactions.

Figure 3D:
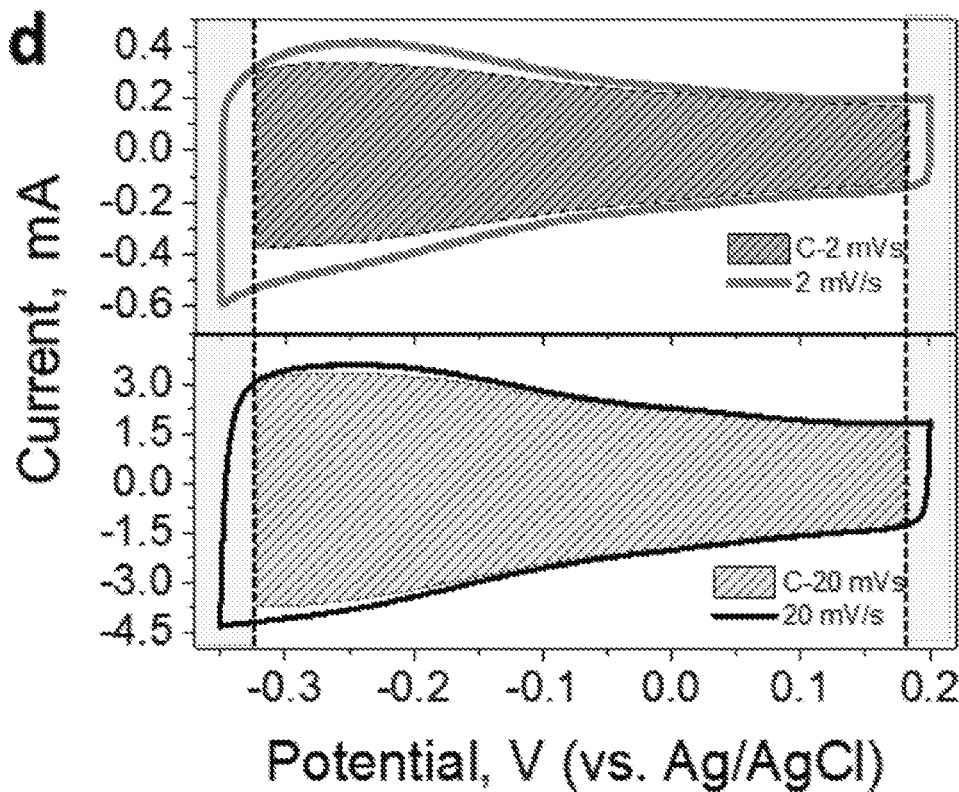
FIG. 3D shows CV profiles collected at 2 mV/s and 20 mV/s with highlighted portions of the contributions of the processes not limited by diffusion; vertical lines limit the CV area used in calculations.

To quantify the capacitive and diffusion limited contributions to the total capacitances, Dunn et al's approach was used. See, Wang, J., Polleux, J., Lim, J. & Dunn, B., *J. Phys. Chem. C* 111, 14925-14931 (2007). The results of this analysis—summarized in FIG. 3D show that, at scan rates below 20 mV/s, there is a noticeable, yet not prevailing, contribution of diffusion-limited processes to the total capacitance; at scan rates of 20 mV/s and higher, the response is not diffusion-controlled but is rather due to surface capacitive effects, whether electrostatic or pseudocapacitive. Further, if there are also redox contributions from changes in the oxidation states of surface Ti atoms layers, the redox processes are not diffusion-limited, and thus represent "intrinsic" capacitive behavior.

Figure 3E:
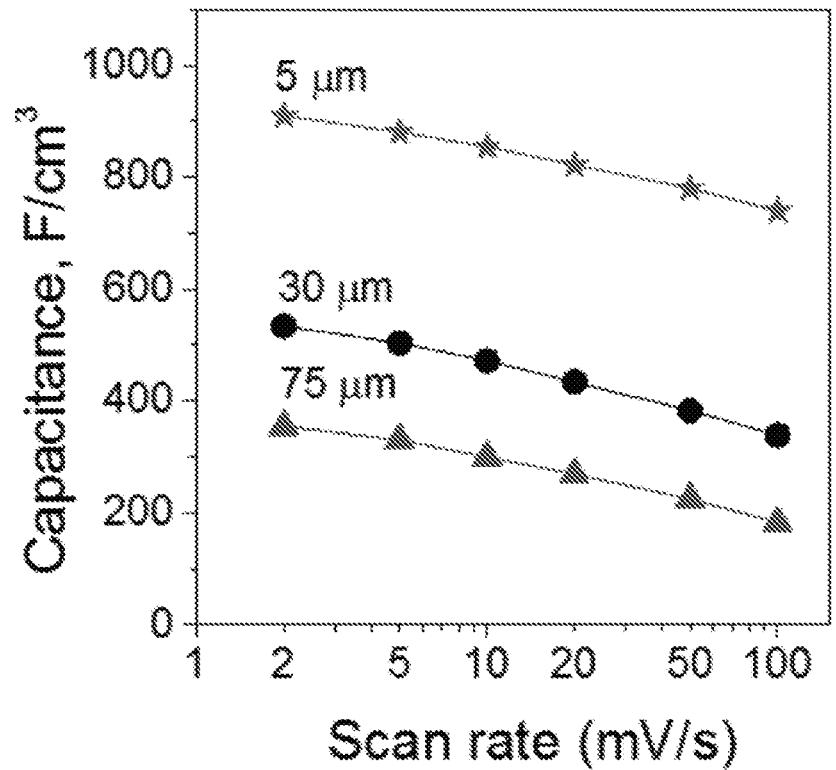
FIG. 3E shows rate performance and FIG. 3F shows EIS data, of 5 µm (stars), 30 µm (circles) and 75 µm (triangles) thick rolled electrodes.
Figure 3F:
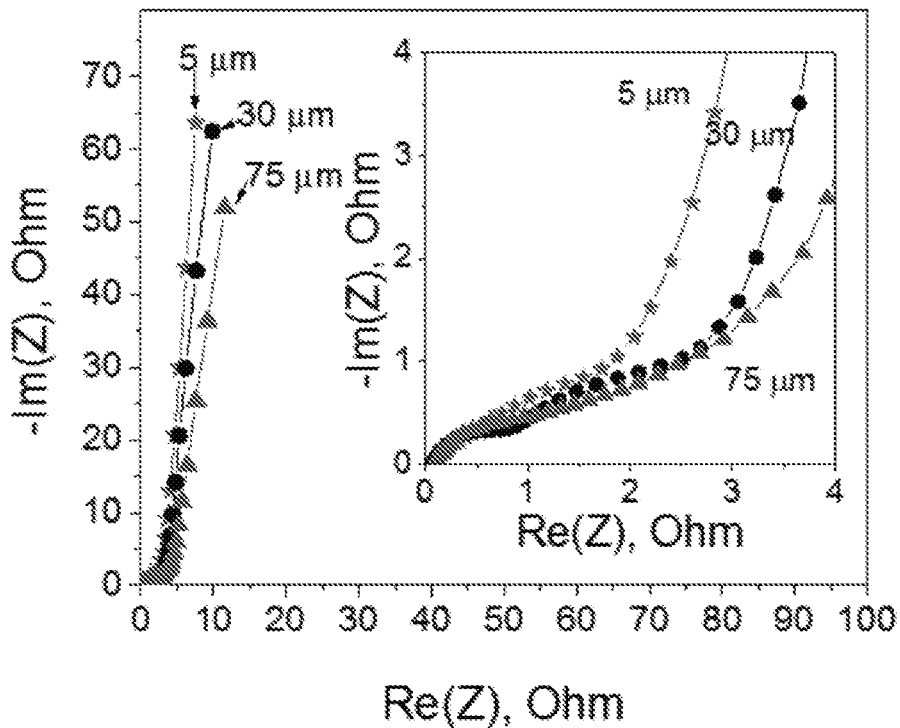
Figure 8A:
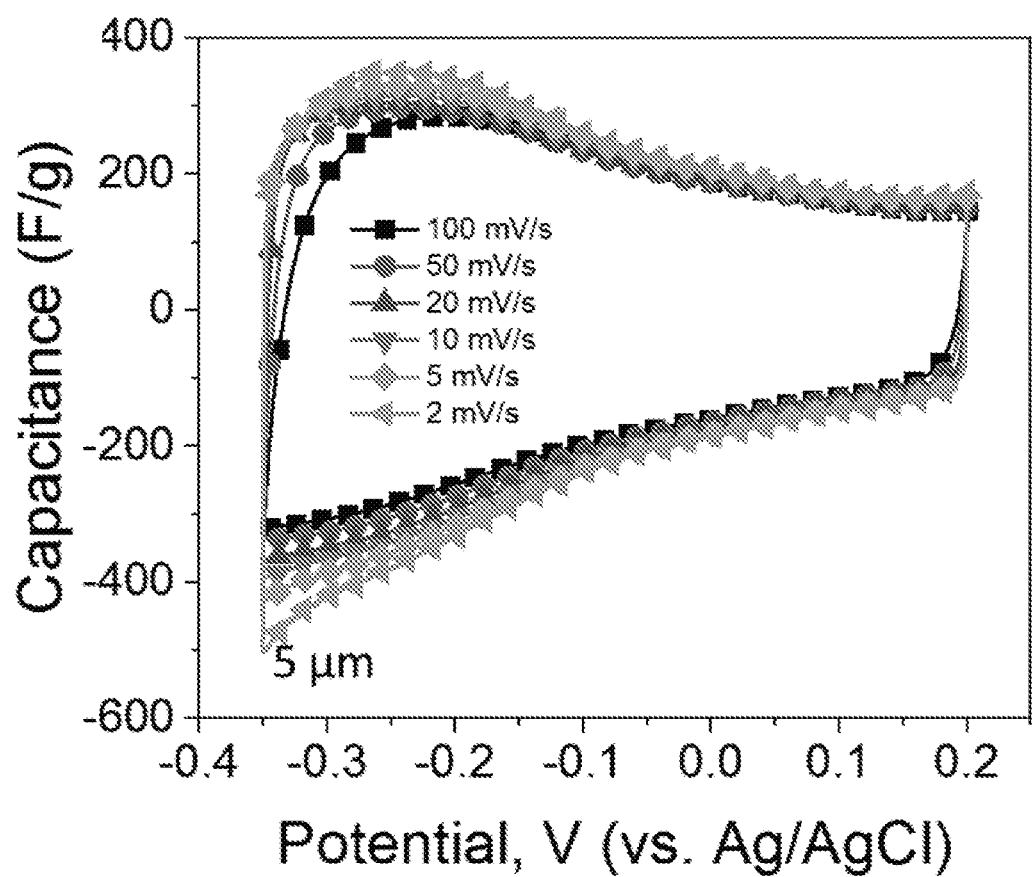
FIGS. 8A-D shows gravimetrically normalized capacitance. CV profiles at different scan rates for 5 µm (FIG. 8A), 30 µm (FIG. 8B), and 75 µm thick (FIG. 8B) electrodes in 1 M $H_2SO_4$.
Figure 8B:
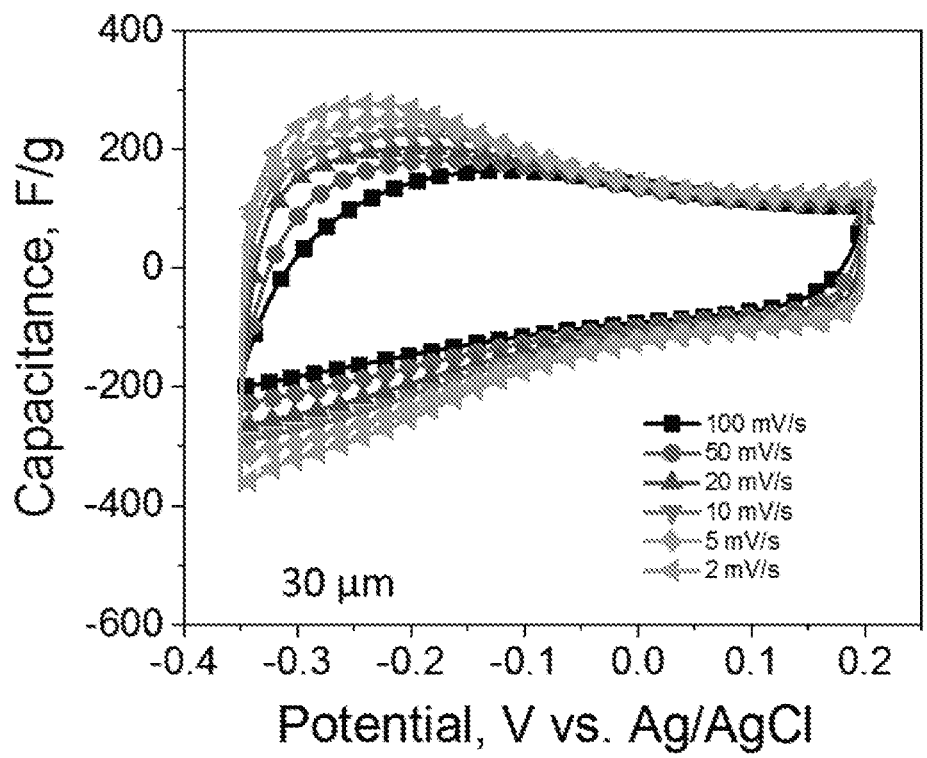
Figure 8C:
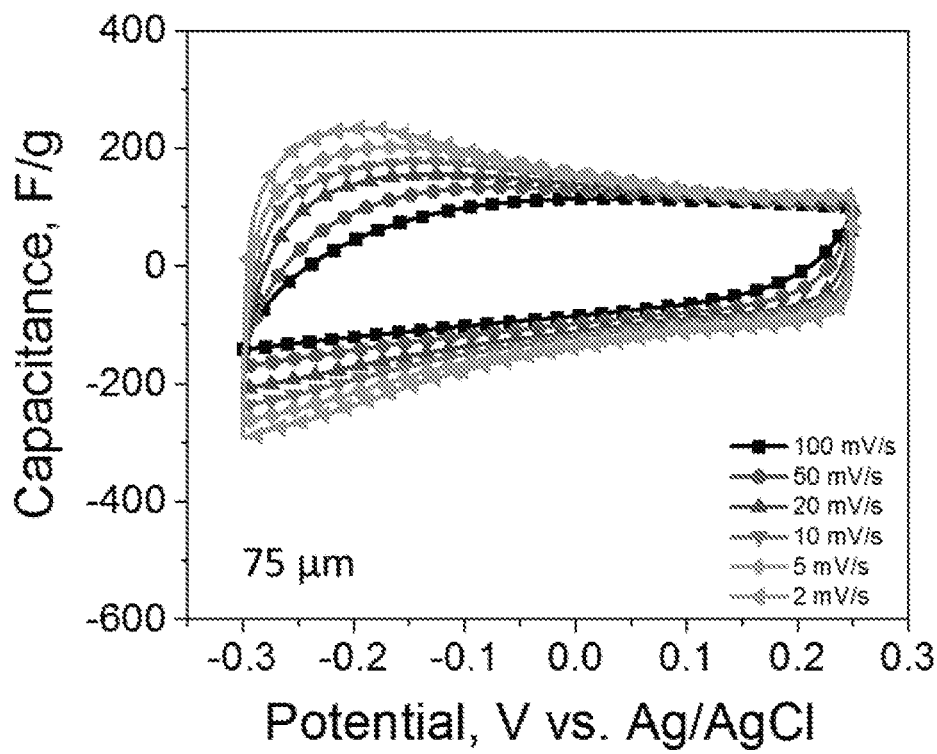
Figure 8D:
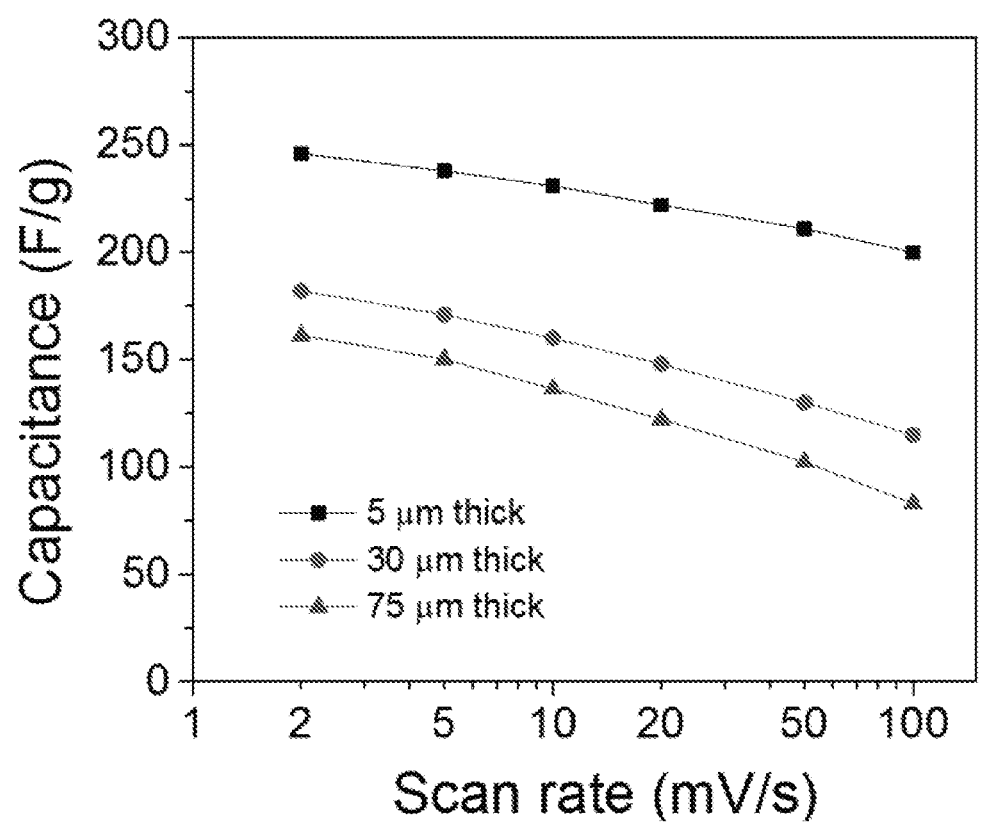

When the electrochemical responses of three rolled clay electrodes—5 µm, 30 µm and 75 µm thick—were compared (FIG. 3E, F), not surprisingly, the volumetric capacitances decreased with increased thickness. These thickness-dependent differences can be partially traced to the electrode morphologies. As noted above, electrodes thinner than 10 µm showed good flake alignment (FIG. 2E) with typical densities of 3.6-3.8 g/cm$^3$. At 2.2-2.8 g/cm$^3$, the densities of the thicker (15 µm and larger) rolled electrodes were lower, which is a reflection of the fact that their core seemed to be more open (FIG. 2F). And while the lower densities led to lower volumetric capacitances, their more open structure ensured accessibility to ions and thus similar rate performances as their thinner counterparts (FIG. 3E, F). The lower densities also ensured that the drop in gravimetric capacitances with thickness (see FIG. 8D) was not that significant.

The good capacitive rate performance of the 75 μm thick electrodes (FIG. 3E) is noteworthy, however, and demonstrates scalability and huge promise of $M_{n+1}X_n(T_s)$ MXenes for application as negative electrodes of hybrid large scale energy storage devices. Electrodes of that thickness cannot be produced by filtration and the $M_{n+1}X_n(T_s)$ MXene clay-like characteristics add important versatility to electrode manufacturing, allowing films of the required thicknesses to be rolled. Note that the capacitance values reported herein are still preliminary. As better understanding of how the films' morphologies affect their capacitances is gained, significant enhancements in the latter should ensue.

In terms of versatility, the LiF—HCl solution was also capable of etching other MAX phases, e.g., $Nb_2AlC$ and $Ti_2AlC$. In the case of $Ti_2AlC$, the multilayer powders were delaminated in a similar fashion to $Ti_3C_2(T_s)$ to produce suspensions of $Ti_2C(T_s)$ flakes, as well as $Ti_2C(T_s)$ 'paper', which had not been previously reported. These considerations hint at the potential of this new etching method for the synthesis of other $M_{n+1}X_n(T_s)$ materials, which will be explored in future studies.

This method of $M_{n+1}X_n(T_s)$ production was successful to varying degrees for other fluoride salts, such as NaF, KF, CsF, tetrabutylammonium fluoride, and $CaF_2$ in HCl, all of which showed similar etching behavior. When $H_2SO_4$ was used instead of HCl, $M_{n+1}X_n(T_s)$ materials were still obtained. We note here that these systems are options and merit further study; the ability to fine tune the reaction based on reagents used will indubitably lead to potentially useful variations in compositions and properties, especially since it is reasonable to assume that different acids and salts should modify the surface chemistries and pre-intercalate different ions.

In summary, a new high-yield method for $M_{n+1}X_n(T_s)$ MXene synthesis that is safer, easier, and provides a faster route to delaminated flakes has been detailed. This method yields a clay-like material, which can be shaped to give conductive solids of desired forms, or rolled into thin sheets, for a host of applications. When the rolled films were used as supercapacitor electrodes in a $H_2SO_4$ electrolyte, the performances were extraordinary, with volumetric capacitances up to 900 F/cm$^3$ or 245 F/g. When it is further appreciated that these numbers are "first-generation" numbers that will no doubt increase as we better understand the underlying processes and modify the material structure and chemistry, the potential of these non-oxide 2D materials to push electrochemical energy storage to new heights is clear.

Example 6: Additional Work

Example 6.1

$Ti_3C_2(T_s)$ 'clay'. The 'clay' was produced by reacting $Ti_3AlC_2$ with a mixture of hydrochloric acid (6 Molar concentration, in a ratio of 10 mL acid:1 g $Ti_3AlC_2$) and lithium fluoride (5 molar equivalents per equivalent $Ti_3AlC_2$) at 40° C. for 24 h. Washing the resulting sediment with distilled water to a pH of 6-7, followed by collection via suction filtration, yielded a hard 'clay'-like solid upon drying; this solid was crushed to yield a fine powder that could be readily rehydrated.

Example 6.2

Rolled Films. The powder from Example 6.1 was hydrated fully by immersing in water in a ratio of 0.1 g $Ti_3C_2(T_s)$:10 g water for 10 minutes with agitation, followed by suction filtration to yield hydrated 'clay' ready for processing. The 'clay' was taken directly and sandwiched in between two pieces of Celgard (3501 coated PP, Celgard LLC, Charlotte, N.C.) membrane, followed by insertion into a roller mill set to desired thickness; rolling followed by drying yielded a detachable film (upon drying, the resulting thickness could be made to range from sub-micron to over 100 μm.

Example 7. SpinCast (Spin Coated) Angstrom-Thin Conductors

MAX etching and washing.

2.5 mL of deionized water, 2.5 mL of 12 M hydrochloric acid, 0.333 g of lithium fluoride (97%, Acros Organics), and 0.5 g of MAX-phased $Ti_3AlC_2$, produced by a previously described method (M. Ghidiu, et al. "Conductive two-dimensional titanium carbide 'clay' with high volumetric capacitance," Nature, 516 (2014) 78-81), were combined in a plastic reaction vessel with a magnetic stir bar. The reaction vessel was sealed and nitrogen gas was used to purge the headspace for 20 minutes. After purging, the vessel was kept under positive nitrogen pressure and heated to 40° C. in a silicon oil bath. The reaction was allowed to continue for 24 hours at 40° C. with stirring. The etched MXene was then transferred to a centrifuge tube and combined with 40 mL of deionized water. The solution was then centrifuged at 4180 RCF for 5 minutes. The supernatant was decanted to waste. This washing step was repeated four more times to remove remaining acid. After washing, the multilayer MXene was filtered and allowed to dry overnight.

Example 3. MXene Delamination

Deionized water was bubbled with nitrogen with vigorous stirring for 30 minutes to purge oxygen. Dry multilayer MXene was combined with this water to a concentration of 100 mg/mL in a centrifuge tube. The centrifuge tube was then purged with nitrogen for 2 minutes to remove oxygen before sealing. The MXene solution was then sonicated in a bath sonicator for 1 hour to separate the individual MXene flakes from the stacks of multilayer MXene. After sonication, the solution was centrifuged for 5 minutes at 4180 RCF to separate single flake MXene from multilayer MXene. The resulting supernatant was decanted to a new centrifuge tube, while the pellet was discarded.

Example 4. MXene Spin Coating

The resulting supernatant was then used as an ink from which films could be spincoated. Films spincoated from this solution had transmittances of less than 10%. This ink could be diluted to create thinner inks from which more transparent films could be fabricated. Using a clean substrate, typical films were spincoated onto 1 in$^2$ substrates using 0.2 mL of MXene ink at 1000 RPM for 60 seconds, followed by 2000 RPM for 5 seconds to aid drying. The resulting transparent conductive films were stored under dry nitrogen overnight in order to fully dry any residual water.

Example 5. Discussion of Results

Two-dimensional flakes of $Ti_3C_2$, known as MXene, were prepared based on the method of Ghidiu providing a dispersion of MXene in water. This liquid starting material was used to fabricate transparent, conductive thin films on arbitrary substrates by spin coating. In a typical fabrication, 0.2 mL of MXene solution was deposited onto a 1" square piece of soda-lime glass at 1000 RPM for 1 minute at room temperature in open atmosphere. Other substrates demonstrated include silicon wafers with a thermally grown $SiO_2$ layer, fused quartz rounds, and flexible, polyetherimide polymer films. By varying the concentration of the MXene in solution, the thickness of the resulting spincoated films can be controlled. Absorbance spectra of films of varying thickness were collected over a range of 200-3000 nm (FIG. 9A), from which the average transmittance between 550 nm and 1100 nm was calculated. The decline in the transmissivity of visible light with increasing MXene concentration can be seen by eye, as in the photo inset in FIG. 9B. After drying in a dry nitrogen environment overnight, a 4-point probe was used to measure the sheet resistance of the spincoated films. Three regimes could be seen in the sheet resistance vs transmittance curve (FIG. 9B). The sheet resistance of films with transmittance between 2% at 85% had an exponential dependence on transmittance. Above 85%, the sheet resistance increased in a manner consistent with nearing the percolation threshold. Below 2% films transmittance was no longer a reliable measure of film thickness, and sheet resistance dropped below the trend line.

Figure 10A:
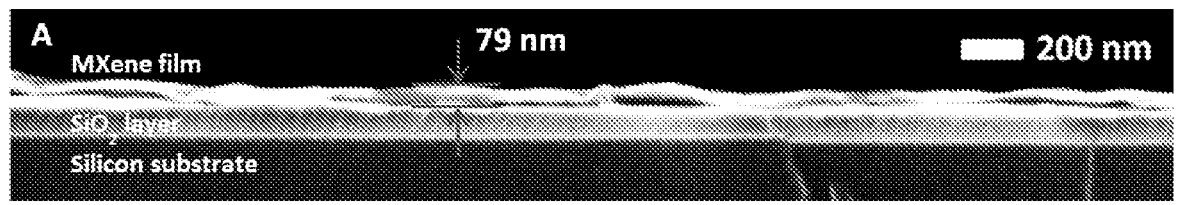
FIGS. 10A, 10B, and 10C show film thickness and surface characterization through microscopy.
Figure 10B:
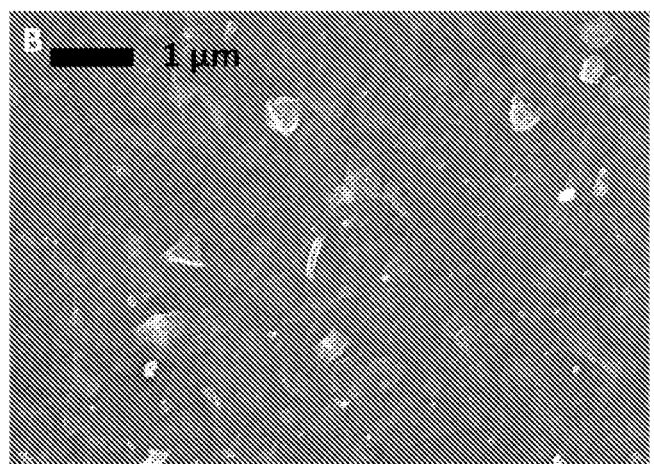
Figure 10C:
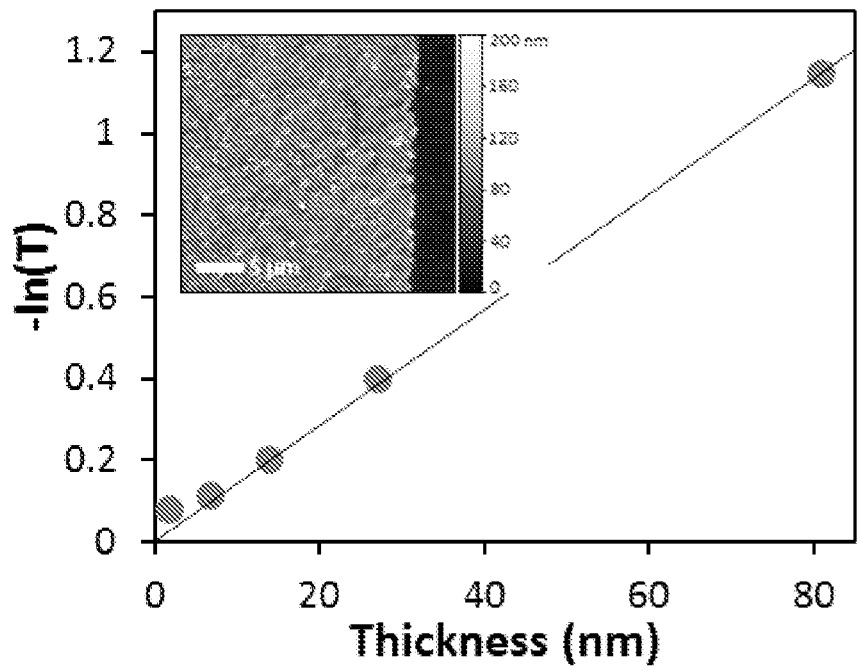

SEM and AFM were used to characterize the thickness and the surface roughness of the spincoated MXene films. A sample of MXene on a silicon wafer with a thermally-grown oxide ($Si/SiO_2$) was cleaved and SEM used to characterize the film cross-section (FIGS. 10A and 10B). AFM was also used to measure the thickness of spincoated MXene films. By scratching the surface of the MXene film without damaging the $SiO_2$ layer beneath, the step height between the surface of the MXene film and substrate was measured. SEM micrographs show the surface of these spincoated MXene films are primarily single flake or low-stack MXene with few film defects. AFM measures a surface roughness of 8.7 nm (FIG. 10C, inset). By comparing the thickness of films spincoated on $Si/SiO_2$ to the transmittance of films spincoated on quartz under the same conditions, the absorption coefficient of spincoated MXene films was calculated to be $\alpha=1.42\times10^5$ cm$^{-1}$ (FIG. 10C).

Figure 11:
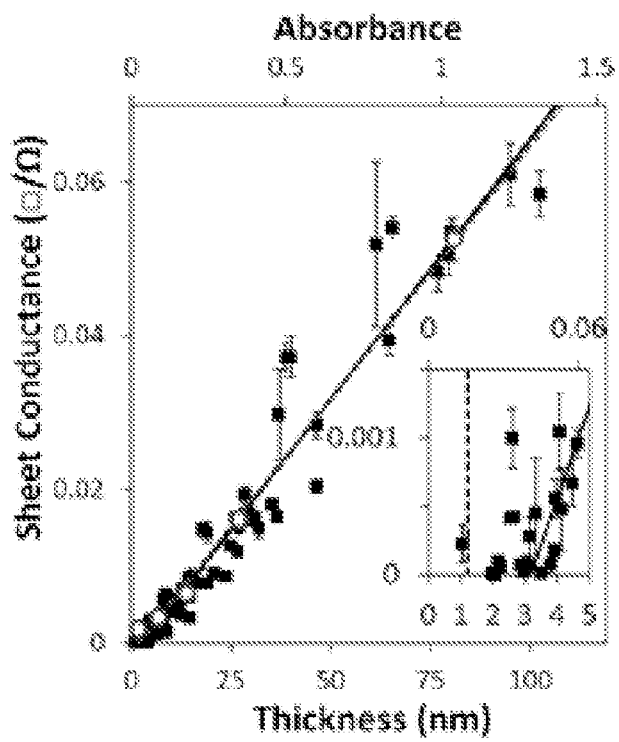
FIG. 11 shows the conductivity of exemplary spincoated MXene films. Inverse sheet resistance vs thickness of MXene films. Thickness values were calculated from the measured transmittance, using the calibration by AFM. The slope of the linear fit provides the conductivity, $\sigma=6.8\times10^3$ S/cm ($R^2=0.93$). Inset is an expanded view of the thinnest films.

Using the absorption coefficient determined from the fit of FIG. 10C, the transmittance data that provides the X-axis of FIG. 9B was transformed into thickness in the range encompassing 2% to 85% transmittance. This was plotted against the sheet conductivity (FIG. 11). A linear fit to this data provides a measure of the conductivity of the spincoated MXene films of $\sigma=6.8\times10^3$ S/cm. Because film thickness was calculated from transmittance, light scattering present in even the thinnest films caused the offset seen in the data above.

Spectroscopic ellipsometry was used to provide an independent measure of the conductivity of these spincoated MXene films (FIGS. 12A and 12B). The complex reflectivity as a function of wavelength of MXene films spincoated on $Si/SiO_2$ substrates was collected at 50°, 60°, and 70°. The optical properties in the near-infrared were accurately modeled using a Drude oscillator with a resistivity of $1.36\times10^{-4}$ $\Omega$·cm, or equivalently a conductivity of $7.35\times10^3$ S/cm. The uniqueness of this fit parameter was determined by evaluating the goodness-of-fit for a range of values of resistivity, while optimizing the other model parameters; for a 50% variation in resistivity, the mean-square error was observed to increase by a factor of 6.

Figure 13A:
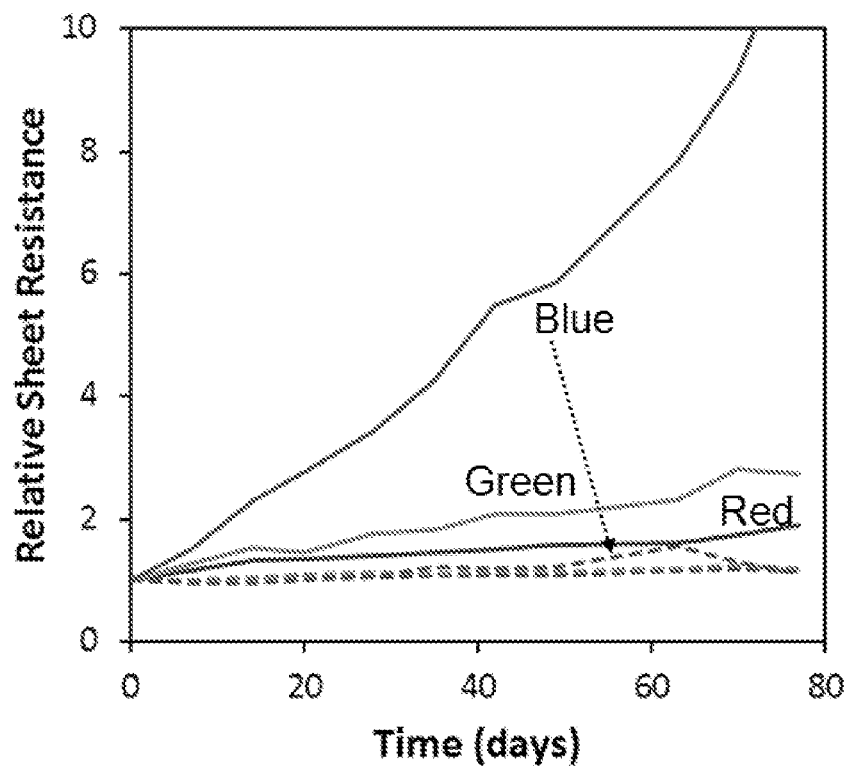
FIGS. 13A and 13B show examples of spincoated MXene film stability.
Figure 13B:
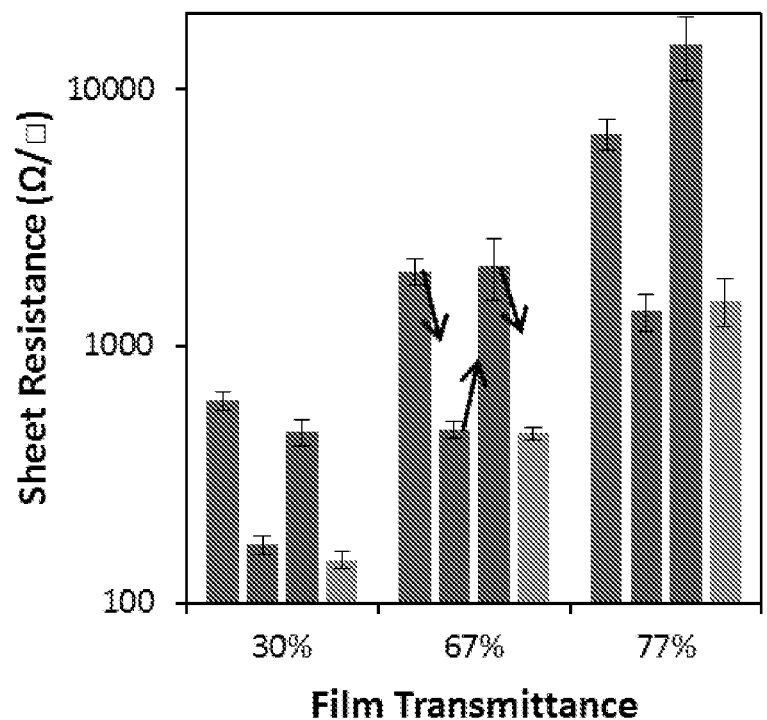

The stability of spincoated MXene films was also studied. By tracking the film sheet resistance over time for films stored in open air or under dry nitrogen, it could be seen that the stability of film electrical properties depend on both storage method and film thickness (FIG. 13A). Films stored under dry nitrogen displayed an increase in sheet resistance of 14±5% over 11 weeks. In contrast, the sheet resistance of films stored in open air increased more quickly, occurring more drastically in thinner films. This data is consistent with the diffusion of a species that degrades the electronic properties of the film. MXene are known to be subject to water intercalation[1]. In order to test the effect of humidity on spincoated MXene films, the sheet resistance of MXene films was measured in a sequence of wetting and drying (FIG. 13A). Resistance was measured for MXene films immediately after spincoating from water, after overnight storage under dry nitrogen, after storage for 2 days under nitrogen with saturated water vapor and finally, after a second overnight storage under dry nitrogen. Sheet resistances of films after a single wet-dry cycle were identical to after a second wet-dry cycle with over a half order of magnitude increase in the sheet resistance during the wet stage. The sheet resistance of films stored in open air could be reduced by annealing in dry nitrogen.

Figure 14A:
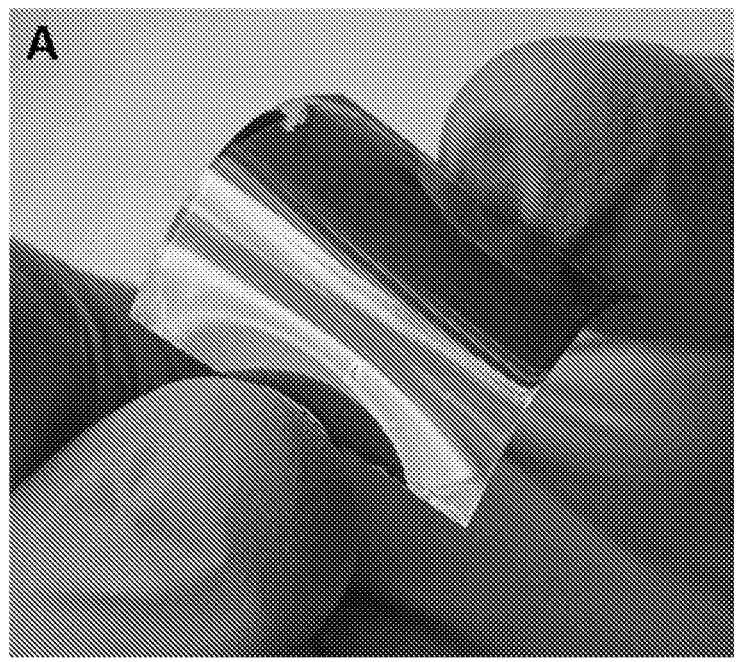
FIGS. 14A, 14B, and 14C show some of the structural and electrical properties of exemplary spincoated MXene films by different techniques and on different substrates.
Figures 14B, 14C:
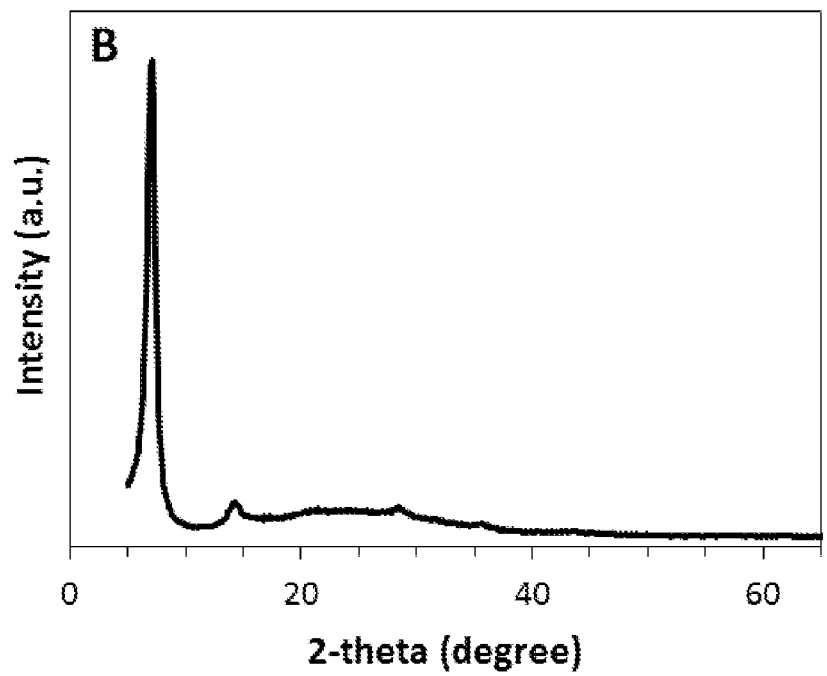

MXene dispersions can be deposited on a variety of substrates, including flexible polymer substrates such as polyetherimide (FIG. 13A). Films on flexible substrates have conductivities similar to those spincoated on glass and retain this conductivity even at small radii of curvature (FIG. 14C). This retention of conductivity while flexing can be attributed to the 2D nature of MXene and sheets ability to slide over one another, allowing the film to flex without cracking. XRD confirms the presence of several layers of MXene (FIG. 14B) in spincoated films, while dropcast MXene ink reveals the presence of small amounts of stacked MXene. This indicates that spincoating MXene ink either separates the multilayer MXene from the lone flakes by throwing off the larger MXene stacks during deposition or causes the multilayer MXene to shear into several-layer flakes.

Figure 15:
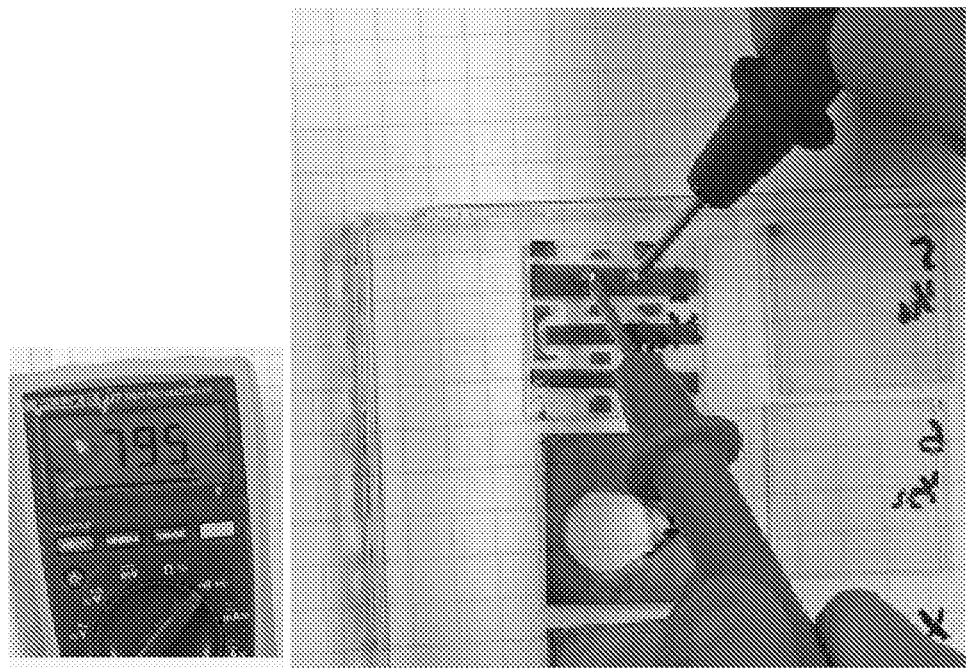
FIG. 15 shows a patterned MXene film, masked by adhesive tape strips after developing the exposed regions in nitric acid. The exposed MXene is oxidized to transparency.

MXene layers can be patterned by masking the selected areas of the MXene films while treating the unmasked or exposed portions to an etchant, such as nitric acid. The mask can be provided by, for example, adhesive tape or photoresist, in addition to other protective layers that would be evident to someone skilled in the art. FIG. 15 shows a patterned MXene film, masked by adhesive tape strips after developing the exposed regions in nitric acid. The exposed MXene is oxidized to transparency. The tape is subsequently removed and the masked portion retains its original conductivity.

Example 8. Ion Exchange and Solvation Reactions in 2D $Ti_3C_2$ MXene

Protocols as also available for selective ion intercalation/exchange in MXene materials, as exemplified here with $Ti_3C_2$. The resulting materials have different structural behaviors in response to water, and the exchange procedures are broadly applicable to many ions.

Experimental $Ti_3AlC_2$:
$Ti_2AlC$ powders (−325 mesh, Kanthal, Sweden) were mixed with TiC (Alfa Aesar, 99.5% purity) and heated to 1200° C. (at a heating rate of 10° C./min following by a 2 h soak) to afford $Ti_3AlC_2$, according to previously-reported procedures.[1] The resulting solid was milled with a milling bit and sieved (−400 mesh) to afford powders under 38 nm in size.

$Ti_3C_2T_x$-1:

$Ti_3AlC_2$ powder (sieved to <38 nm particle size) was slowly added to 10 wt % hydrofluoric acid (HF) in a ratio of 1 g $Ti_3AlC_2$:10 mL etching solution. The reaction mixture was stirred for 24 h at 25° C., after which the powders were washed with distilled water in a centrifugation and decantation process: water was added to the reaction mixture, it was shaken for 1 min, then centrifuged for 2 mins to collect the powders. The supernatant was then discarded, and the process repeated. This was done in a ratio of 0.5 g powders: 40 mL water. Upon reaching a pH of 5, the powders were filtered to remove excess water and left for another 24 h to dry in air.

$Ti_3C_2T_x$-2: Similar to the above procedure, $Ti_3AlC_2$ powder was added to an etching mixture in the same ratio. In this case, however, the etchant was a mixture of 10% HF and LiCl. The etchant contained LiCl in a molar ratio 5 LiCl:1 $Ti_3AlC_2$. The mixture was stirred for 24 h at 25° C. followed by washing as described previously.

Acid Pre-Washing.

To remove traces of LiF precipitated during etching, $Ti_3C_2$-2 was washed with a centrifugation procedure as described above, with three washes consisting of 6 M HCl (Fisher TraceMetal grade). This procedure was performed directly after the etching of $Ti_3C_2$-2, before any of the sediments were allowed to dry.

Intercalation/Exchange.

For $Ti_3C_2T$-1, no prior acid washing was performed. For $Ti_3C_2T_x$-2, all samples were acid pre-washed as described above. Before the samples were allowed to dry, salt solutions (1 N LiCl, NaCl, KCl, KBr, RbCl, $MgCl_2$, or $CaCl_2$ in distilled water) were added in a ratio of roughly 0.5 g MXene to 40 mL solution. After shaking for 2 min, the mixtures were allowed to sit for 1 h. The samples were then centrifuged to settle the powders, and the supernatants were decanted and replaced with fresh solutions. The samples were again shaken and allowed to sit for 24 h. Then they were centrifuged, the supernatants were discarded, and water was added, followed by agitation and centrifugation. After decanting, the sediment was collected via filtration, and washed with distilled water (2×5 mL) followed by drying in air (roughly 50% relative humidity) to yield desired powders.

Observations.

Figure 16:
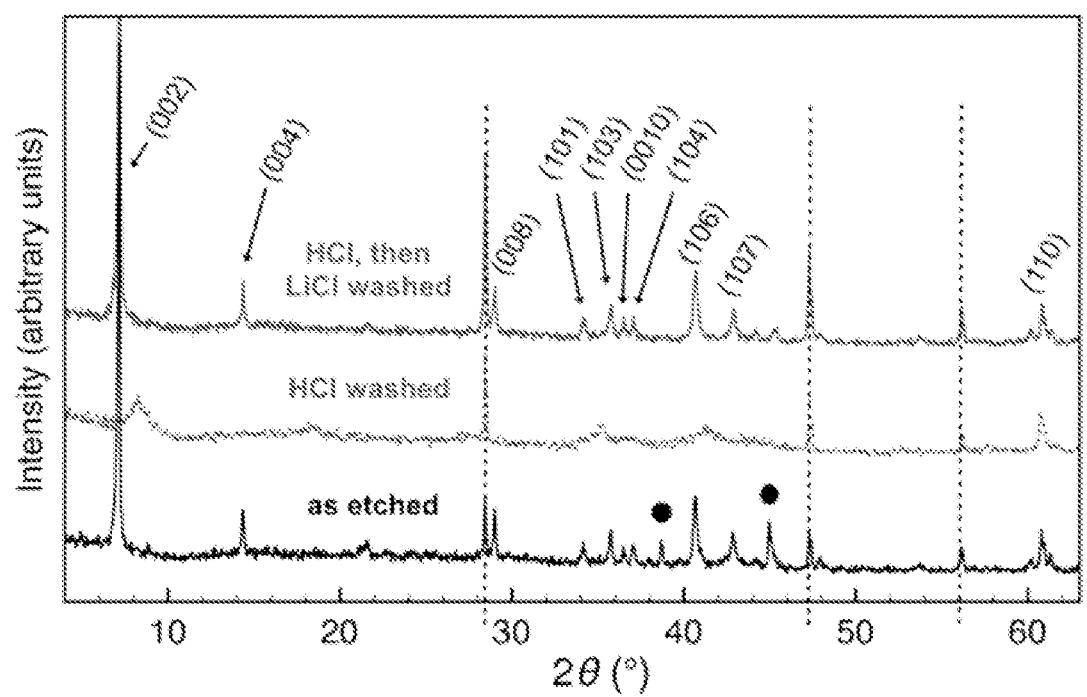
FIG. 16 shows XRD patterns of $Ti_3C_2$-2 as washed initially (bottom trace), after washing with HCl (middle dotted trace,), and after subsequent washing with LiCl to yield Li-$Ti_3C_2T_x$ (solid top trace, top). Vertical dashed lines denote peaks from crystalline Si used as a standard, and solid black circles denote LiF impurities present before washing with HCl. See Example 8.

$Ti_3C_2T_x$ was prepared by the reaction of $Ti_3AlC_2$ with 10% HF. After etching, removal of by-products by washing with water, and drying, attempts were made to intercalate Li ions by immersion in 1 M aqueous LiCl. Even after 72 h of exposure, no major changes (not shown) were observed by x-ray diffraction (XRD). However, when LiCl was present as part of the etchant (5 molar equivalents per mole of $Ti_3AlC_2$) rather than as a later addition, an intense and sharp (0002) reflection, corresponding to a c-LP of 24.5 Å, was observed for the powder dried in ambient air (~50% relative humidity for 24 h), as opposed to the broader and less intense reflections of 19-20 Å often observed when only HF was used. This material is designated $Ti_3C_2$-2. Some LiF was identified in XRD patterns of $Ti_3C_2$-2, most likely formed by precipitation. To remove this impurity, 6 M hydrochloric acid (HCl) was used to dissolve LiF during the washing procedure following etching. Surprisingly, this step resulted in the loss of order as observed by XRD (FIG. 16) with a concurrent decrease of the c-LP to ~21 Å. However, washing with LiCl after this step was enough to restore the structure to that observed initially, less the LiF impurity. It may be speculated that there is a proton/cation exchange, but more work is needed to confirm this. This material was designated Li-$Ti_3C_2T_x$. It is not clear at this time why $Ti_3C_2$-1 does not behave similarly with LiCl treatment.

Figure 17C:
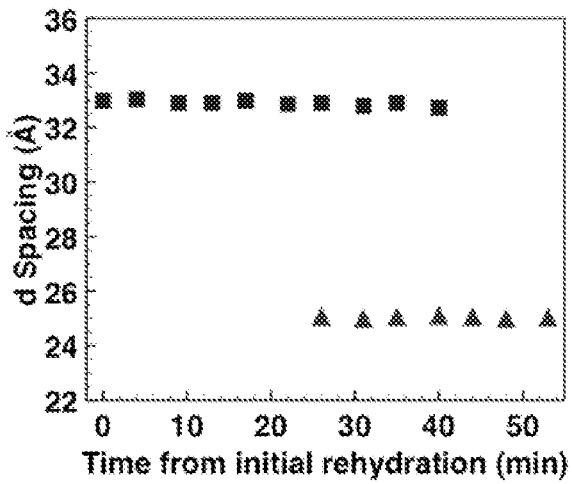
FIG. 17C shows the basal spacings from the (0002) peaks over time, showing an abrupt change in d-spacing and the coexistence of monolayer and bilayer phases. d) changes in intensity with time of (0002) peak of monolayer (red triangles) and bilayer (blue squares) phases. See Example 8.
Figure 17D:
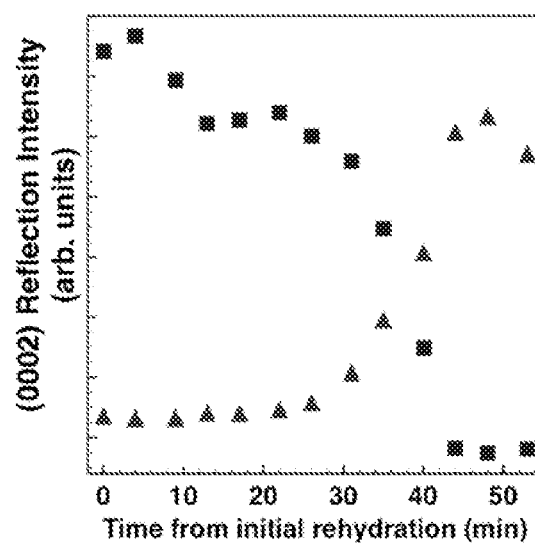
FIG. 17A shows overlayed in situ XRD patterns of hydrated Li-$Ti_3C_2T_x$ upon drying in 40% relative humidity.
FIG. 17B shows a contour plot showing the time evolution of the data shown in FIG. 17A.

To study the evolution of the c-LPs upon drying, air-dried Li-$Ti_3C_2T_x$ samples were prepared and saturated with distilled water immediately prior to measurement. The powders were then held in an atmosphere of ~40% relative humidity; FIG. 17A shows XRD patterns, recorded every 4 min over ~1 h of drying. From these results it is clear that only two phases were present: a fully hydrated phase with c-LP ~33 Å, and a phase with c-LP ~25 Å after drying. The lack of a continuously-shifting intermediate peak signified an abrupt phase transition (FIG. 17C). The time dependence is shown as a contour plot (FIG. 17B) and by tracing the maximum intensity of each (0002) peak (FIG. 17D). Clearly at points during drying, both phases were present simultaneously. Between completion of the shift (roughly 1 h) and 24 h, the c-LP further decreased from 25.0 Å to 24.5 Å. This change may be due to the removal of residual $H_2O$.

For $Ti_3C_2$-1, the c-LP (~19.5 Å) from etching in HF alone was taken to be without $H_2O$ intercalation. It followed that Li-$Ti_3C_2T_x$ equilibrated at ~40% relative humidity (c-LP of 24.5 Å) has a Δc of +5 Å, or a change of +2.5 Å per interlayer space. As discussed in the literature, this change corresponds roughly to the size of an $H_2O$ molecule. Upon full hydration, the single reflection corresponding to 33 Å (an interlayer expansion of +6.8 Å) likely involved a bilayer of $H_2O$ between the MXene layers. This expansion matches well with that reported for other materials upon $Li^+$ intercalation, and expansion of the 25-Å phase corresponds to that of $MoS_2$ assumed to be intercalated with one layer of $H_2O$. It was reasonable to assume that Li-$Ti_3C_2T_x$ contained a monolayer of $H_2O$ and ions, possibly in a crystallographic layer as observed in materials such as layered double hydroxides. This 2-stage response highlighted in FIGS. 17A-D may be explained by postulating that as $H_2O$ leaves the structure, cation-$H_2O$ clusters stabilize the bilayer structure creating defects, and when a critical amount of $H_2O$ is lost, the bilayer structure is no longer stable and collapses, leading to the stepwise transition observed.

To explore the intercalation of other ions, $Ti_3C_2$-2 was immersed in 1 M solutions of NaCl, KCl, and RbCl, and 0.5 M solutions of $MgCl_2$ and $CaCl_2$ following HCl treatment as described earlier, followed by washing with distilled water to remove traces of salt, and drying in air to yield samples Na-$Ti_3C_2T_x$, K-$Ti_3C_2T_x$, Rb-$Ti_3C_2T_x$, Mg-$Ti_3C_2T_x$, and Ca-$Ti_3C_2T_x$. XRD patterns were recorded under full hydration (in the presence of liquid water; FIG. 18A), after drying for 48 h in 40% humidity (FIG. 18B), and after 48 h of drying in the presence of $P_2O_5$ (~0% relative humidity; FIG. 18C). In all cases, XRD patterns showed the presence of a single phase.

To test a hypothesis that the hydration of these materials was related to the enthalpy of hydration of the intercalated cations, the interlayer space (viz. Δc/2) were plotted against e/r (where e is the cation charge and r its radius), with radii values taken from the literature. When saturated with water (FIG. 18D), a clear trend emerged: changes of roughly +3 Å or +6 Å per interlayer, which most likely correspond to monolayers or bilayers of $H_2O$. Also plotted in FIG. 18D were the interlayer space changes reported by Lerf and Schollhorn for cation-intercalated $TiS_2$ phases. See A. Lerf and R. Schollhorn, Inorg. Chem., 1977, 16, 2950-2956. The match was excellent, with very similar basal expansions and a similar trend. It was clear that the cation treatments led to different behaviours which, in the case of $Ti_3C_2T_x$, seem to be described by the cation hydration enthalpy.

After drying in air, large changes were observed for Li-$Ti_3C_2T_x$ and Na-$Ti_3C_2T_x$ as their interlayer space shrunk to that of a monolayer spacing (FIG. 18E). Ca-$Ti_3C_2T_x$ and Mg-$Ti_3C_2T_x$ remained in the bilayer phase, likely due to their substantially higher hydration enthalpies (Table 1).

TABLE 1

Experimental hydration enthalpies for selected cations

| Cation | Hydration Enthalpy -$\Delta H°_{hyd}$ (kJ/mol)[2] |
|---|---|
| $Li^+$ | 519 |
| $Na^+$ | 409 |
| $K^+$ | 322 |
| $Rb^+$ | 293 |
| $Mg^{2+}$ | 1921 |
| $Ca^{2+}$ | 1577 |

However, after drying over $P_2O_5$, Ca-$Ti_3C_2T_x$ shrunk to the monolayer phase, while Mg-$Ti_3C_2T_x$ displayed a broad peak centred on the bilayer region (FIGS. 18C and 18F). FIG. 18G shows cartoons of the interlayer space to explain these data. Full data are provided in Table 2. The reason for the slight increase in c-LP after $P_2O_5$ for the alkali cations is unclear at this time.

TABLE 2

Observed c parameters ($d_{(0002)}$) for ion-intercalated samples (data plotted in main text FIG. 18)

| Sample | Ionic radius (Å)[3] | Charge (e) | Charge/radius (+e/Å) | Hydrated c-LP (Å) | 50% RH c-LP (Å) | 0% RH ($P_2O_5$) c-LP (Å) |
|---|---|---|---|---|---|---|
| Li—$Ti_3C_2T_x$ | 0.94 | +1 | 1.06 | 32.66 | 24.56 | 24.60 |
| Na—$Ti_3C_2T_x$ | 1.17 | +1 | 0.85 | 31.24 | 24.76 | 24.91 |
| K—$Ti_3C_2T_x$ | 1.49 | +1 | 0.67 | 25.36 | 25.08 | 25.14 |
| Rb—$Ti_3C_2T_x$ | 1.63 | +1 | 0.61 | 25.38 | 25.16 | 25.19 |
| Mg—$Ti_3C_2T_x$ | 0.72 | +2 | 2.78 | 31.11 | 29.83 | 30.09 |
| Ca—$Ti_3C_2T_x$ | 1.00 | +2 | 2.00 | 31.33 | 30.47 | 24.66 |

Figure 19A:
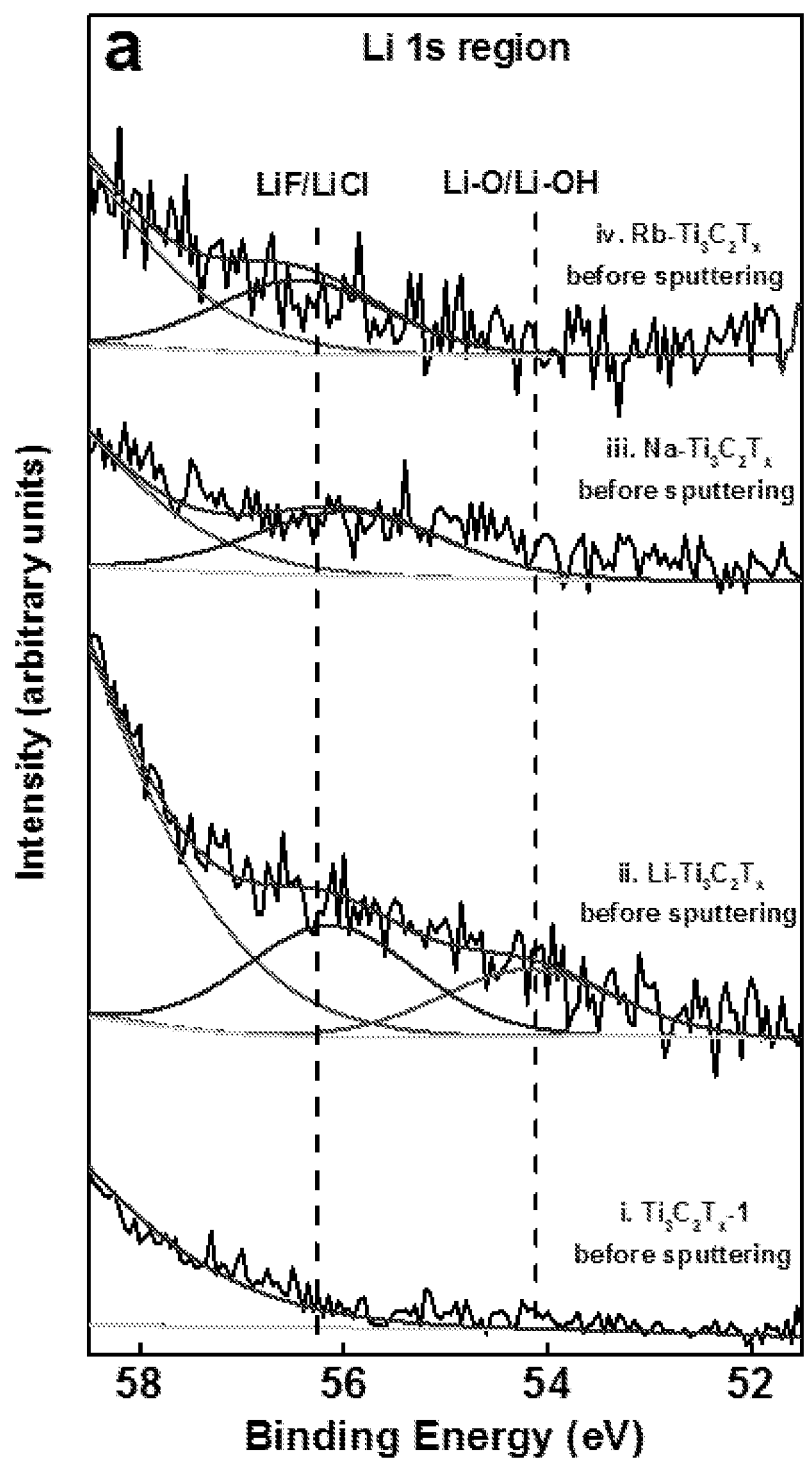

To further substantiate ion intercalation, x-ray photoelectron spectroscopy (XPS) was used. For $Ti_3C_2$-1, no Li-related peaks were present, either before or after sputtering (FIG. 19Ai. respectively). However, for Li-$Ti_3C_2T_x$, the spectra before sputtering show the presence of two peaks, one corresponding to a LiF and/or LiCl species and one corresponding to Li—O and/or Li—OH species (FIG. 19Aii). The Li—O/Li—OH peak is at a binding energy (BE) of 54.2 eV. This species probably originated from the presence of $Li^+$ ions interacting with $H_2O$ or with MXene-bound O-containing groups. From the Li—O/Li—OH peak ratios before sputtering, the amount of $Li^+$ ions is estimated to be ≈0.3 moles per mole of $Ti_3C_2$. The LiCl/LiF peak, at a BE of 56.1 eV, is due to the residues of etching, where some LiF and/or LiCl salts were not effectively washed away.

After sputtering, the two peaks corresponding to Li—O/Li—OH and LiCl/LiF were replaced by one at a binding energy of 55.8 eV (which lies in the middle of those for the two species), with the same FWHM as the peaks of those species before sputtering. This might be due to the effect of sputtering on the Li species.

Figure 19B:
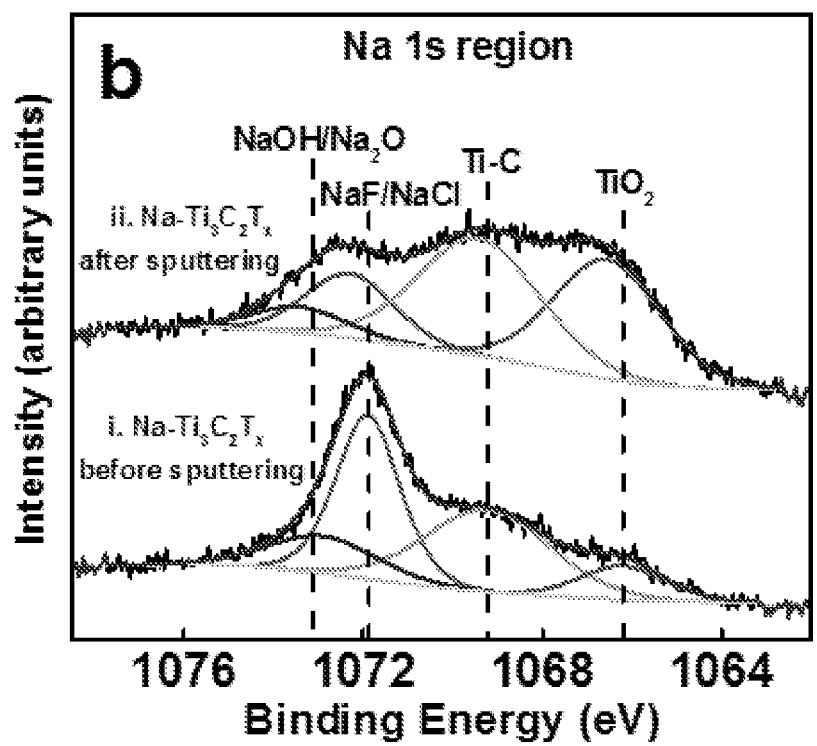
Figure 19C:
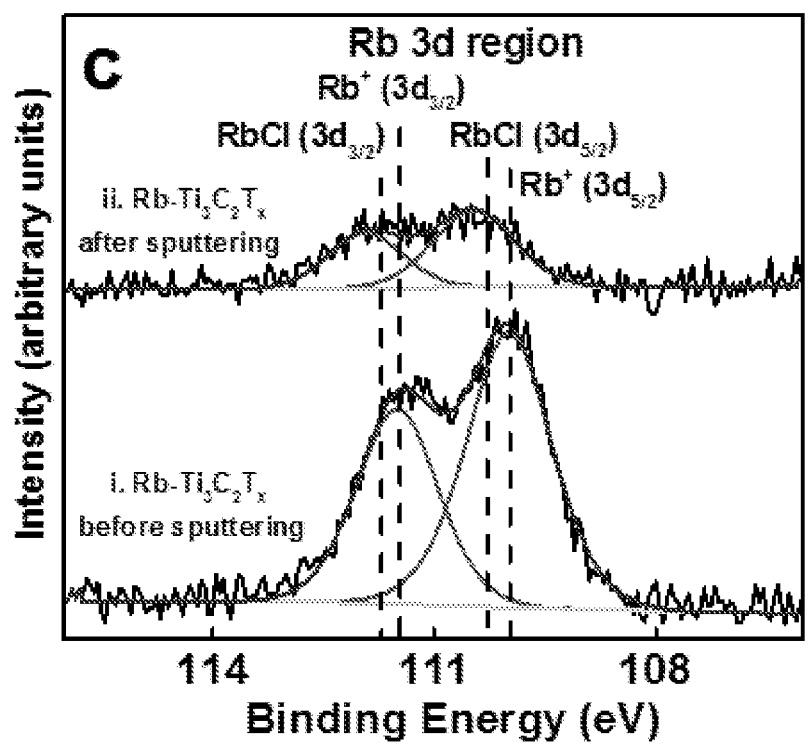

XPS spectra of the Li 1s region for Na-$Ti_3C_2T_x$ before sputtering (FIG. 19Aiii) show no sign of Li—O/Li—OH species. Only a peak for LiF/LiCl species was present. This holds true after sputtering as well. The lack of a peak corresponding to the intercalated $Li^+$ suggested a complete exchange between $Li^+$ and $Na^+$ ions. FIG. 19Bi and FIG. 19Bii show XPS spectra for the Na 1s region for Na-$Ti_3C_2T_x$, before and after sputtering, respectively. This region was fitted by four species, one each to NaF/NaCl and NaOH/$Na_2O$. The former was possibly due to the incomplete washing of NaCl salts and the formation of NaF. The latter most probably originates from intercalated $Na^+$ ions. The other two species originate from the Ti LMM Auger lines and correspond to the Ti—C species in MXene and $TiO_2$ (surface oxide). It is worth noting that the BE of all these species shift to a slightly higher BE (about 0.1 to 0.2 eV) after sputtering. Again, this might be an effect of the sputtering process. The amount of $Na^+$ intercalant was estimated from the XPS spectra to be ≈0.24 moles (before sputtering). Rb-$Ti_3C_2T_x$ is similar; the disappearance of the $Li^+$ species in the Li 1s region (FIG. 19Aiv) was associated with the appearance of a species in the Rb 3d region (FIG. 19C). The amount of Rb species intercalated per mole of $Ti_3C_2T_x$ estimated from the XPS spectra was ≈0.16 moles (before sputtering).

Based on the overall results, it is possible to propose a formula for these MXenes: $A^{n+}_{z/n}(H_2O)_y[Ti_3C_2T_x]^{z-}$, where $A^{n+}$ is a cation intercalant. It is clear that water can be reversibly intercalated according to the topotactic reaction:

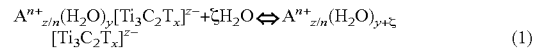

$$A^{n+}_{z/n}(H_2O)_y[Ti_3C_2T_x]^{z-} + \zeta H_2O \Leftrightarrow A^{n+}_{z/n}(H_2O)_{y+\zeta}[Ti_3C_2T_x]^{z-} \quad (1)$$

The driving force for water (de)intercalation is likely the solvation of the cations. The $M_{n+1}X_nT_x$ layers, on the other hand, remain unchanged as negatively charged matrix elements. The 000l reflections are intense and relatively narrow, strongly suggesting the water/cation complexes are highly ordered in the c direction.

It is to be understood that while the invention has been described in conjunction with the preferred specific embodiments thereof, that the foregoing description and the examples that follow are intended to illustrate and not limit the scope of the invention. It will be understood by those skilled in the art that various changes may be made and equivalents may be substituted without departing from the scope of the invention, and further that other aspects, advantages and modifications will be apparent to those skilled in the art to which the invention pertains. In addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article, and such combinations are considered within the scope of this invention.

The disclosures of each patent, patent application, and publication cited or described in this document are hereby incorporated herein by reference, each in its entirety, for all purposes.

What is claimed:

1. A method comprising,
   (a) adjusting the water content of a $M_{n+1}X_n(T_s)$ composition to form a compressible paste wherein the ratio of water to $M_{n+1}X_n(T_s)$ is in a range of from about 0.3 to about 0.65 on a mass basis; and
   (b) compressing the $M_{n+1}X_n(T_s)$ composition with a pressure in a range of from about 5 psig to about 500 psig to form a solid having a thickness in a range of from about 0.1 micron to about 100 microns;
   said $M_{n+1}X_n(T_s)$ composition having multiple layers, each layer having a first and second surface, each layer comprising
   a substantially two-dimensional array of crystal cells,
   each crystal cell having an empirical formula of $M_{n+1}X_n$, such that each X is positioned within an octahedral array of M,
   wherein M is at least one Group 3, 4, 5, 6, or 7 metal,
   wherein each X is C, N, or a combination thereof and n=1, 2, or 3;
   wherein at least one of said surfaces of the layers has surface terminations, $T_s$, independently comprising alkoxide, alkyl, carboxylate, halide, hydroxide, hydride, oxide, sub-oxide, nitride, sub-nitride, sulfide, sulfonate, thiol, or a combination thereof;
   said solid body exhibiting a volumetric capacity of at least 500 F/cm$^3$ up to about 2000 F/cm$^3$ when tested as a scan rate of 20 mV/s.

2. The method of claim 1, wherein the compression is accomplished at least in part by rolling or compression molding.

3. The method of claim 1, wherein the compressing is accomplished at least in part by rolling the $M_{n+1}X_n(T_s)$ composition between at least two roller bars.

4. The method of claim 1, wherein the compressing of the $M_{n+1}X_n(T_s)$ composition is accompanied by the removal of water.

5. The method of claim 1, wherein the solid body is electrically conductive.

6. The method of claim 1, wherein the solid body has surface electrical resistance in a range of from about 1 micro-ohm-meters to about 10,000 micro-ohm-meters.

7. The method of claim 1, wherein the $M_{n+1}X_n(T_s)$ composition comprises a plurality of $M_{n+1}X_n(T_s)$ flakes having at least one mean lateral dimension in a range of from about 0.5 micron to about 5 microns.

8. The method of claim 1, wherein M is at least one Group 4, 5, 6, or 7 metal.

9. The method of claim 1, wherein M is at least one of Hf, Cr, Mn, Mo, Nb, Sc Ta, Ti, V, W, or Zr.

10. The method of claim 1, wherein M is Ti, and n is 1 or 2.

11. The composition of claim 1, wherein $M_{n+1}X_n$ comprises $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$, $Ti_3C_2$, $Ti_3N_2$, $V_3C_2$, $Ta_3C_2$, $Ta_3N_2$, $Mo_3C_2$, $(Cr_{2/3}Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

12. The method of claim 1, the crystal cells having an empirical formula $Ti_3C_2$ or $Ti_2C$ and wherein at least one of said surfaces of each layer is coated with surface terminations, $T_s$, comprising alkoxide, fluoride, hydroxide, oxide, sub-oxide, sulfonate, or a combination thereof.

13. The method of claim 1, said method providing a solid body exhibiting a volumetric capacitance in a range of about 500 F/cm$^3$ to about 1500 F/cm$^3$, or in a range of from about 100 F/g to about 500 F/g, when tested as a scan rate of 2 mV/s.

14. A solid body prepared by the method of claim 1.

15. A solid body prepared by the method of claim 1, further comprising intercalated lithium ions or atoms, sodium ions or atoms, potassium ions or atoms, rubidium ions or atoms, calcium ions or atoms, magnesium ions or atoms, or a combination thereof.

16. The solid body of claim 14, wherein the solid body exhibiting a volumetric capacitance of from about 500 F/cm$^3$ to about 2500 F/cm$^3$, or in a range of from about 200 F/g to about 500 F/g, when tested as a scan rate of 2 mV/s.

17. An electrochemical device comprising a solid body of claim 14.

18. A solid body having a thickness in a range of from about 0.1 micron to about 100 microns and comprising a $M_{n+1}X_n(T_s)$ material exhibiting a volumetric capacity greater than about 500 F/cm$^3$ up to about 2000 F/cm$^3$; said $M_{n+1}X_n(T_s)$ material comprising a composition comprising plurality of layers, each layer having a first and second surface, each layer comprising
   a substantially two-dimensional array of crystal cells,
   each crystal cell having an empirical formula of $M_{n+1}X_n$, such that each X is positioned within an octahedral array of M,
   wherein M is at least one Group 3, 4, 5, 6, or 7 metal,
   wherein each X is C, N, or a combination thereof and n=1, 2, or 3;
   wherein at least one of said surfaces of the layers has surface terminations, $T_s$, comprising alkyl, alkoxide, carboxylate, halide, hydroxide, hydride, oxide, sub-oxide, nitride, sub-nitride, sulfide, sulfonate, thiol, or a combination thereof.

19. The solid body of claim 18, the $M_{n+1}X_n(T_s)$ material further comprising intercalated lithium or other metal ions.

* * * * *

UNITED STATES PATENT AND TRADEMARK OFFICE
CERTIFICATE OF CORRECTION

| | | |
|---|---|---|
| PATENT NO. | : 10,573,768 B2 | Page 1 of 1 |
| APPLICATION NO. | : 15/513740 | |
| DATED | : February 25, 2020 | |
| INVENTOR(S) | : Michael J. Ghidiu et al. | |

It is certified that error appears in the above-identified patent and that said Letters Patent is hereby corrected as shown below:

In the Specification

Column 4,
Line 56, In Fig. 2, after "FIGS. 2C and" replace "D" with -- 2D --.
Line 64, In Fig. 3, beginning the line with "FIG. 3" replace with -- FIGS. 3A-3F --.

Column 5,
Lines 12-17, replace the entire paragraph with the following:
-- FIGs. 4A-F show processing of $M_{n+1}X_n(T_s)$ clay: FIG. 4A shows the dried and crushed powder; FIG. 4B and FIG. 4C show the hydrated clay to be plastic and readily formed and molded; FIG. 4D shows films being produced in the roller mill; and FIG. 4E and FIG. 4F show rolled freestanding films being lifted off Celgard membranes. --.
Line 42, In Fig. 8, after "75 μm thick", replace "FIG. 8B" with -- FIG. 8C --.

Column 6,
Line 64, after "FIG. 17A shows", replace "overlayed" with -- overlaid --.

Column 7,
Line 2, after "layer and bilayer phases." replace "d)" with -- FIG. 17D shows --.
Line 6, replace "FIG. 18A-C shows" with -- FIGs. 18A-18C show --.
Line 8, replace "FIG. 18A" with -- FIG. 18B --.
Line 9, replace "samples)" with -- samples --.
Line 11, replace "FIGs. 18D-FC shows" with -- 18F show --.

Signed and Sealed this
Twenty-sixth Day of May, 2020

Andrei Iancu
*Director of the United States Patent and Trademark Office*